US011568910B2

(12) United States Patent
Takeda et al.

(10) Patent No.: US 11,568,910 B2
(45) Date of Patent: Jan. 31, 2023

(54) MEMORY SYSTEM

(71) Applicant: Kioxia Corporation, Minato-ku (JP)

(72) Inventors: Naomi Takeda, Yokohama (JP); Masanobu Shirakawa, Chigasaki (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/550,338

(22) Filed: Dec. 14, 2021

(65) Prior Publication Data

US 2022/0101901 A1   Mar. 31, 2022

Related U.S. Application Data

(62) Division of application No. 16/809,630, filed on Mar. 5, 2020, now Pat. No. 11,232,821.

(30) Foreign Application Priority Data

Sep. 13, 2019   (JP) .............................. JP2019-167670

(51) Int. Cl.
*G11C 11/16*        (2006.01)
*G06F 9/30*         (2018.01)

(52) U.S. Cl.
CPC ........ G11C 11/161 (2013.01); G06F 9/30134 (2013.01); G11C 11/1673 (2013.01); G11C 11/1675 (2013.01); G11C 11/1693 (2013.01)

(58) Field of Classification Search
CPC .................................................. G11C 11/16
USPC .......................................................... 365/173
See application file for complete search history.

(56) References Cited

U.S. PATENT DOCUMENTS

| 6,496,602 B2* | 12/2002 | Masuo ................... H03M 7/40 |
| | | 375/240.23 |
| 2014/0068365 A1* | 3/2014 | Chen ..................... G06F 11/106 |
| | | 714/746 |
| 2016/0203878 A1* | 7/2016 | Chen ................ G11C 29/50016 |
| | | 711/109 |
| 2016/0224242 A1 | 8/2016 | Kondo et al. |
| 2020/0089567 A1 | 3/2020 | Takeda et al. |
| 2020/0294610 A1* | 9/2020 | Takada ................ G11C 11/1673 |
| 2021/0082483 A1 | 3/2021 | Takeda et al. |

FOREIGN PATENT DOCUMENTS

| JP | 2016-143432 A | 8/2016 |
| JP | 2020-46916 A | 3/2020 |
| JP | 2021-43912 A | 3/2021 |

* cited by examiner

*Primary Examiner* — Muna A Techane
(74) *Attorney, Agent, or Firm* — Oblon, McClelland, Maier & Neustadt, L.L.P.

(57) ABSTRACT

According to one embodiment, a shift register memory includes blocks and a control circuit. The blocks each includes data storing shift strings. Each of the data storing shift strings includes layers. The control circuit performs storing and reading data by shifting one layer of the layers, in a direction along each of the data storing shift strings. The reading includes reading data from a first layer of the layers. The storing includes storing data to a second layer of the layers. The control circuit reads first data stored in one or more third layers of the layers, the one or more third layers being successive from the first layer, determines a shift parameter in accordance with the reading of the first data, and performs the reading using the determined shift parameter.

16 Claims, 60 Drawing Sheets

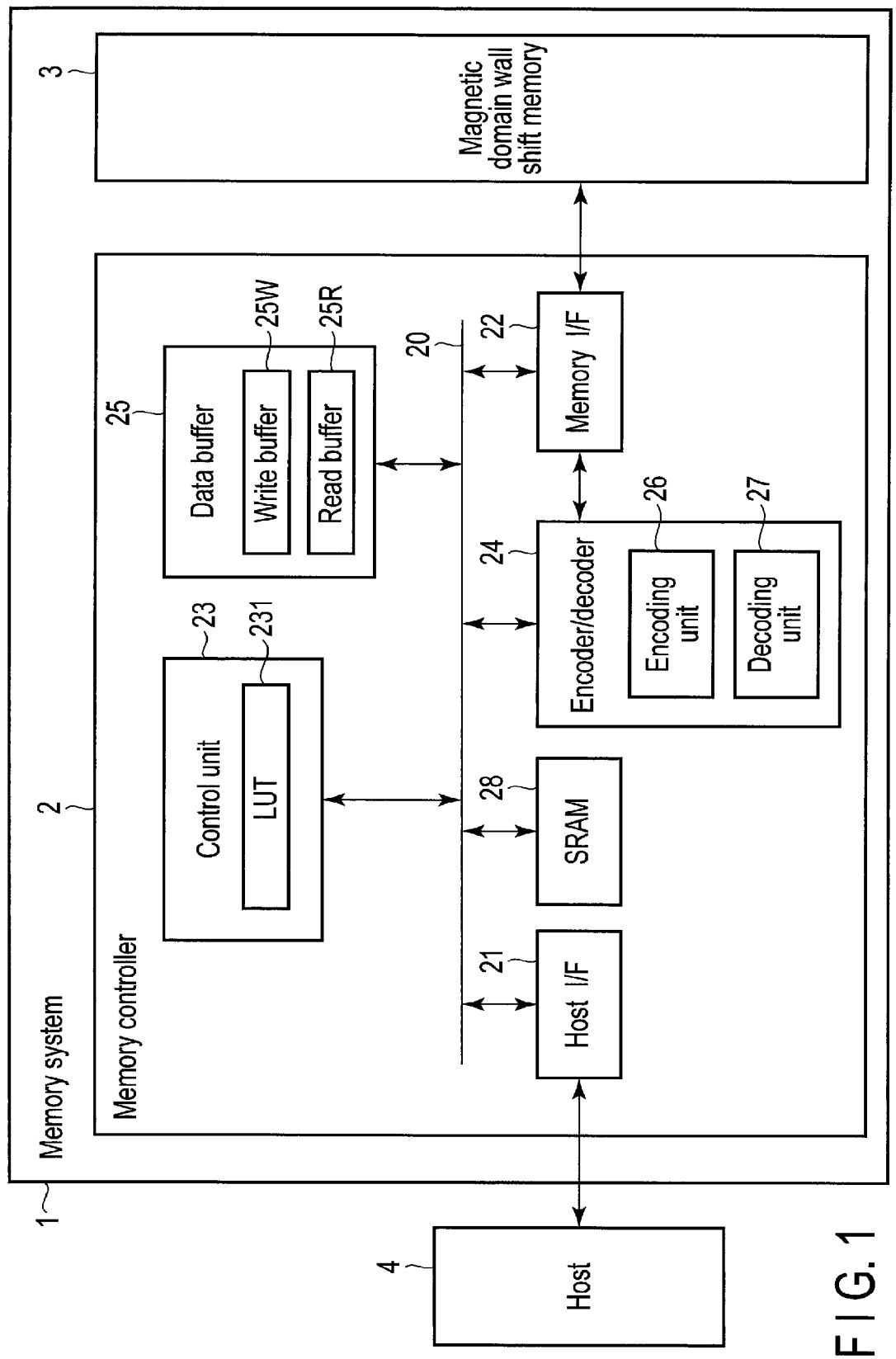
F I G. 1

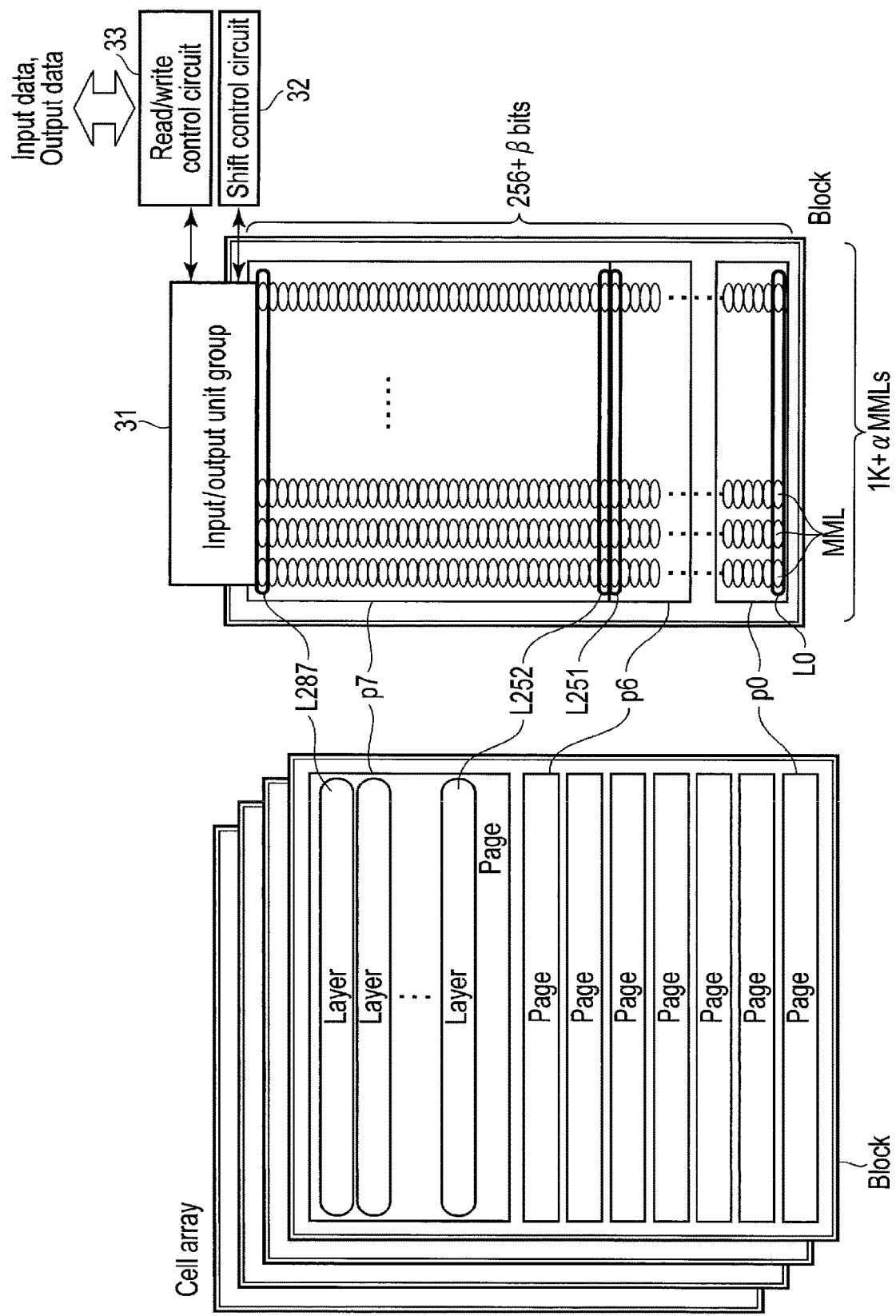
F I G. 2

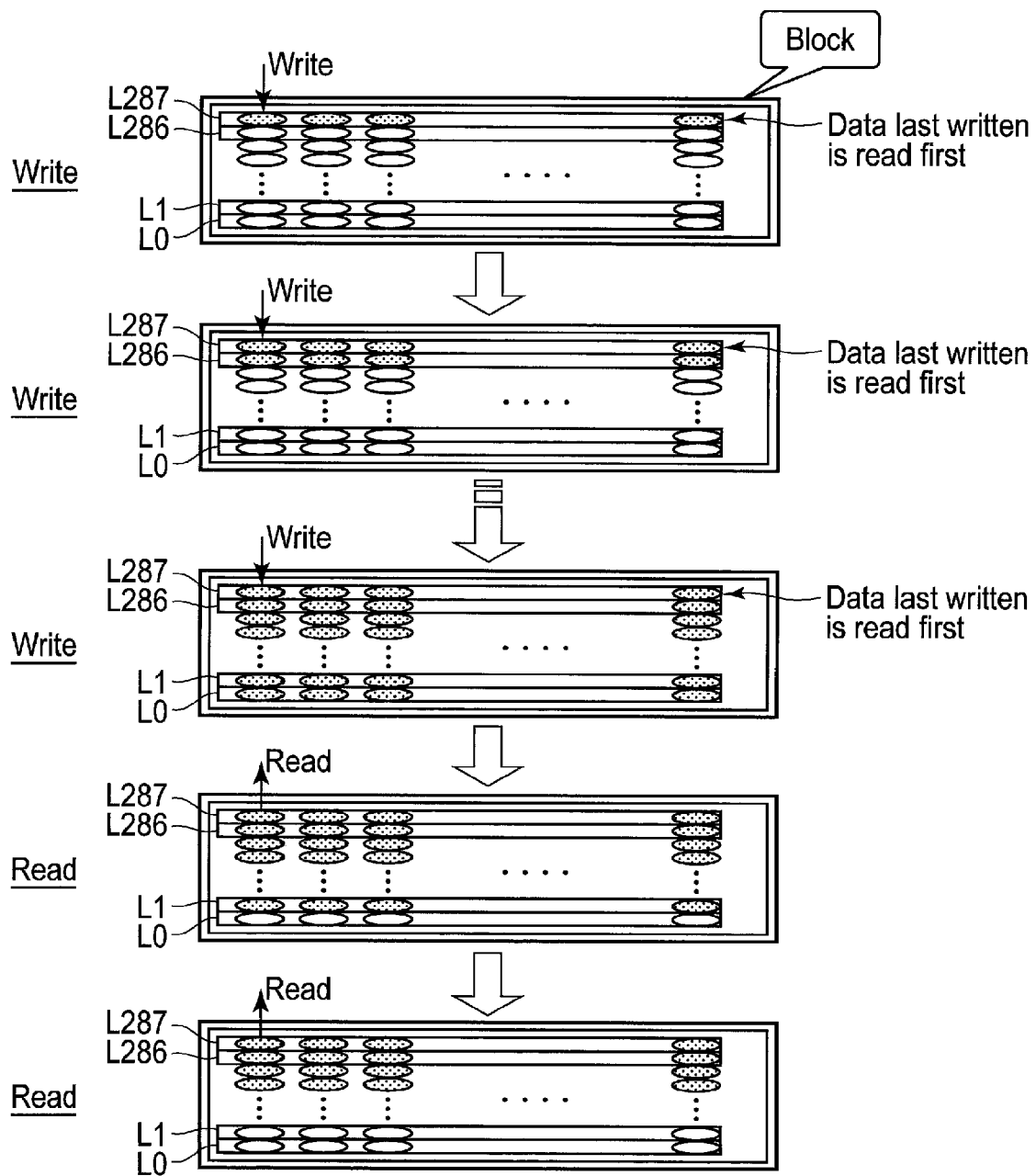
F I G. 3

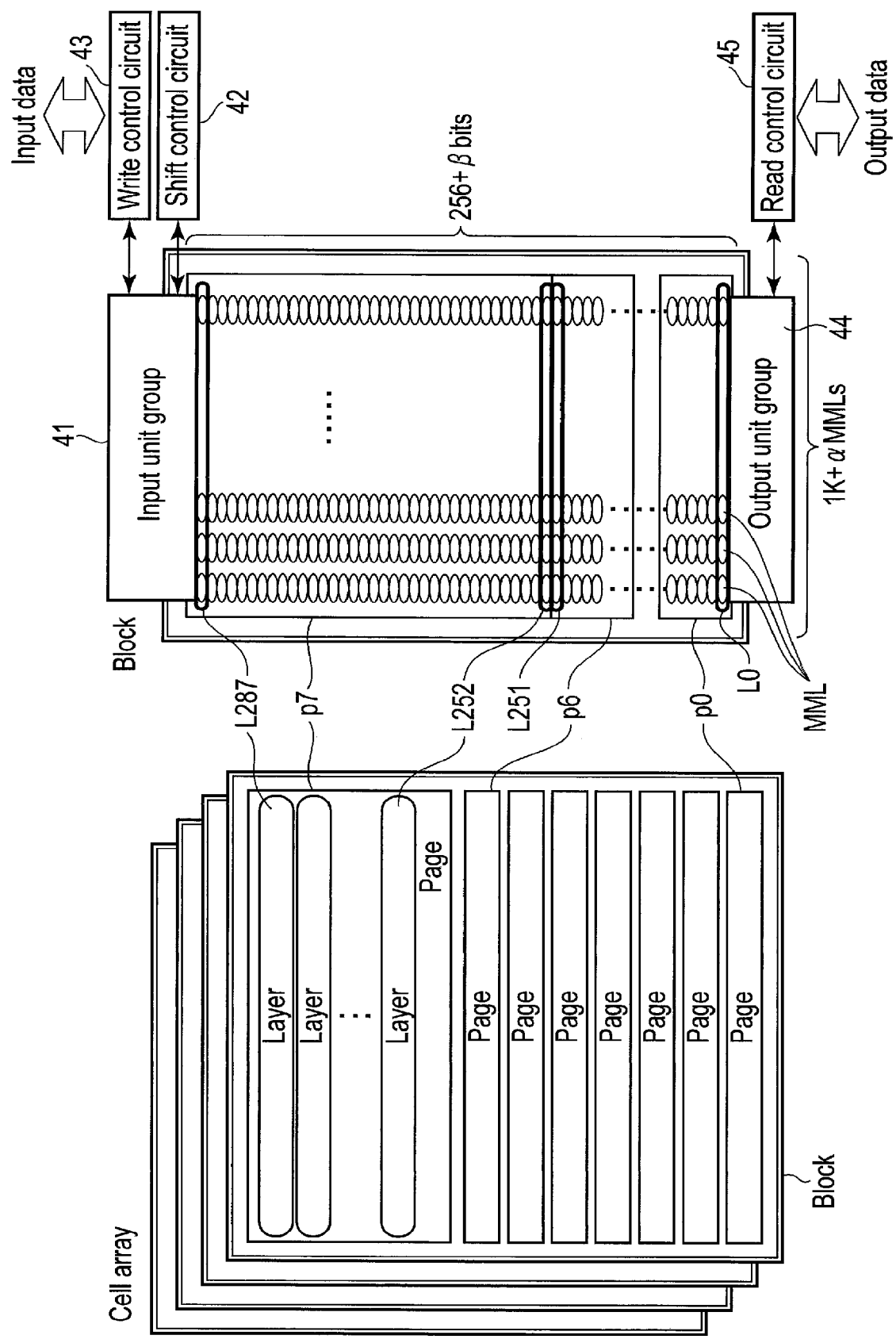
F I G. 4

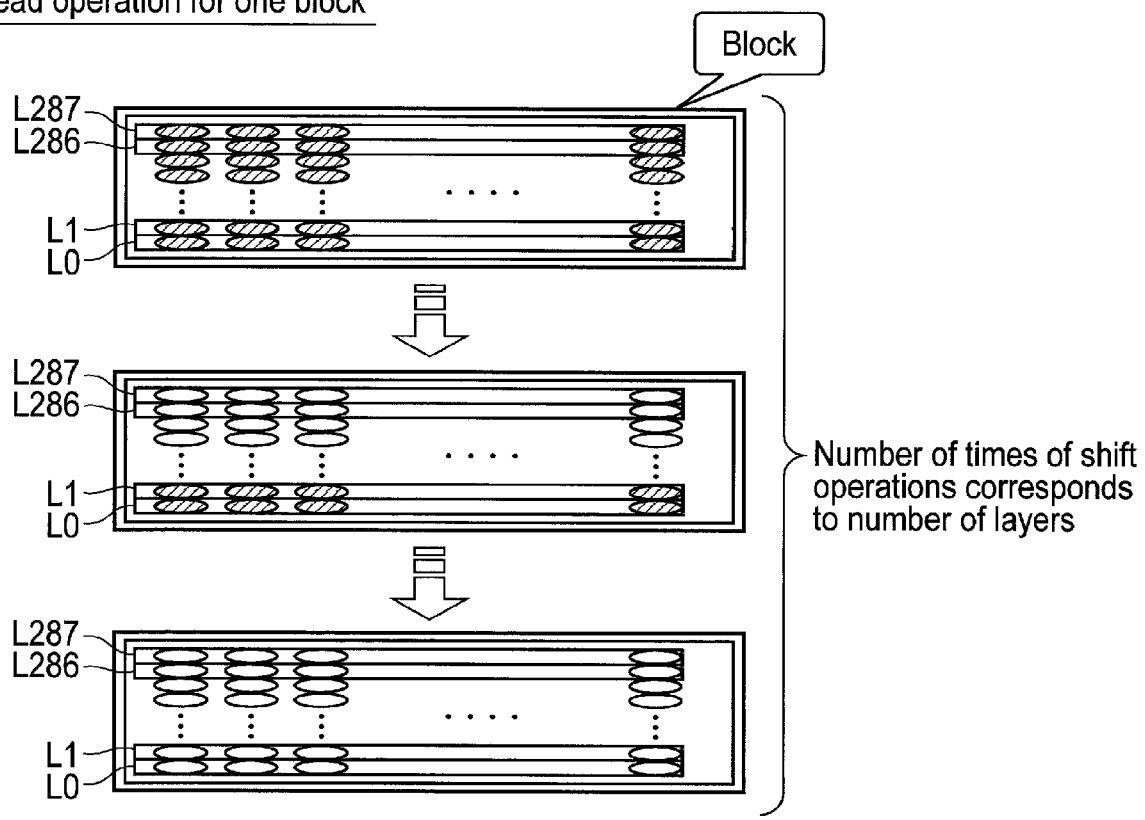
F I G. 6B

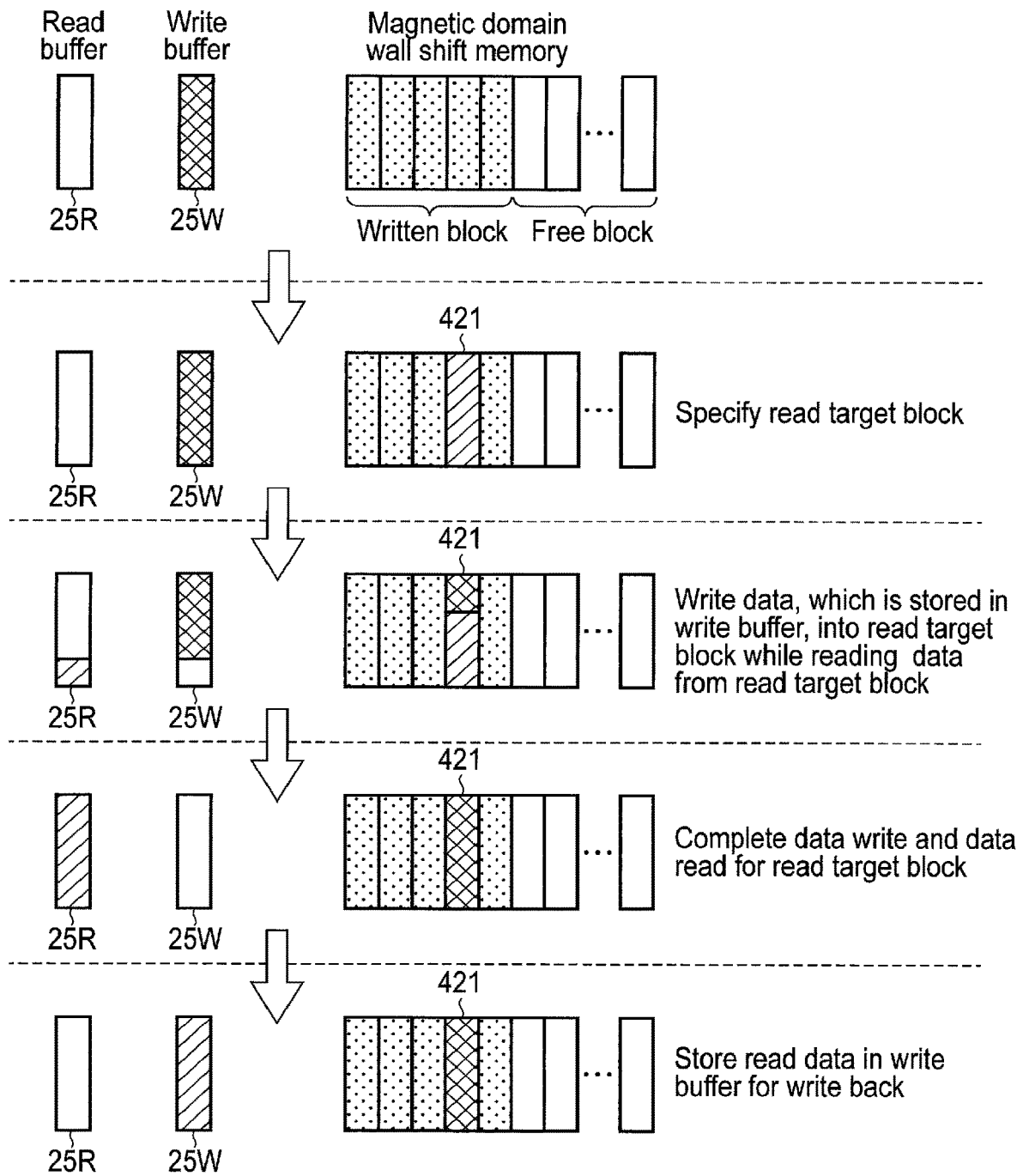
F I G. 9

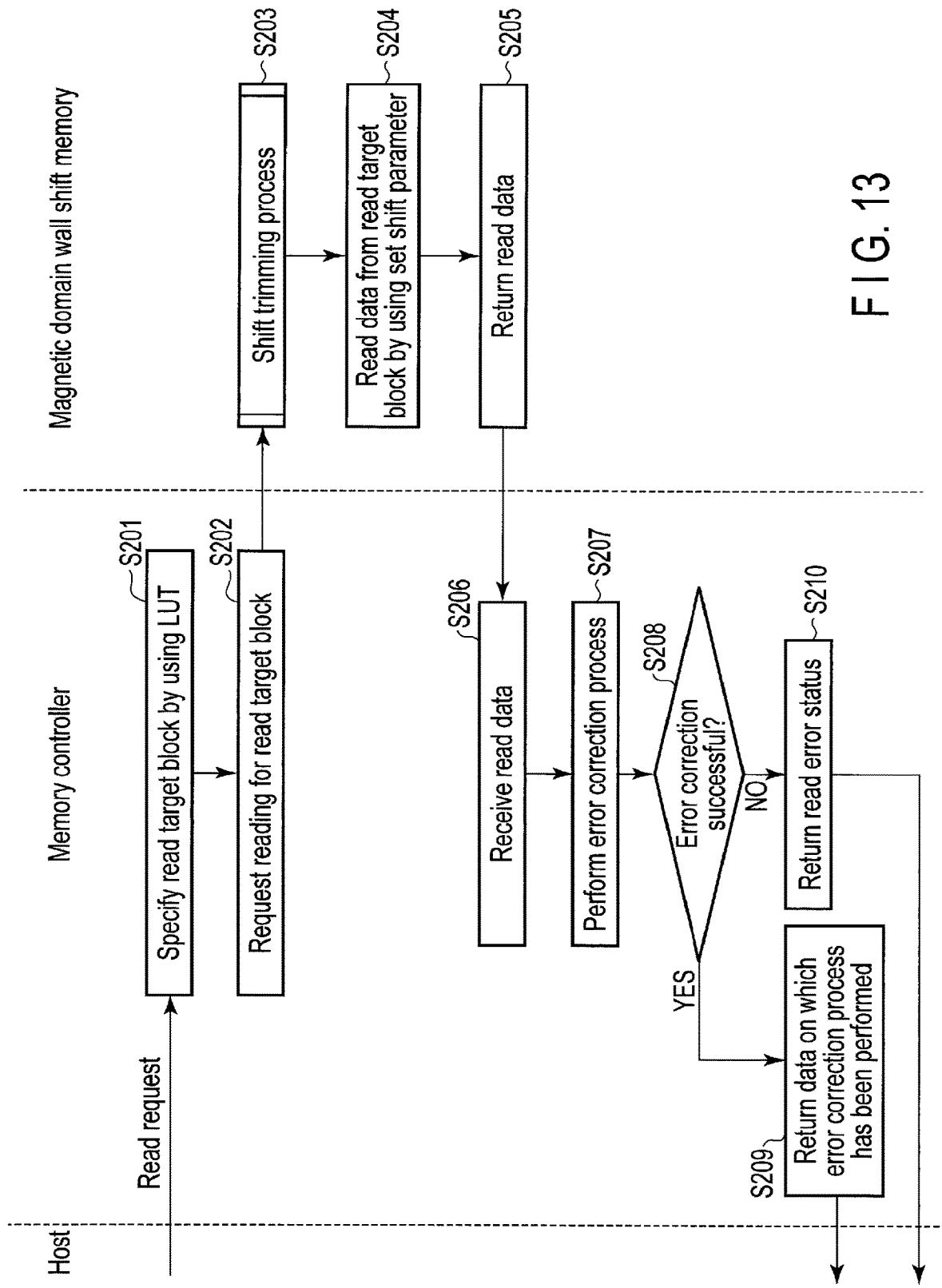
F I G. 13

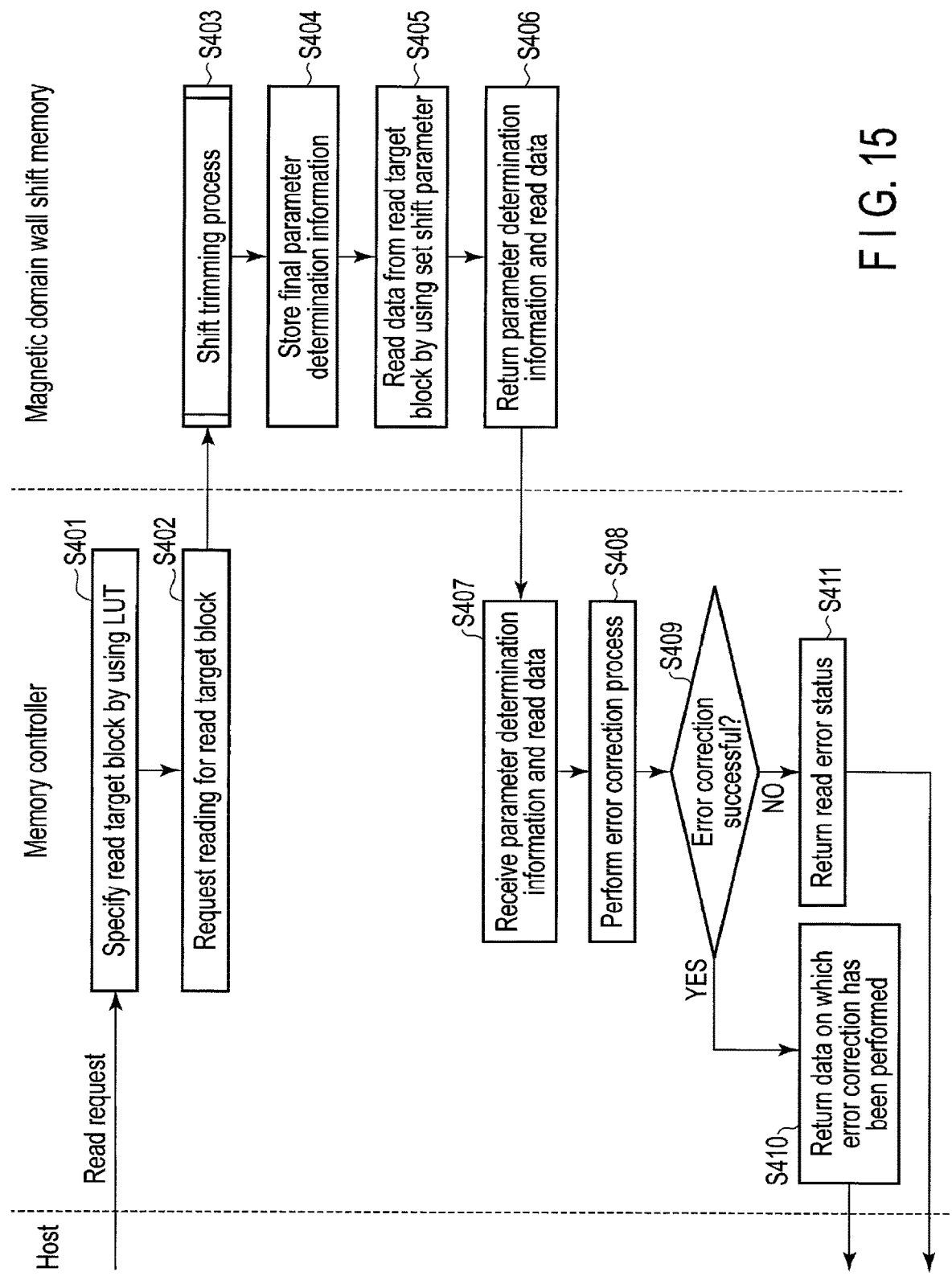
F I G. 15

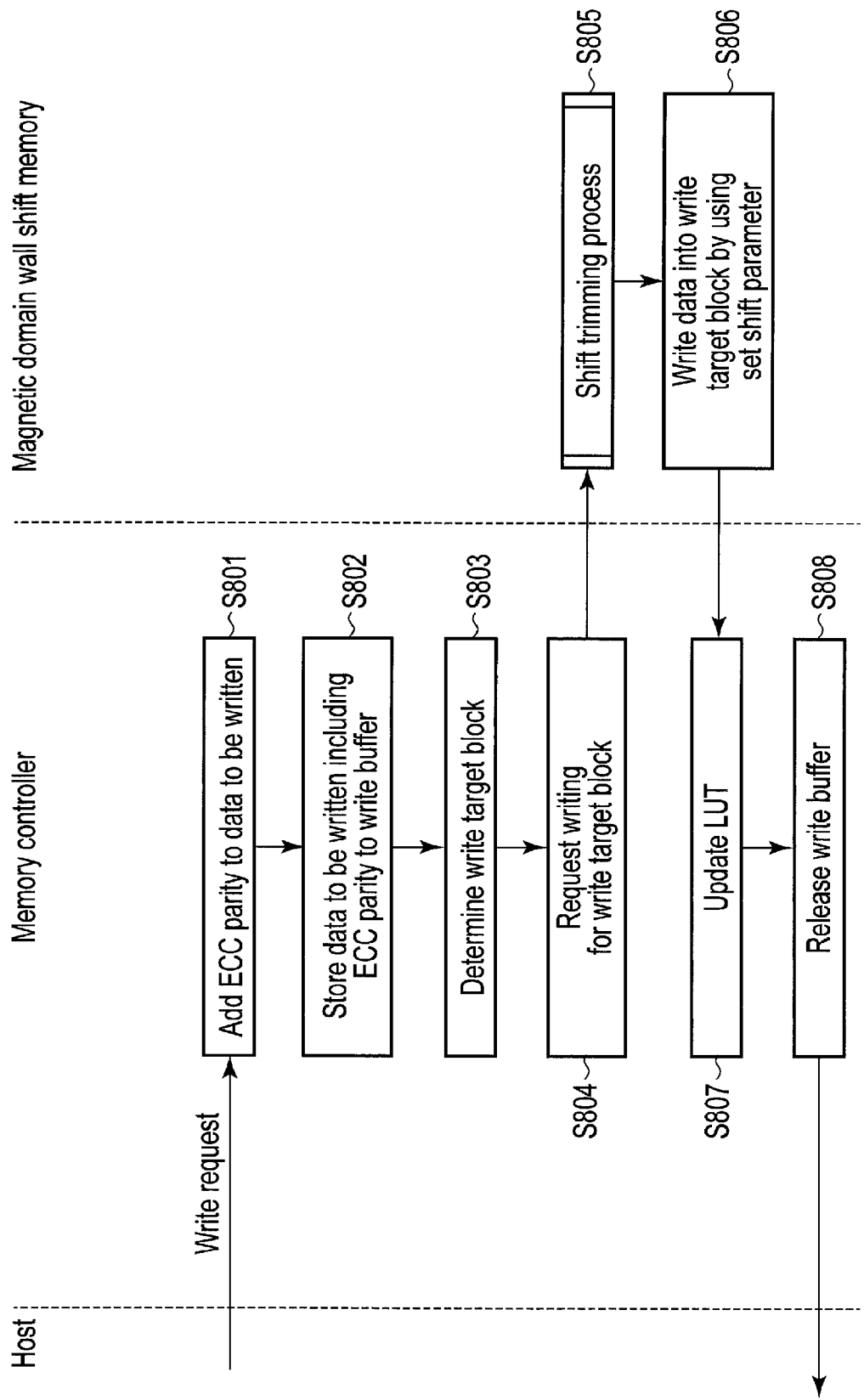
F I G. 21

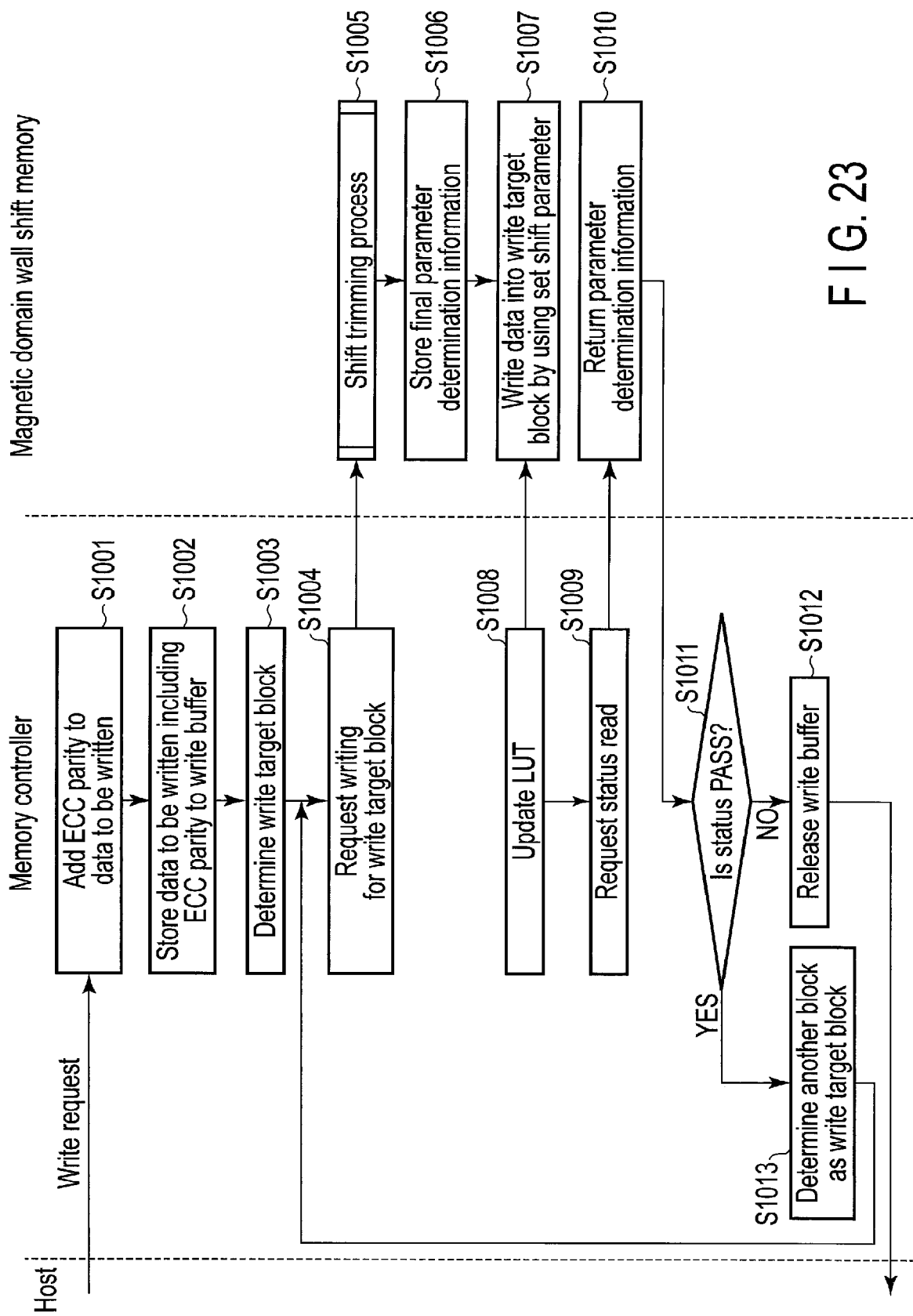
F I G. 23

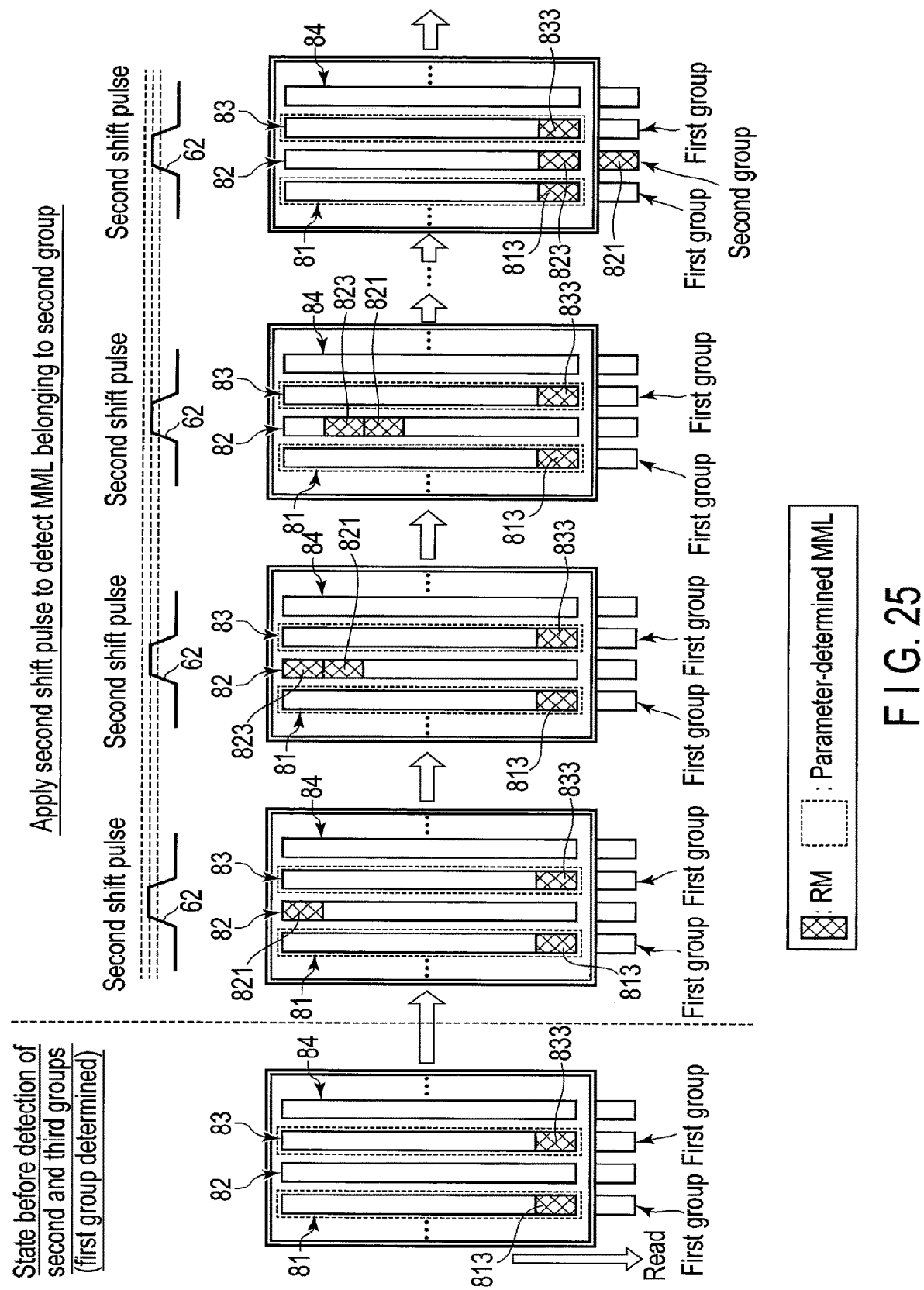
F I G. 25

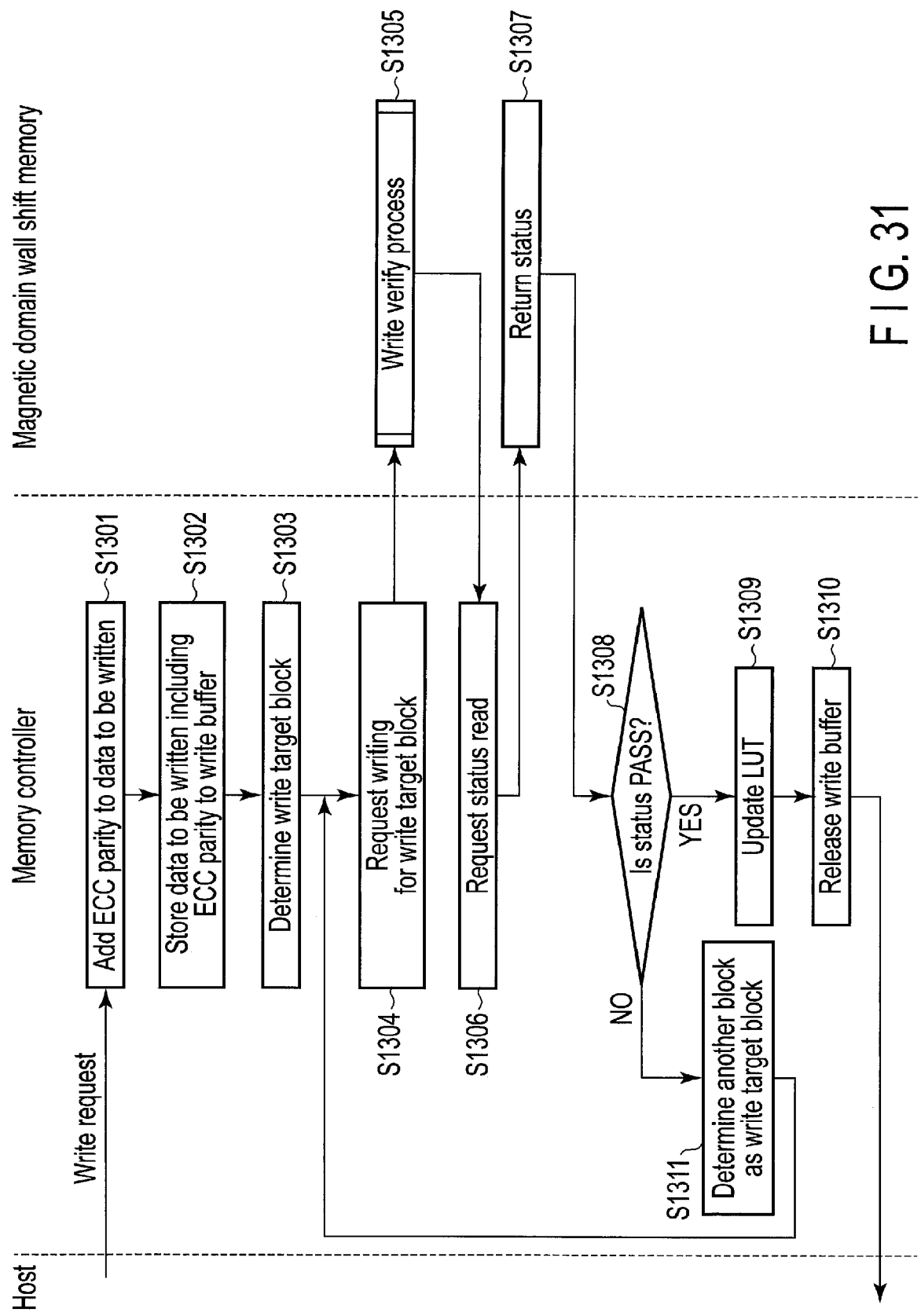
F I G. 31

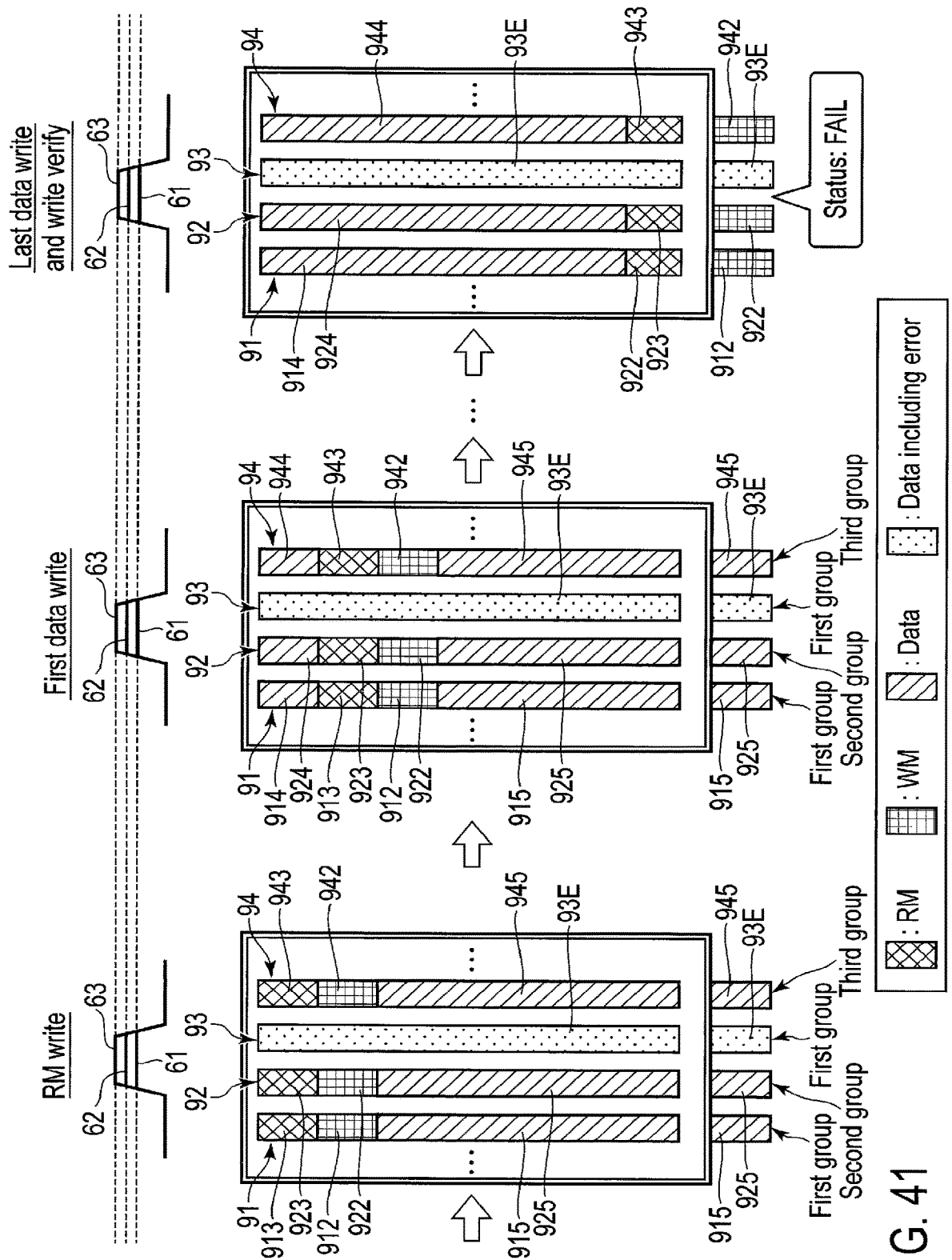
F I G. 41

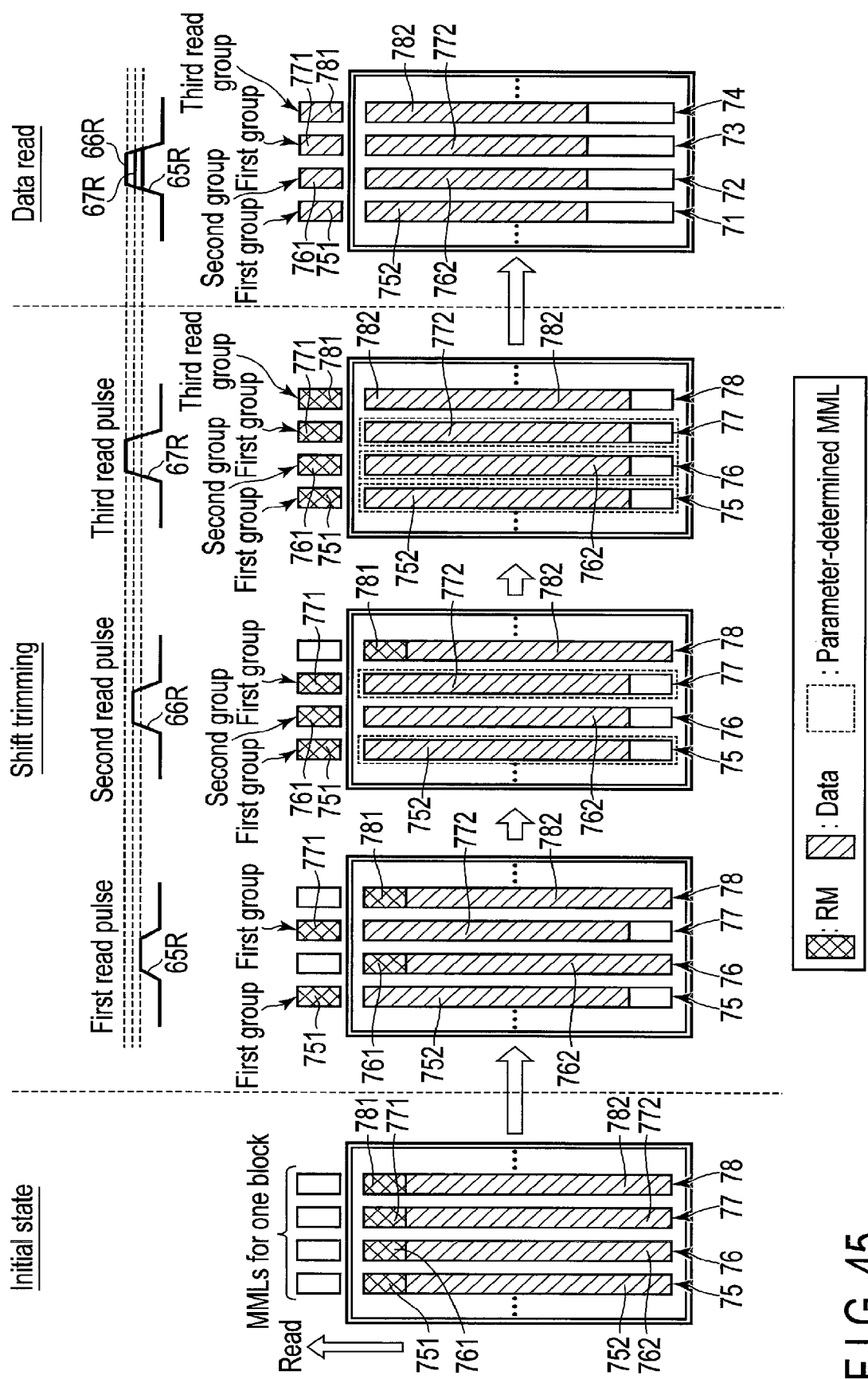
F I G. 45

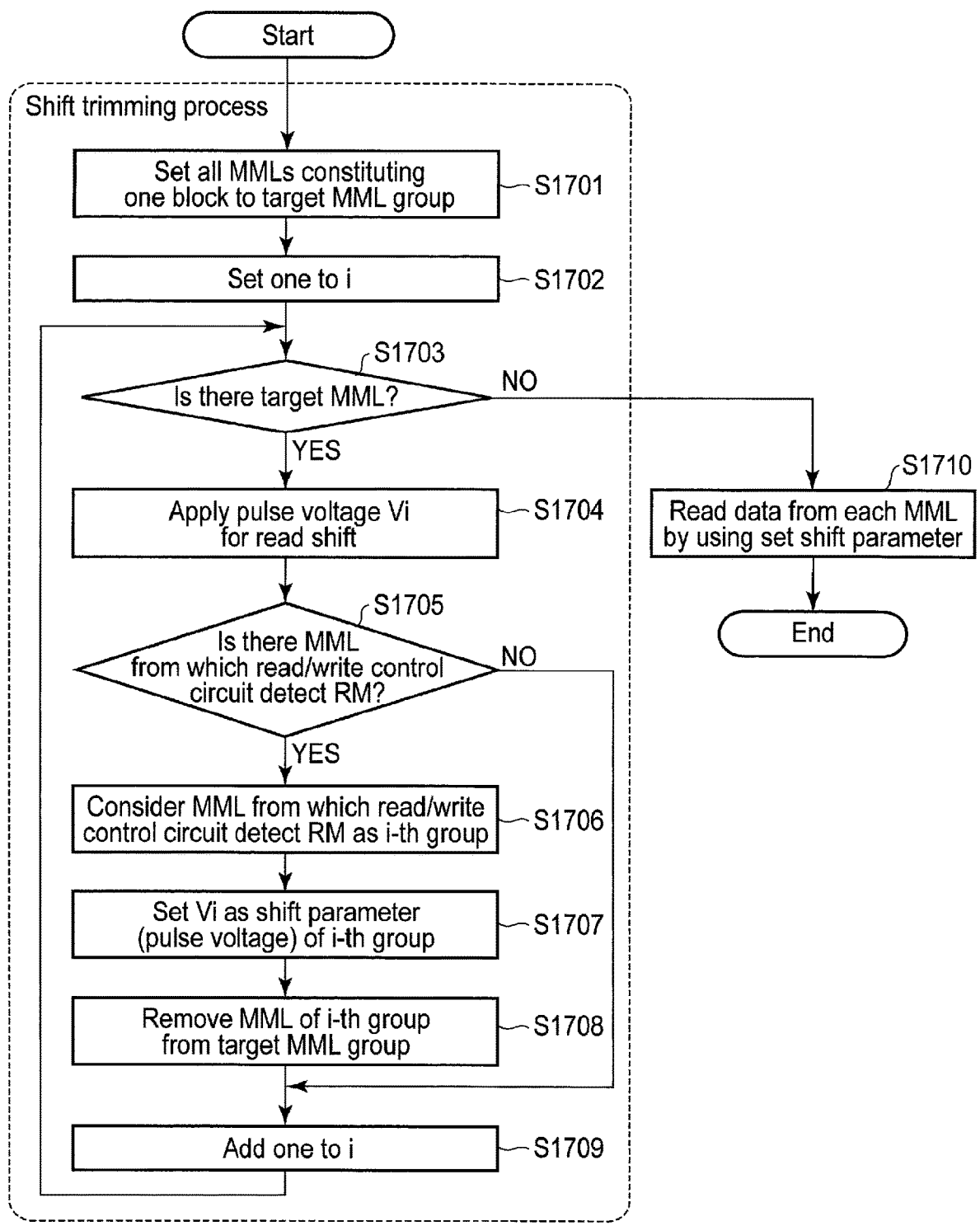
F I G. 46

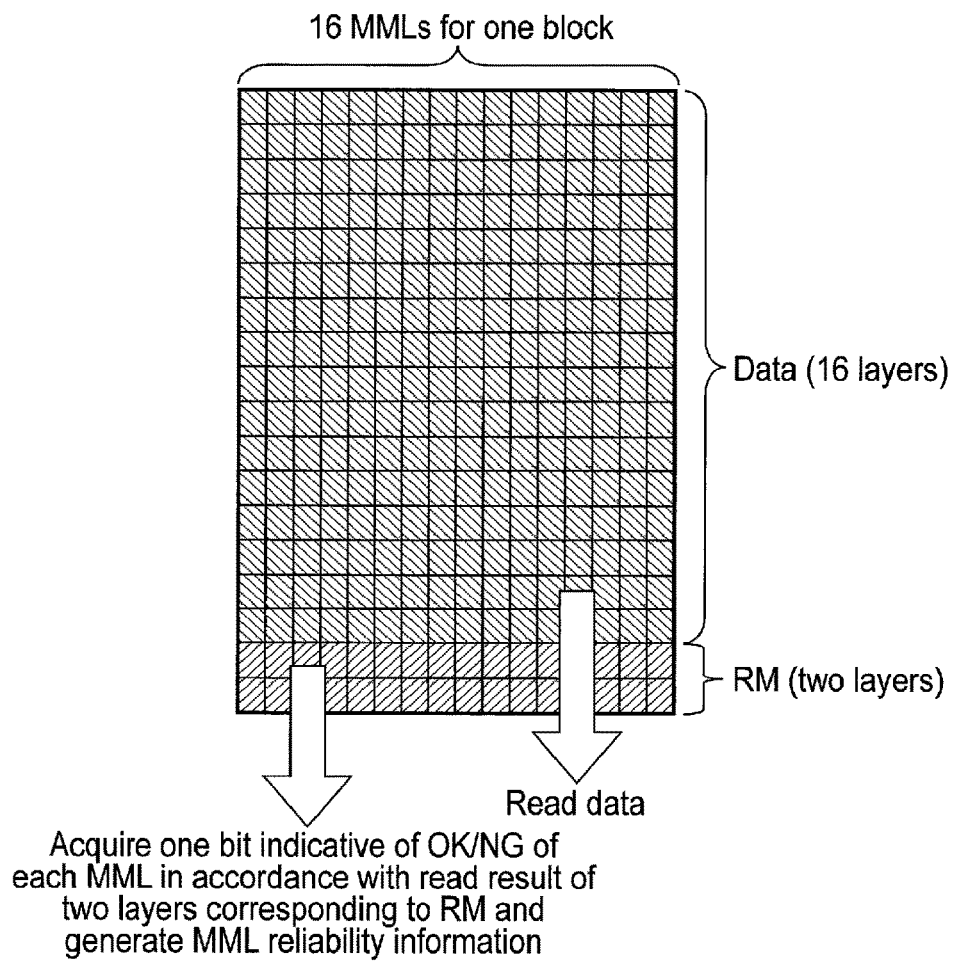
F I G. 47A
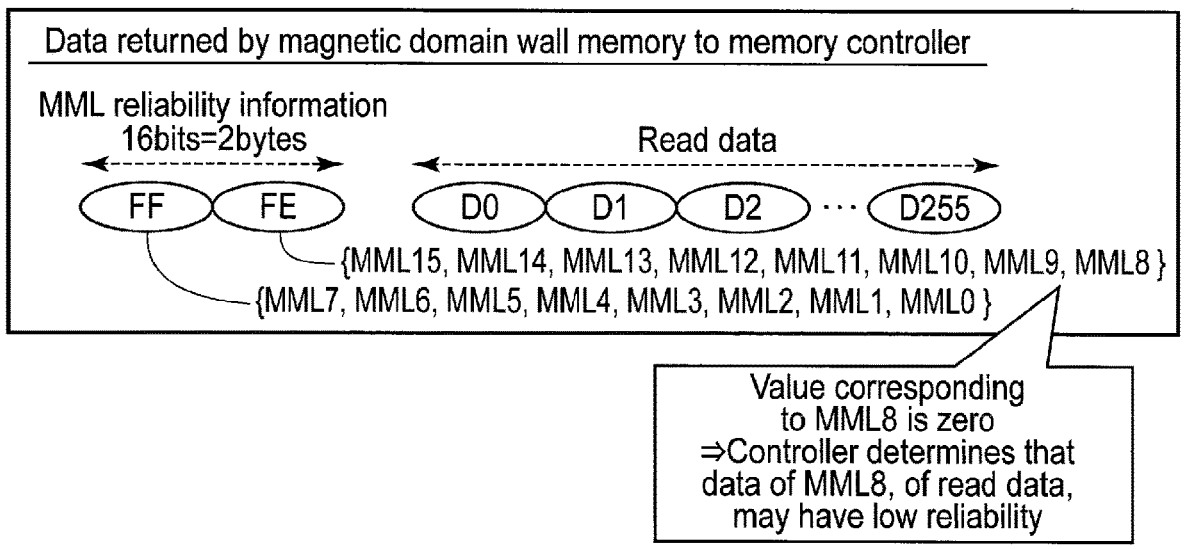
F I G. 47B

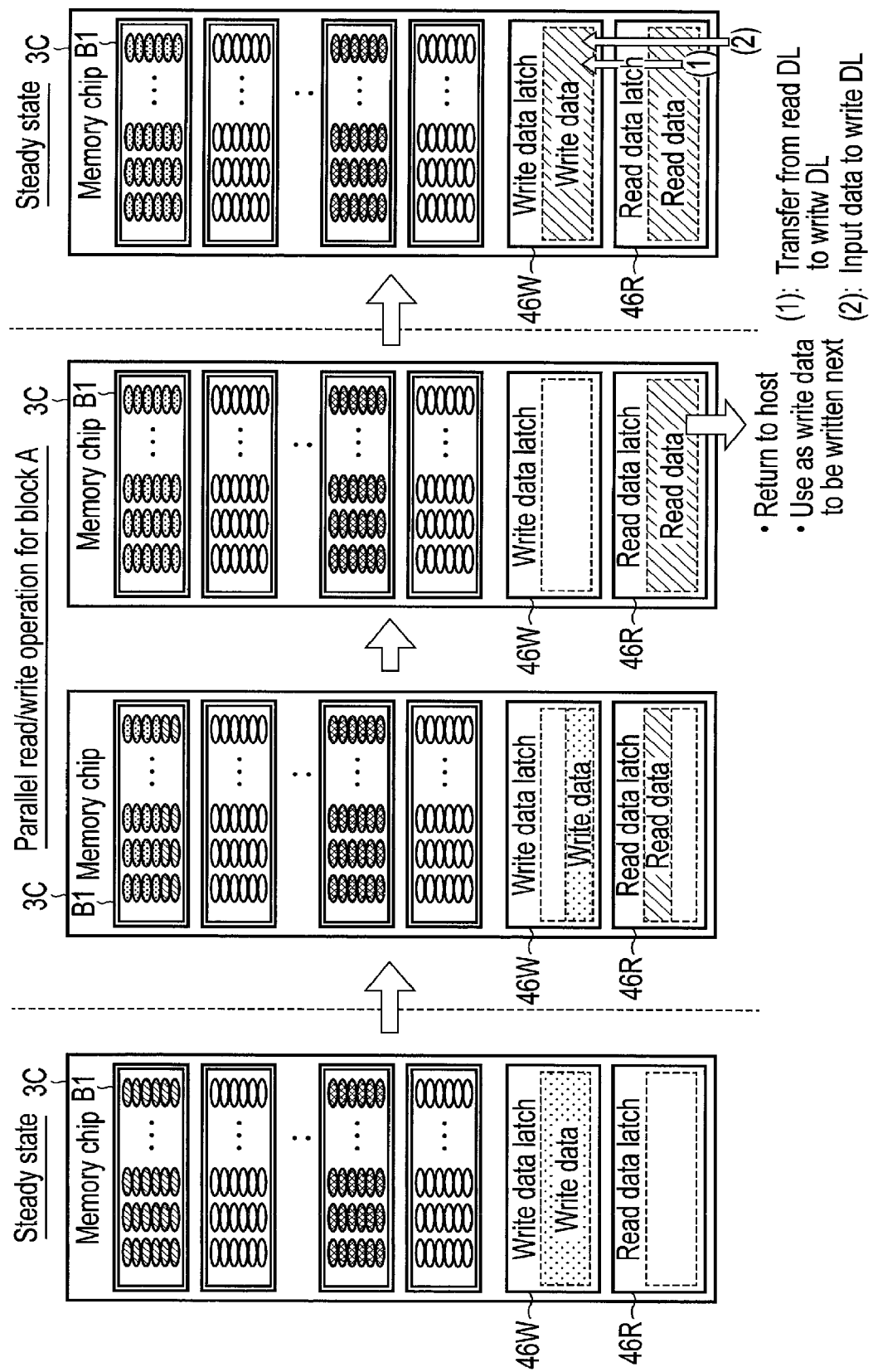
F I G. 51

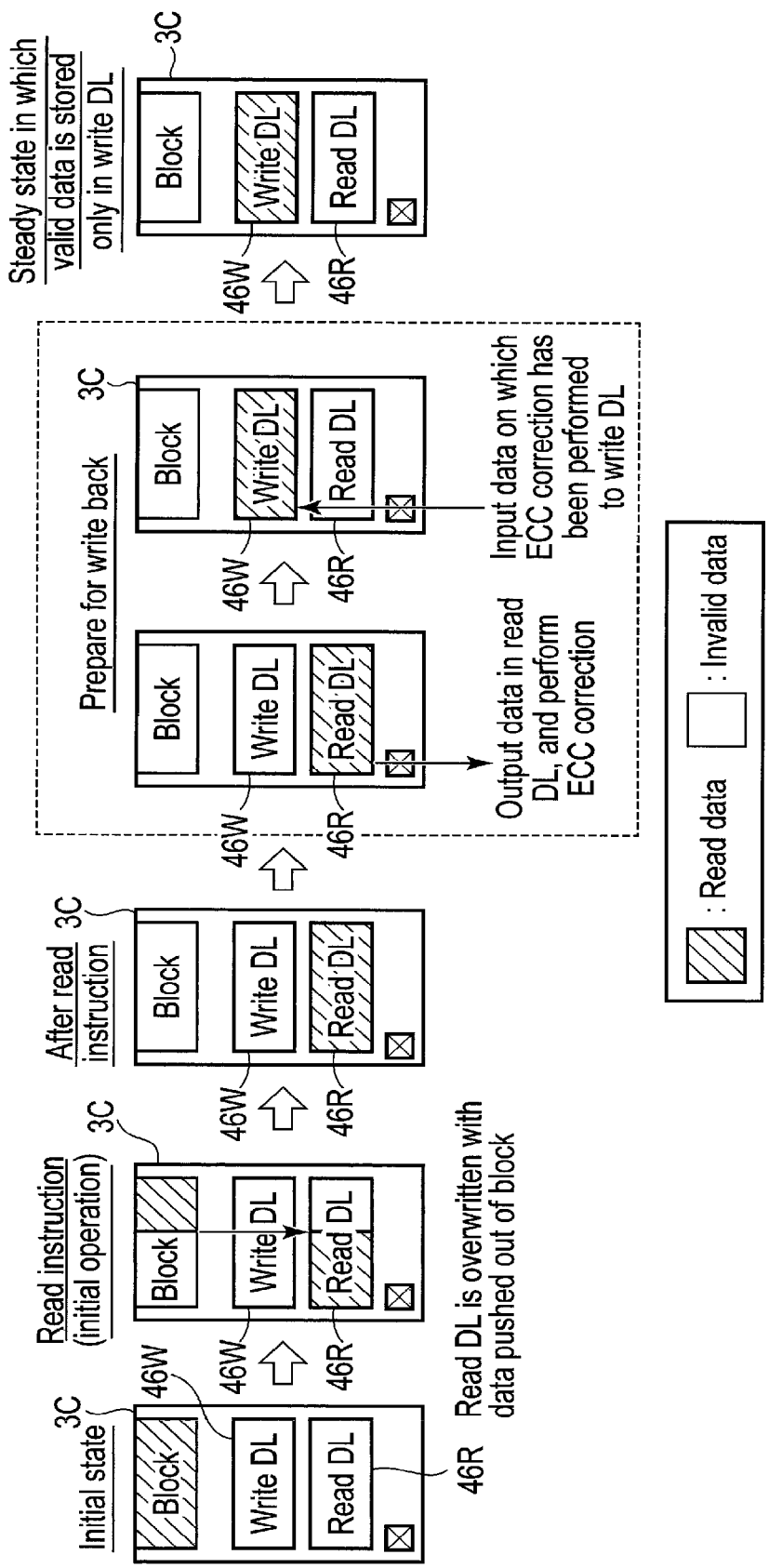
F I G. 52

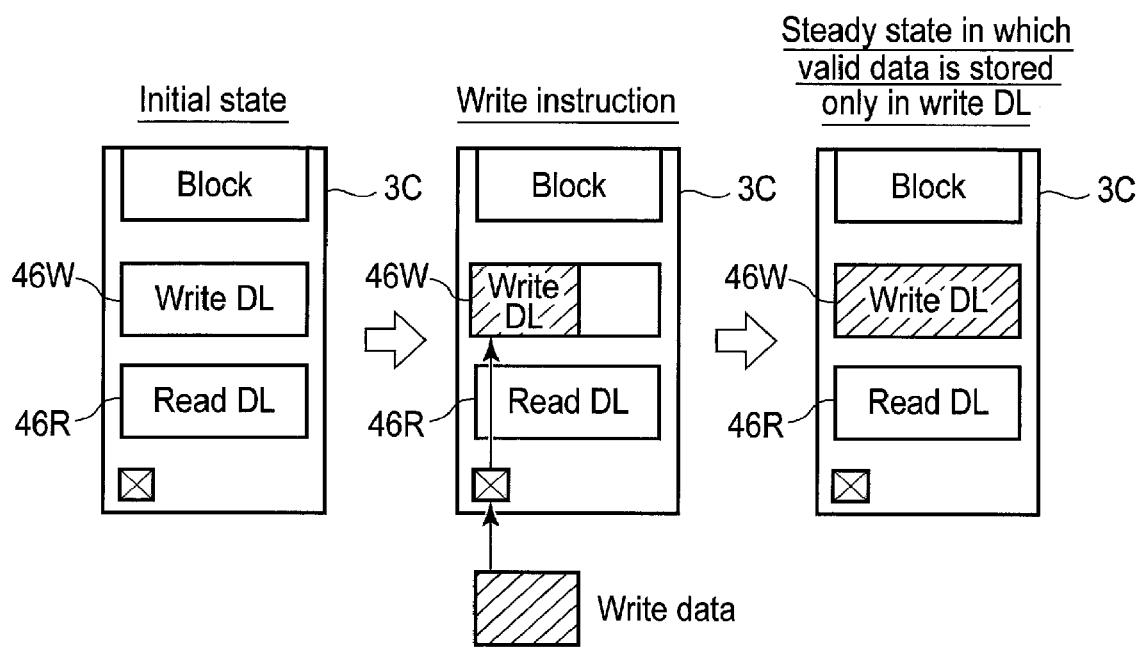
F I G. 53

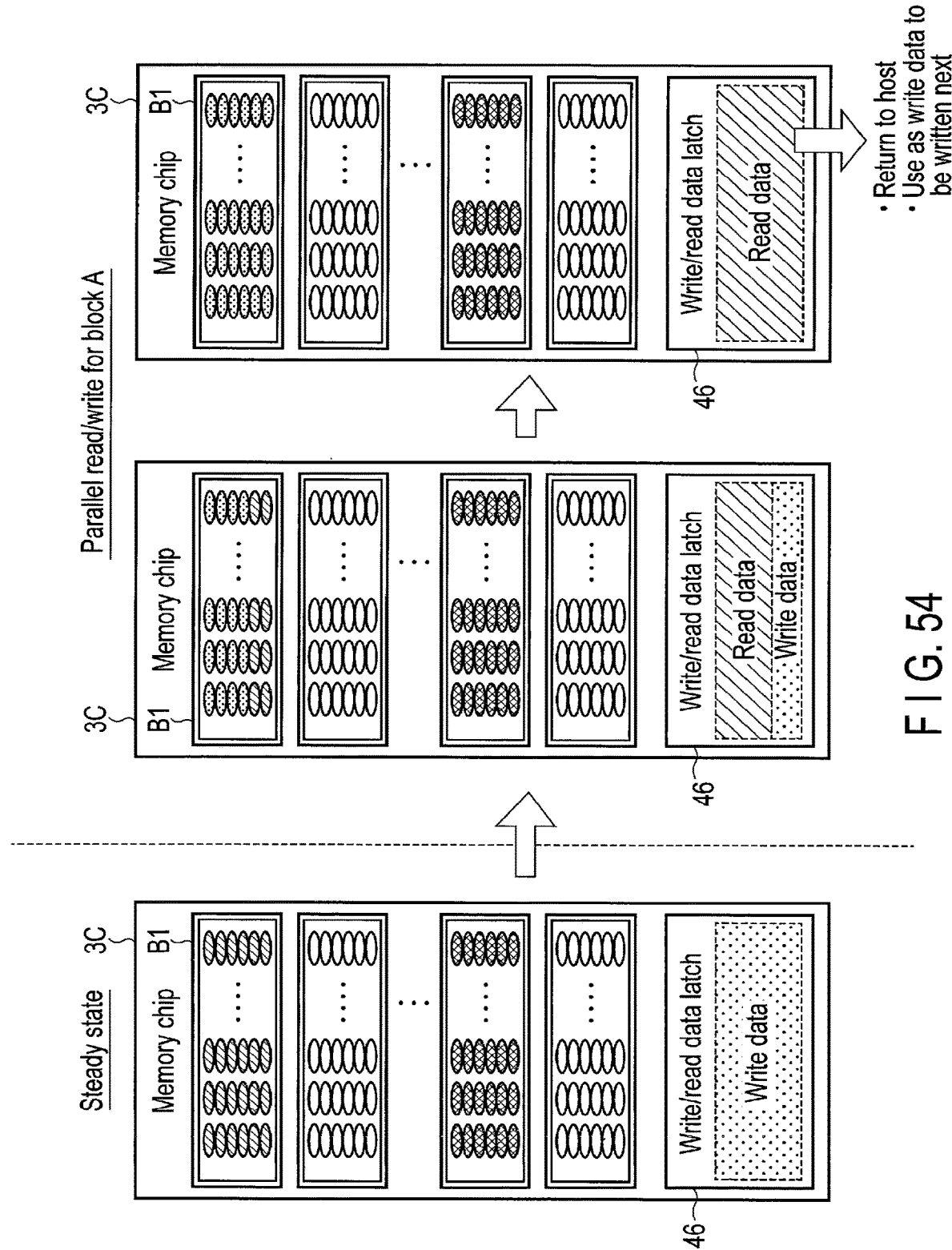
F I G. 54

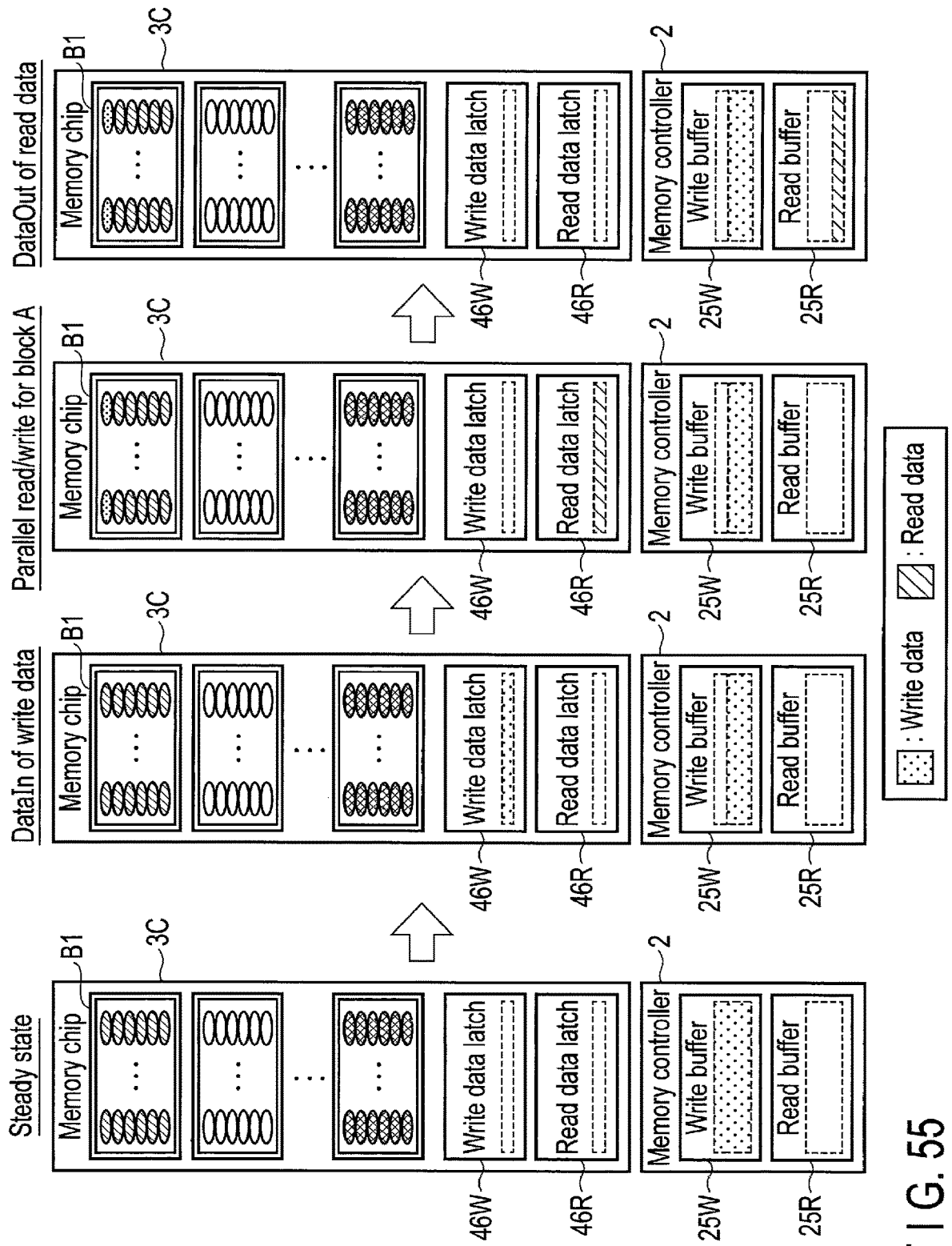
F I G. 55

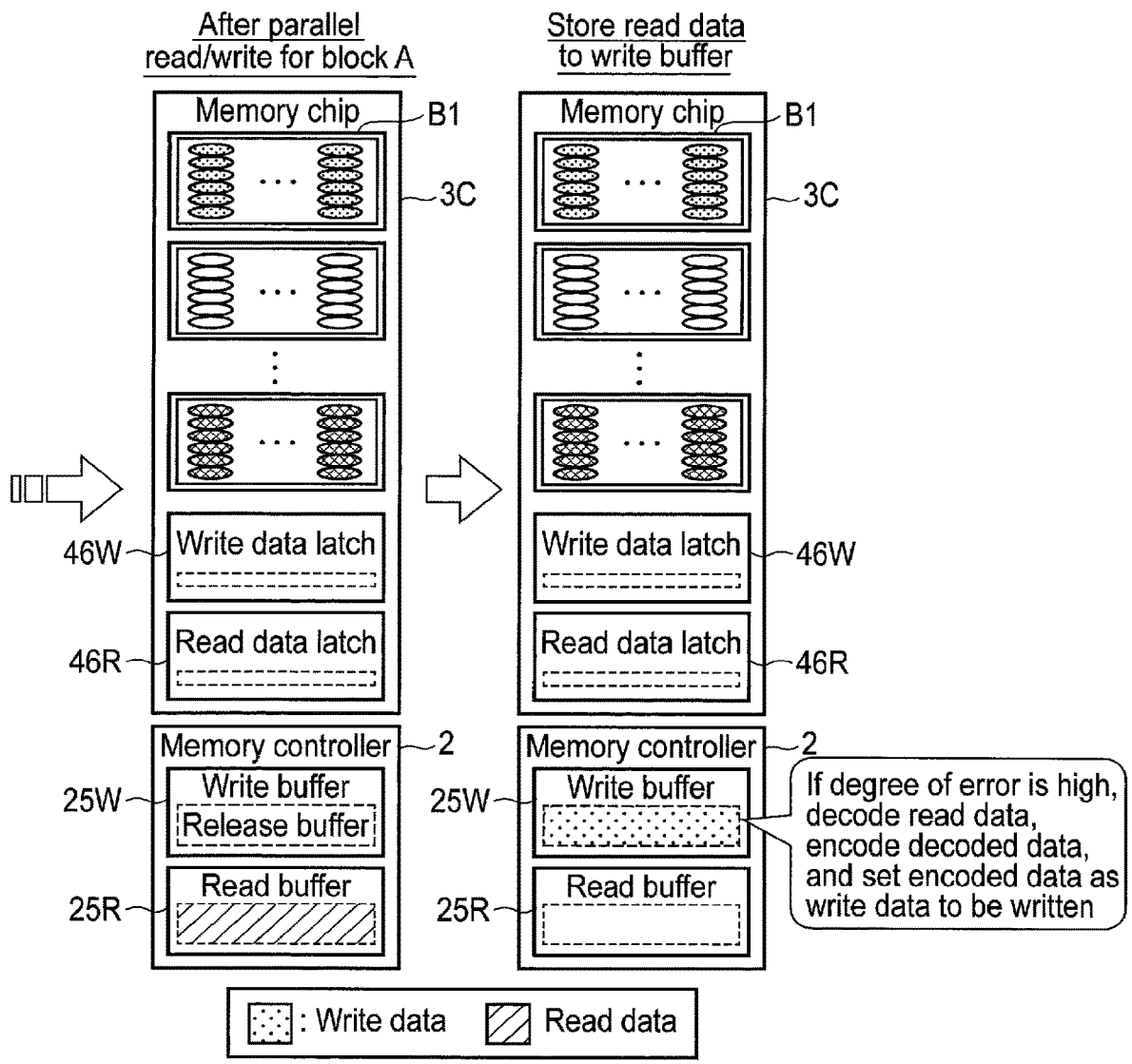
F I G. 56

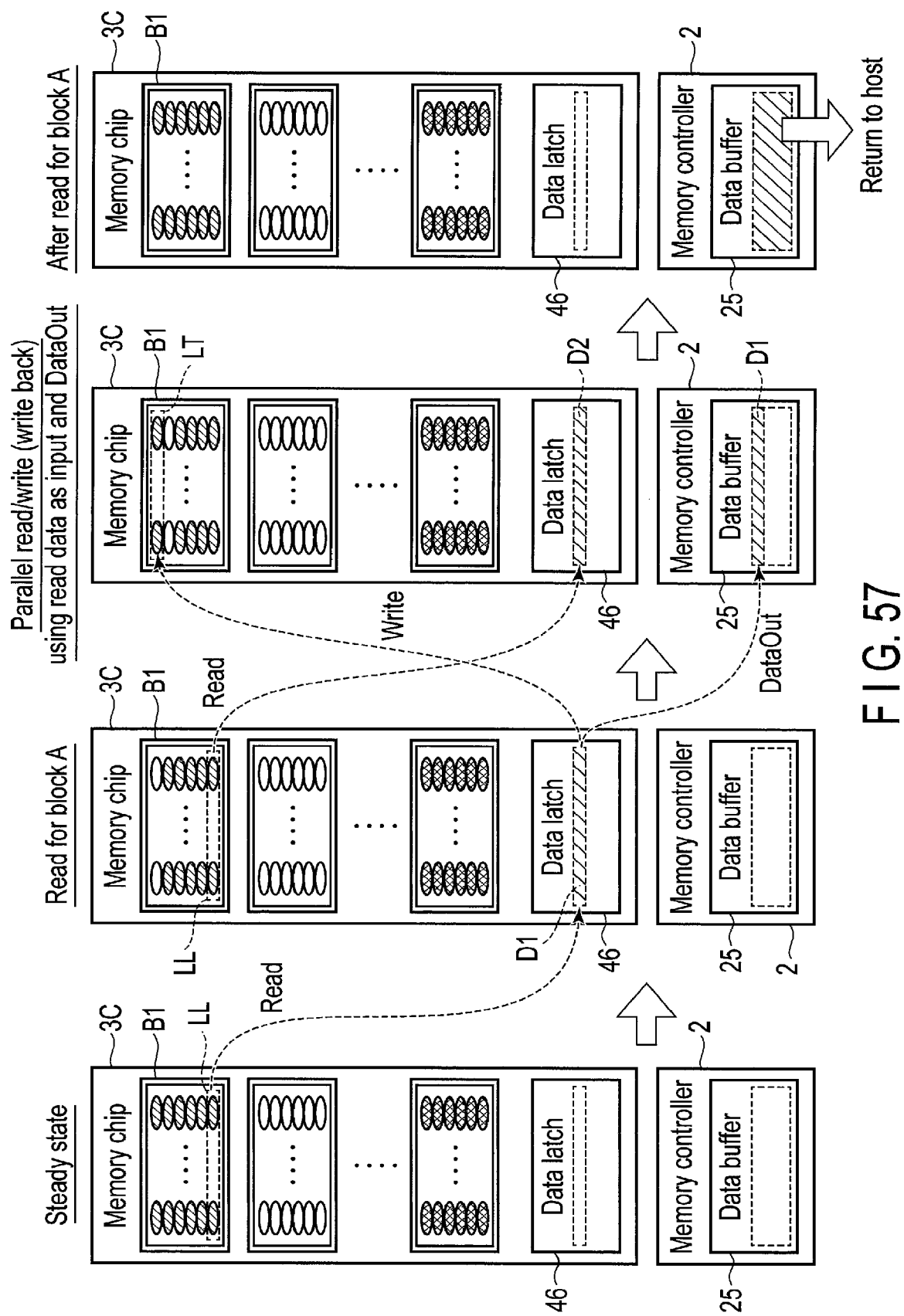
F I G. 57

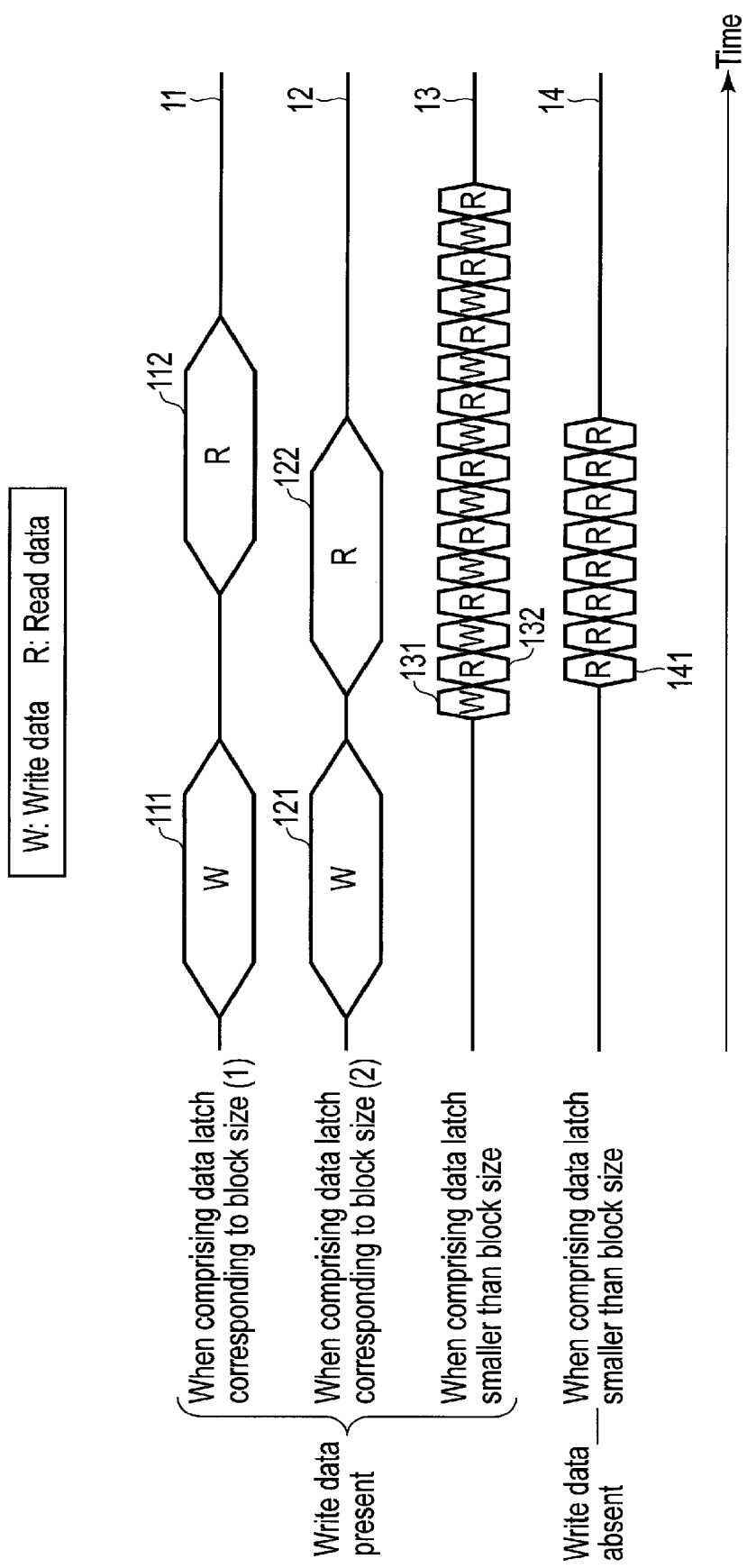
F I G. 58

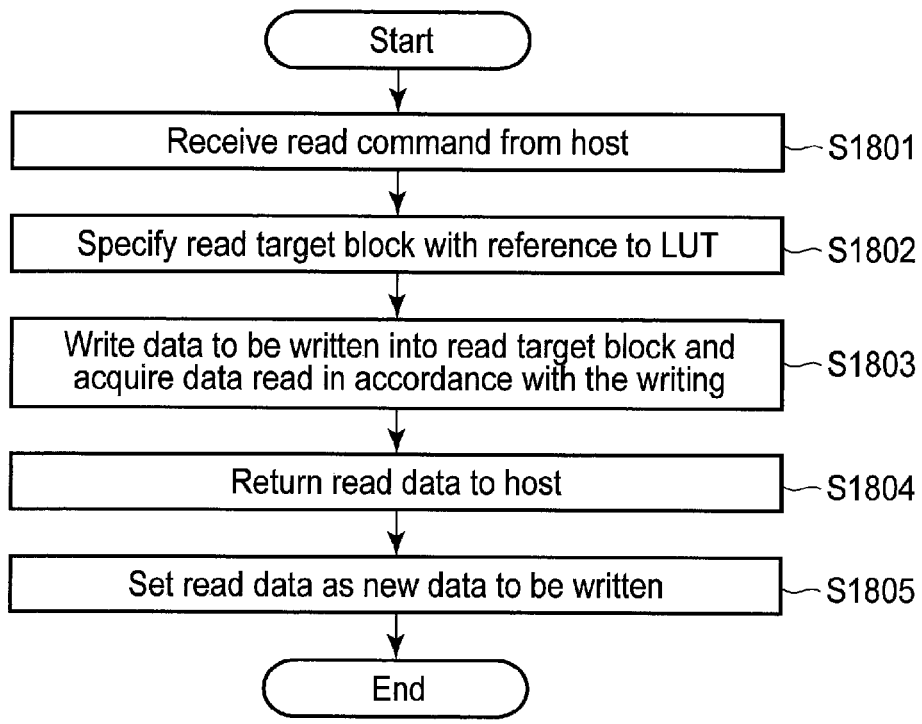
F I G. 59
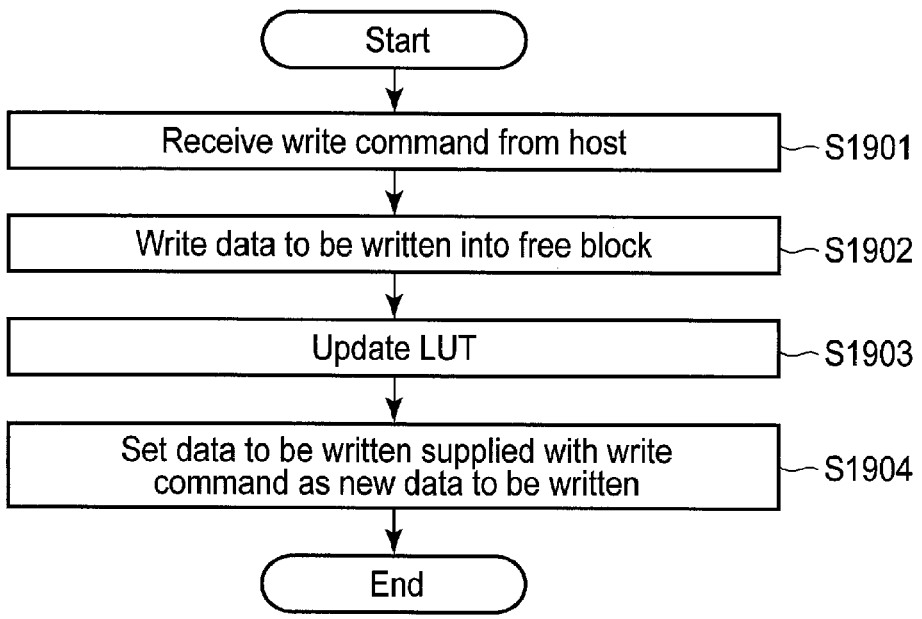
F I G. 60

MEMORY SYSTEM

CROSS-REFERENCE TO RELATED APPLICATIONS

This application is a division of and claims the benefit of priority under 35 U.S.C. § 120 from U.S. application Ser. No. 16/809,630 filed Mar. 5, 2020, and claims the benefit of priority under 35 U.S.C. § 119 from Japanese Patent Application No. 2019-167670 filed Sep. 13, 2019, the entire contents of each of which are incorporated herein by reference.

FIELD

Embodiments described herein relate generally to a technology of controlling a nonvolatile memory.

BACKGROUND

In recent years, memory systems including a nonvolatile memory are widely used. As a type of the memory systems, a solid state drive (SSD) including a NAND flash memory is known.

Recently, shift register type memories in which write and read of the data are carried out using the first-in first-out method or the last-in first-out (LIFO) method are being developed as next-generation nonvolatile memories.

BRIEF DESCRIPTION OF THE DRAWINGS

FIG. 1 is a block diagram illustrating a configuration example of a memory system according to an embodiment.

FIG. 2 is a diagram illustrating a configuration example of a cell array in a last-in first-out method in a magnetic domain wall shift memory included in the memory system of the embodiment.

FIG. 3 is a diagram illustrating an example of write and read operations for a block in the magnetic domain wall shift memory in FIG. 2.

FIG. 4 is a diagram illustrating a configuration example of a cell array in a first-in first-out method in the magnetic domain wall shift memory included in the memory system of the embodiment.

FIG. 6B is a diagram illustrating an example of the number of times of shift operations in accordance with a read operation for a block in the magnetic domain wall shift memory in FIG. 4.

FIG. 9 is a diagram illustrating an example of a parallel read/write operation using the data buffers for blocks in the magnetic domain wall shift memory in FIG. 4.

FIG. 13 is a flowchart illustrating a first example of the procedure of a read process executed in the memory system of the embodiment.

FIG. 15 is a flowchart illustrating a second example of the procedure of a read process that is executed in the memory system of the embodiment.

FIG. 21 is a flowchart illustrating a first example of the procedure of a write process that is executed in the memory system of the embodiment.

FIG. 23 is a flowchart illustrating a second example of the procedure of a write process that is executed in the memory system of the embodiment.

FIG. 25 is a diagram illustrating an example of the operation subsequent to FIG. 24.

FIG. 31 is a flowchart illustrating a third example of the procedure of a write process that is executed in the memory system of the embodiment.

FIG. 41 is a diagram illustrating an example where the parallel read/write operation including shift trimming and write verify for the block is unsuccessful.

FIG. 45 is a diagram illustrating a second example of a read operation including shift trimming for a block.

FIG. 46 is a flowchart illustrating an example of the procedure of a read process including a shift trimming process that is executed in the magnetic domain wall shift memory in the last-in first-out method.

FIG. 47A is a diagram illustrating an example of a read result of one block.

FIG. 47B is a diagram illustrating an example of data that is based on the read result of FIG. 47A and is returned by the magnetic domain wall shift memory to a memory controller.

FIG. 51 is a diagram illustrating an example of a parallel read/write operation using two data latches each corresponding to a block size.

FIG. 52 is a diagram illustrating an example that a memory chip transitions to a steady state where valid data is stored only in a data latch for write, in accordance with a read instruction.

FIG. 53 is a diagram illustrating an example that a memory chip transitions to a steady state where valid data is stored only in the data latch for write, in accordance with a write instruction.

FIG. 54 is a diagram illustrating an example of a parallel read/write operation using data latches each corresponding to a block size.

FIG. 55 is a diagram illustrating an example of a parallel read/write operation using two data latches each having a size smaller than a block size, and data buffers in the memory controller.

FIG. 56 is a diagram illustrating an example of the parallel read/write operation subsequent to FIG. 55.

FIG. 57 is a diagram illustrating an example of a parallel read/write operation using data latches each having a size smaller than a block size, and a data buffer in the memory controller.

FIG. 58 is a diagram illustrating an example of data signals transmitted through a memory channel between the memory controller and the magnetic domain wall shift memory.

FIG. 59 is a flowchart illustrating an example of the procedure of a read process that is executed in the memory controller.

FIG. 60 is a flowchart illustrating an example of the procedure of a write process that is executed in the memory controller.

DETAILED DESCRIPTION

Figure 5:
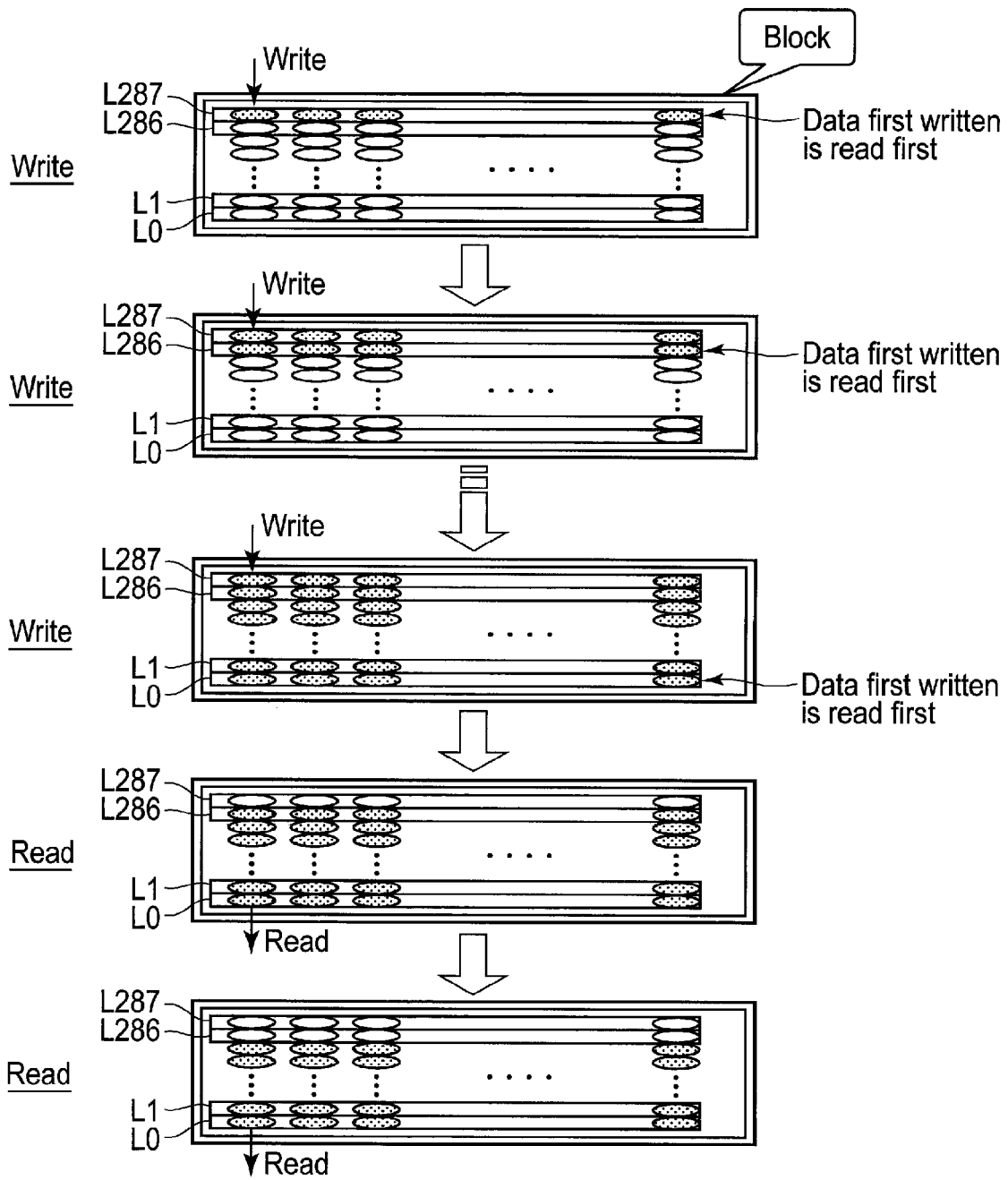
FIG. 5 is a diagram illustrating an example of write and read operations for a block in the magnetic domain wall shift memory in FIG. 4.

Various embodiments will be described hereinafter with reference to the accompanying drawings.

In general, according to one embodiment, a shift register memory includes a plurality of blocks and a control circuit. The plurality of blocks each includes data storing shift strings. Each of the data storing shift strings includes layers. The control circuit is configured to control the plurality of blocks, and perform storing and reading data by shifting one layer of the layers, in a direction along each of the data storing shift strings. The reading includes reading data from a first layer of the layers. The storing includes storing data to a second layer of the layers. The control circuit is configured to read first data stored in one or more third layers of the layers, the one or more third layers being successive from the first layer, determine a shift parameter in accordance with the reading of the first data, and perform the reading using the determined shift parameter after reading the first data.

First Embodiment

FIG. 1 is a block diagram illustrating a configuration example of a memory system according to a first embodiment. The memory system 1 includes a memory controller 2 and a shift register memory 3. The memory system 1 is connectable to a host 4, and FIG. 1 illustrates that the memory system 1 is connected to the host 4. The host 4 is an electronic device such as a personal computer, a server, a portable terminal or the like.

The shift register memory 3 is a memory that stores data permanently. The shift register memory is configured to perform write and read operations of data for a certain capacity unit referred to as a physical block, in units of page included in the physical block, in the last-in first-out method (also referred to as a first-in last-out method) or in the first-in first-out method. In the following descriptions, the physical block is also simply referred to as a block.

That is, the nonvolatile memory 3 includes blocks. Each block includes layers that function as stages of a shift register. In other words, one layer functions as one of stages in the shift register. The shift register memory in the last-in first-out method performs write and read operations of data for a block in the last-in first-out method by shifting data stored in individual layers in a first direction from a layer corresponding to a first stage to a layer corresponding to a last stage or in a second direction opposite to the first direction, in units of layer. In addition, the shift register memory in the first-in first-out method performs write and read operations of data for a block in the first-in first-out method by shifting data stored in individual layers in a first direction from a layer corresponding to a first stage to a layer corresponding to a last stage, in units of layer.

An example of the shift register memory that uses the last-in first-out method or the first-in first-out method to perform write and read operations of data is a magnetic domain wall shift memory 3. The magnetic domain wall shift memory 3 performs write and read operations of data while causing a current to flow through a magnetic shift register including magnetic domains to shift (move) each magnetic domain that stores information ("1" or "0"). An example in which the shift register memory in the memory system 1 is the magnetic domain wall shift memory 3 will be described below. Examples of various operations in the magnetic domain wall shift memory 3 to be described below are applicable to various shift register memories.

The memory system 1 may be realized as a solid state drive (SSD), or may be realized as a memory card in which the memory controller 2 and the magnetic domain wall shift memory 3 are configured as one package.

The memory controller 2 controls a write operation of data for the magnetic domain wall shift memory 3 according to a write request (for example, a write command) that is received from the host 4. Further, the memory controller 2 controls a read operation of data for the magnetic domain wall shift memory 3 according to a read request (for example, a read command) that is received from the host 4.

The memory controller 2 may be implemented as a circuit such as SoC. The memory controller 2 includes a host interface 21, a memory interface 22, a control unit 23, an encoding/decoding unit 24, a data buffer 25, and a static random access memory (SRAM) 28. The host interface 21, the memory interface 22, the control unit 23, the encoding/decoding unit 24, the data buffer 25, and the SRAM 28 are connected to an internal bus 20.

The host interface 21 performs a process according to an interface standard between a host and a device, and outputs a request, user data, and the like received from the host 4, to the internal bus 20. Further, the host interface 21 transmits user data read from the magnetic domain wall shift memory 3, a response received from the control unit 23, and the like to the host 4. In the present embodiment, data written into the magnetic domain wall shift memory 3 in accordance with a write request from the host 4 is referred to as user data.

The memory interface 22 performs a write operation for writing data into the magnetic domain wall shift memory 3 in accordance with an instruction from the control unit 23. Further, in accordance with an instruction from the control unit 23, the memory interface 22 performs a read operation for reading data from the magnetic domain wall shift memory 3.

The control unit 23 totally controls components of the memory system 1. The control unit 23 may be implemented as a CPU (i.e., a processor).

When receiving a request from the host 4 via the host interface 21, the control unit 23 performs control according to the request. For example, the control unit 23 instructs the memory interface 22 to write user data and parity into the magnetic domain wall shift memory 3 according to a write request received from the host 4. Further, according to a read request received from the host 4, the control unit 23 instructs the memory interface 22 to read user data and parity from the magnetic domain wall shift memory 3. Here, the parity means an error correction code (ECC) obtained from encode of the user data. The write request designates a logical address, a length of write data to be written, and the like. The logical address designated in the write request indicates a logical address into which the write data is to be written. The read request designates a logical address, a length of data to be read, and the like. The logical address designated in the read request indicates a logical address corresponding to the data to be read.

Further, when receiving a write request from the host 4, the control unit 23 determines a storage area (memory area) in the magnetic domain wall shift memory 3 to which user data stored in the data buffer 25 is to be written. That is, the control unit 23 manages a writing destination of user data. The control unit 23 uses a lookup table (LUT) 231 functioning as an address translation table to manage mapping between a logical address designated in a write request received from the host 4 and a physical address indicating a storage area in the magnetic domain wall shift memory 3 into which user data corresponding to the logical address is written. The LUT 231 may be stored in a RAM (a dynamic RAM (DRAM) or the SRAM 28) in the memory system 1, or may be stored permanently in the magnetic domain wall shift memory 3. In the latter case, when the memory system 1 is powered on, the LUT 231 may be loaded from the magnetic domain wall shift memory 3 into the RAM in the memory system 1.

Further, when receiving a read request from the host 4, the control unit 23 translates a logical address designated in the read request into a physical address using the LUT 231, and instructs the memory interface 22 to read data from this physical address.

Each of the blocks included in the magnetic domain wall shift memory 3 includes layers as described above. These layers are logically divided into pages. Each page includes a set of several adjacent layers. The size of one page is defined on the basis of the size of an ECC frame (hereinafter also referred to as a frame) that includes user data and an ECC.

The data buffer 25 may include a write buffer 25R that temporarily stores data to be written into the magnetic domain wall shift memory 3. The data to be written into the magnetic domain wall shift memory 3 is, for example, user data received from the host 4 in accordance with reception of a write request. The data buffer 25 may include a read buffer 25R that temporarily stores data read from the magnetic domain wall shift memory 3. Further, the data buffer 25 may temporarily store a code word (including user data and an ECC). The user data is encoded to generate the code word. For example, a part of the aforementioned RAM (the SRAM 28 or DRAM) constitutes the data buffer 25.

User data transmitted from the host 4 is transferred to the internal bus 20 and stored in the data buffer 25. The encoding/decoding unit 24 encodes data to be written into the magnetic domain wall shift memory 3 to generate a code word. Any coding method may be used for this encoding. For example, Reed Solomon (RS) coding, Bose Chaudhuri Hocquenghem (BCH) coding, and low density parity check (LDPC) coding may be used for this encoding. The encoding/decoding unit 24 includes an encoding unit 26 and a decoding unit 27.

For simplicity of explanation, in the present embodiment, it is assumed that the magnetic domain wall shift memory 3 includes one nonvolatile memory chip, but the present embodiment is also applicable to a configuration in which the magnetic domain wall shift memory 3 includes multiple magnetic domain wall memory chips. In the following descriptions, the magnetic domain wall shift memory chip is also simply referred to as a memory chip.

<Magnetic Domain Wall Shift Memory in Last-In First-Out Method>

FIG. 2 illustrates a configuration example of a cell array included in the magnetic domain wall shift memory 3 in the last-in first-out method. In the following descriptions, a configuration example of a cell array will be described using specific numerical values for easy understanding, but these numerical values are mere examples, the present embodiment is not limited to these specific numerical values, and any numerical value may be applied to the configuration of the cell array of the present embodiment.

The cell array includes blocks. Each of the blocks is a unit of writing and reading of data in the last-in first-out method.

It is assumed here that each block includes a total of 288 layers, i.e., layers L0 to L287. These 288 layers function as stages of the above-described shift register. The layer L287 corresponds to a first stage of the shift register, and is also referred to as a first layer or a top layer. The layer L0 corresponds to a last stage of the shift register, and is also referred to as a last layer or a bottom layer.

The layers L0 to L287 in each block may be implemented as data storing shift strings included in each block. In each of the data storing shift strings, writing and reading of data is performed in a unit of data of 1-bit width by the last-in first-out method. The data storing shift string is a magnetic material referred to as, for example, a magnetic memory line (MML), a magnetic memory narrow wire, a magnetic pole, a magnetic wire, a magnetic narrow wire, a string, or the like. In the following descriptions, a case where the data storing shift string is MML is exemplified.

It is assumed here that each block includes $1K+\alpha$ MMLs. In the magnetic domain wall shift memory 3, the MML is a magnetic shift register, and is implemented as, for example, a magnetic material extending in one direction. Each MML may include memory cells that correspond to stages from the first stage to the last stage, respectively. A direction of magnetization of each memory cell is used as information indicative of "1" or "0". The direction of magnetization is, for example, S or N.

Each MML is accessed in the last-in first-out method in which a stored position of data previously written is moved to a back side when a next data is written, and the data on the back side cannot be read before the data that is written later is read.

In the present embodiment, it is assumed that one MML can store $256+\beta$ bits. This corresponds to a configuration in which one MML of the magnetic domain wall shift memory 3 includes $256+\beta$ memory cells.

In this case, the size of one block is $(1K+\alpha)\times(256+\beta)$ bits=32 KB+$\alpha'$. It is considered that $\alpha$, $\beta$, $\alpha'$ ($\alpha'=\alpha\times(256+\beta)+\beta\times(1K+\alpha)-\alpha\times\beta$) is used as an area for storing parity as well as an area for storing information to be stored in a manner of being attached to data. In the following descriptions, $\alpha$, $\beta$, and $\alpha'$ are used as parity for the sake of simplicity. The parity is an error correction code (ECC) added to data. The numerical values of $\alpha$, $\beta$, and $\alpha'$ described above are given as an example, and in the present embodiment, any various numerical values may be applied.

In the following description, a case where $\alpha=0$ and $\beta=32$ will be described by way of example.

In FIG. 2, a set of ellipses continuing in a vertical direction indicates one MML. A set of $1K+\alpha$ MMLs constitutes one block. Each block is represented by a double square. $1K+\alpha$ MMLs included in the block constitute 288 (=256+32) layers L0 to L287. Each of the layers L0 to L287 is represented by a rounded square.

One end of each of $1K+\alpha$ MMLs included in each block is connected to each of $1K+\alpha$ input and output units. In FIG. 2, a set of the $1K+\alpha$ input and output units is represented as an input/output unit group 31. Writing and reading of data for this block are performed via the input/output unit group 31.

The layer L287 closest to the input/output unit group 31 is used as a first stage of the shift register, and the layer L0 farthest from the input/output unit group 31 is used as a last stage of the shift register.

In a write operation, data stored in each layer is shifted in a unit of layer in a first direction from the layer L287 corresponding to the first stage to the layer L0 corresponding to the last stage (that is, in the direction from the top to the bottom in FIG. 2).

In a read operation, data stored in each layer is shifted in a unit of layer in a second direction opposite to the first direction (that is, in a direction from the bottom to the top in FIG. 2).

The layers L0 to L287 are divided into eight layer groups each including 36 (=288/8) adjacent layers. Each layer group is referred to as a page. In other words, the layers L0 to L287 are logically divided into eight pages p0 to p7. One page includes 36 (=288/8) adjacent layers. Each of the pages p0 to p7 is represented by a square. One block is composed of eight pages p0 to p7.

The capacity of each of the pages p0 to p7 is predefined such that a data portion having a predetermined size can be stored. For example, one page may be defined to have the capacity capable of storing an ECC frame including a data portion having a predetermined size and an error correction code (ECC) corresponding to this data portion. The size of a data portion included in one ECC frame may be, for example, 4 KB. In this case, one ECC frame includes 4 KB of user data and an ECC. One block can store eight data portions (eight ECC frames) corresponding to the eight pages p0 to p7, respectively.

The magnetic domain wall shift memory 3 includes the input/output unit group 31, a shift control circuit 32 and a read/write control circuit 33. The input/output unit group 31 is connected to each of the shift control circuit 32 and the read/write control circuit 33. The shift control circuit 32 shifts data of each layer in a block in the direction from the layer L287 to the layer L0 or in the direction from the layer L0 to the layer L287 in units of layer.

In the magnetic domain wall shift memory 3, the shift control circuit 32 supplies a current pulse to each MML in a block to shift (move) each magnetic domain wall in each MML. The current pulse is also referred to as a shift pulse. In each MML, sections divided by magnetic domain walls are referred to as magnetic domains. Each of the magnetic domains includes one or more memory cells. In each MML, each magnetic domain is shifted (moved) in units of layer (that is, in units of bit) according to movement of the magnetic domain walls.

The read/write control circuit 33 controls writing of data into the block and reading of data from the block via the input/output unit group 31. In a write operation, each of the input/output units included in the input/output unit group 31 forms magnetization having a specific magnetization direction at a part in an MML connected to the input/output unit in accordance with a signal from the read/write control circuit 33. In addition, each of the input/output units included in the input/output unit group 31 includes a sense amplifier. In a read operation, the sense amplifier detects a magnetization direction of a part of an MML connected to the input/output unit in accordance with a signal from the read/write control circuit 33. The sense amplifier includes a sense latch that temporarily stores the detection result of the magnetization direction. The read/write control circuit 33 can read data, which is based on the detection result of the magnetization direction stored in the sense latch, from the MML 10.

In the above-described configuration, writing and reading of information for each MML are performed in the last-in first-out method. Reading of information from each MML is destructive read.

The shift control circuit 32 and the read/write control circuit 33 may be realized by a software (program) executed by one or more processors, a hardware such as a dedicated integrated circuit (IC), a control circuit, or a combination thereof.

FIG. 3 illustrates an example of performing write and read operations for a block in the magnetic domain wall shift memory 3 in the last-in first-out method. As described above, the block is composed of MMLs. Writing and reading of data for all the MMLs in the same block are executed in parallel.

When a write operation of writing data into the block is performed, the data is first written into the first layer L287. Next, the data written into the first layer L287 is shifted to the second layer L286 that is lower than the first layer L287 and subsequent data is written into the layer L287. Similarly, the operation of shifting written data in a direction from the first layer L287 to the last layer L0 (i.e., the first direction) and writing subsequent data into the first layer L287 is repeated, and data is thereby written into all layers in the block.

After that, when a read operation of reading the data from this block is performed, the data written into the layer L287 is read, and the data written into each layer is shifted in a direction from the last layer L0 to the first layer L287 (i.e., the second direction) in units of layer. Similarly, the operation of reading data from the first layer L287 and shifting data written into each layer in the second direction in units of layer is repeated, and the data is read from the block.

Therefore, in the magnetic domain wall shift memory 3 in the last-in first-out method, data first written into a block cannot be read until data written later is read. In other words, data last written into a block can be read first, in the magnetic domain wall shift memory 3 in the last-in first-out method.

<Magnetic Domain Wall Shift Memory in First-In First-Out Method>

FIG. 4 illustrates a configuration example of a cell array included in the magnetic domain wall shift memory 3 in the first-in first-out method. The cell array includes blocks. Each of the blocks is a unit of writing and reading of data in the first-in first-out method.

It is assumed here that each block includes 288 layers L0 to L287, similarly to the example of the memory cell array included in the magnetic domain wall shift memory 3 in the last-in first-out method described with reference to FIG. 2. In the following descriptions, differences from the magnetic domain wall shift memory 3 in the last-in first-out method are mainly explained and explanation of the same features is omitted.

The layers L0 to L287 in each block may be implemented as data storing shift strings included in each block. Each of the data storing shift strings is a unit of writing and reading of data having 1-bit width by the first-in first-out method. In the following descriptions, a case where the data storing shift strings are MMLs is exemplified.

Each MML is accessed by the first-in first-out method in which a stored position of data previously written is moved to a back side when next data is written, and the data on the front side cannot be read before the data that is written previously is read.

In FIG. 4, a set of ellipses continuing in a vertical direction indicates one MML. A set of 1K+α MMLs constitutes one block. Each block is represented by a double square. The 1K+α MMLs included in the block constitute 288 (=256+32) layers L0 to L287. Each of the layers L0 to L287 is represented by a rounded square.

One end of each of the 1K+α MMLs included in each block is connected to each of 1K+α input units, and the other end is connected to each of 1K+α output units. In FIG. 4, a set of the 1K+α input units is represented as an input unit group 41, and a set of the 1K+α output units is represented as an output unit group 44. Writing of data for this block is performed via the input unit group 41. Reading of data for this block is performed via the output unit group 44.

The layer L287 closest to the input unit group 41 is used as a first stage of the shift register, and the layer L0 farthest from the input unit group 41 is used as a last stage of the shift register.

In write and read operations, data stored in each layer is shifted in units of layer in a first direction from the layer L287 corresponding to the first stage to the layer L0 corresponding to the last stage (i.e., a direction from the top to the bottom in FIG. 4).

The magnetic domain wall shift memory 3 includes the input unit group 41, a shift control circuit 42, a write control circuit 43, the output unit group 44, and the read control circuit 45. The input unit group 41 is connected to each of the shift control circuit 42 and the write control circuit 43. The shift control circuit 42 shifts data of each layer in a block in the direction from the layer L287 to the layer L0, in units of layer.

In the magnetic domain wall shift memory 3, the shift control circuit 42 supplies a current pulse (shift pulse) to each MML in the block to shift (move) each magnetic domain wall in each MML.

The write control circuit 43 controls writing data into the block via the input unit group 41. In the write operation, each of the input units included in the input unit group 41 forms magnetization having a specific magnetization direction at a part of an MML connected to the input unit, in accordance with a signal from the write control circuit 43.

The read control circuit 45 controls reading data from the block via the output unit group 44. Each of the output units included in the output unit group 44 includes a sense amplifier that detects, in the read operation, a magnetization direction of a part of an MML connected to the output unit, in accordance with a signal from the read control circuit 45. The sense amplifier includes a sense latch that temporarily stores the detection result of the magnetization direction. The read control circuit 45 can read data, which is based on the detection result of the magnetization direction stored in the sense latch, from the MML 10.

In the above-described configuration, writing and reading of information for each MML are executed in the first-in first-out method. Reading of information from each MML is destructive read.

The shift control circuit 42, the write control circuit 43, and the read control circuit 45 may be realized by a software executed by one or more processors, a hardware such as a dedicated IC, a control circuit, or a combination thereof.

FIG. 5 illustrates an example of performing write and read operations for a block included in the magnetic domain wall shift memory 3 in the first-in first-out method. As described above, the block is composed of MMLs.

When a write operation of writing data into the block is performed, data is first written into the first layer L287. Next, the data written in the first layer L287 is shifted into the second layer L286 that is lower than the first layer L287 and subsequent data is written into the layer L287. Similarly, the operation of shifting written data in a direction from the first layer L287 to the last layer L0 (i.e., the first direction) and writing subsequent data into the first layer L287 is repeated, and data is thereby written into all layers in the block.

After that, when a read operation of reading the data from this block is performed, the data written in the last layer L0 is read, and the data written in each layer is shifted in the first direction in units of layer. Similarly, the operation of reading data from the last layer L0 and shifting data written in each layer in the first direction in units of layer is repeated, and the data is thereby read from the block.

Therefore, in the magnetic domain wall shift memory 3 in the first-in first-out method, the data first written into the block can be read first. In other words, in the magnetic domain wall shift memory 3 in the first-in first-out method, the data last written into the block cannot be read until the data previously written is read.

Figure 6A:
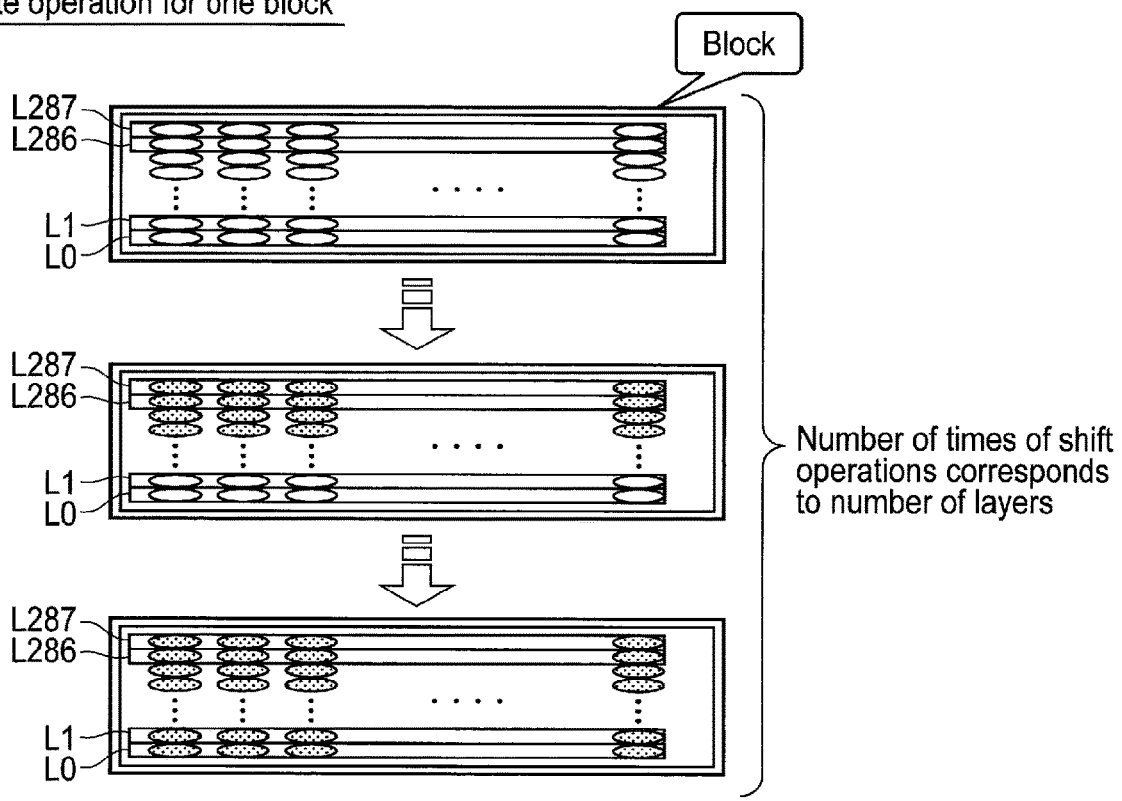
FIG. 6A is a diagram illustrating an example of the number of times of shift operations in accordance with a write operation for a block in the magnetic domain wall shift memory in FIG. 4.

FIG. 6A illustrates the number of times of shift operations in a write operation for one block. As described above, in the write operation, an operation of shifting written data in the first direction from the first layer L287 to the last layer L0 in units of layer and writing data into the first layer L287 is repeated.

For this reason, when a write operation of writing write data of a block size is performed on one free block as a write target block, shift operations for the number of layers in the block need to be performed.

The block size is a data size corresponding to one block.

FIG. 6B illustrates the number of times of shift operations in a read operation for one block. As described above, in the read operation, an operation of reading data from the last layer L0 and shifting data written in each layer in the first direction in units of layer is repeated.

For this reason, when the read operation is performed on one written block as a read target block, shift operations for the number of layers in the block need to be performed.

Thus, FIGS. 6A and 6B illustrate the examples where the write operation for one block and the read operation for one block are performed independently.

Figure 7:
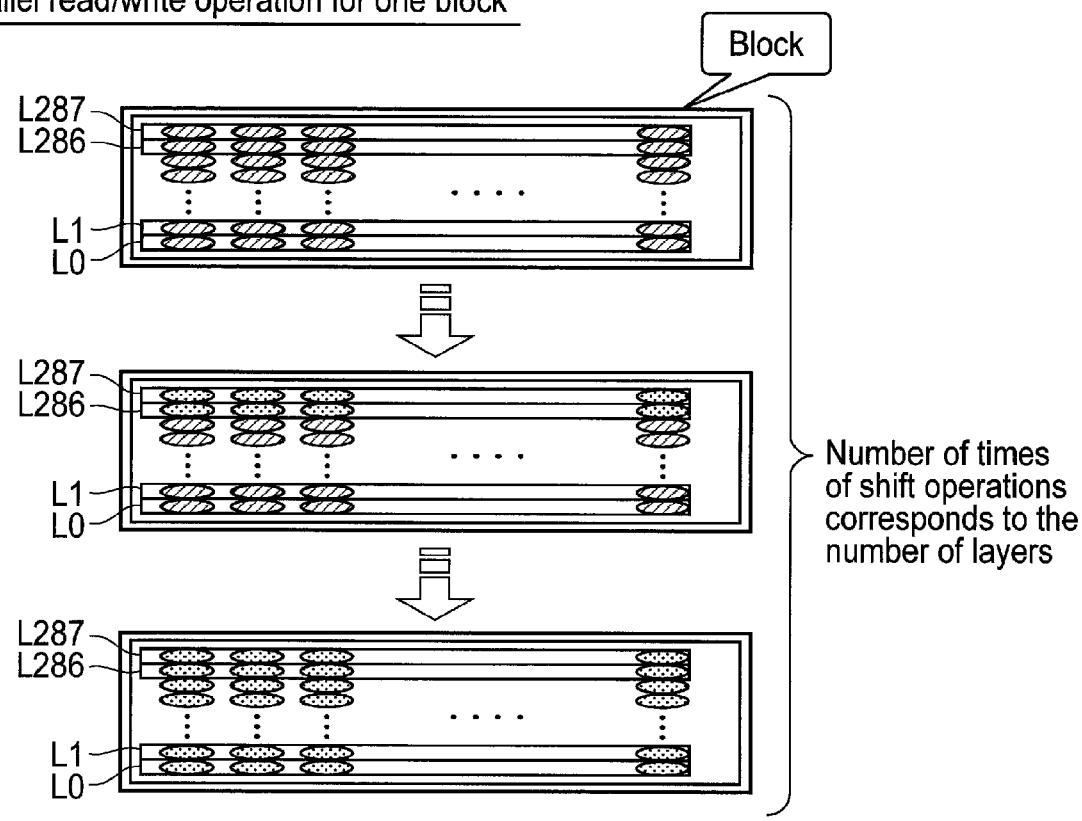
FIG. 7 is a diagram illustrating an example of a parallel read/write operation for a block in the magnetic domain wall shift memory in FIG. 4.

In contrast, FIG. 7 illustrates an example of a parallel read/write operation for one block. The parallel read/write operation is an operation of performing a read operation and a write operation for a written block in parallel when write data of the block size, which is to be written, has been prepared.

The magnetic domain wall shift memory 3 of the first-in first-out method may perform the parallel read/write operation when receiving a read request for a written block as a read target block. In the parallel read/write operation, reading data from the last layer L0, shifting data written in each layer in the first direction in units of layer, and writing write data into the first layer L287 are performed. That is, reading of data from the read target block and writing of the write data to the read target block can be executed in parallel.

As described above with reference to FIGS. 6A and 6B, when a write operation and a read operation for a block are executed independently, shift operations corresponding to the number of layers in the block need to be executed in the write operation and in the read operation, respectively. In contrast, in the parallel read/write operation, both a read operation and a write operation can be performed while shift operations corresponding to the number of layers in the block are performed. For this reason, in the parallel read/write operation, necessary shift operations can be reduced by half as compared with executing the write operation and the read operation for the block independently. Therefore, wear of the magnetic domain wall shift memory 3 can be reduced and its lifetime (endurance) can be extended by performing the parallel read/write operation. In addition, in the parallel read/write operation, an access performance is improved since read and write accesses are executed in parallel.

Figure 8:
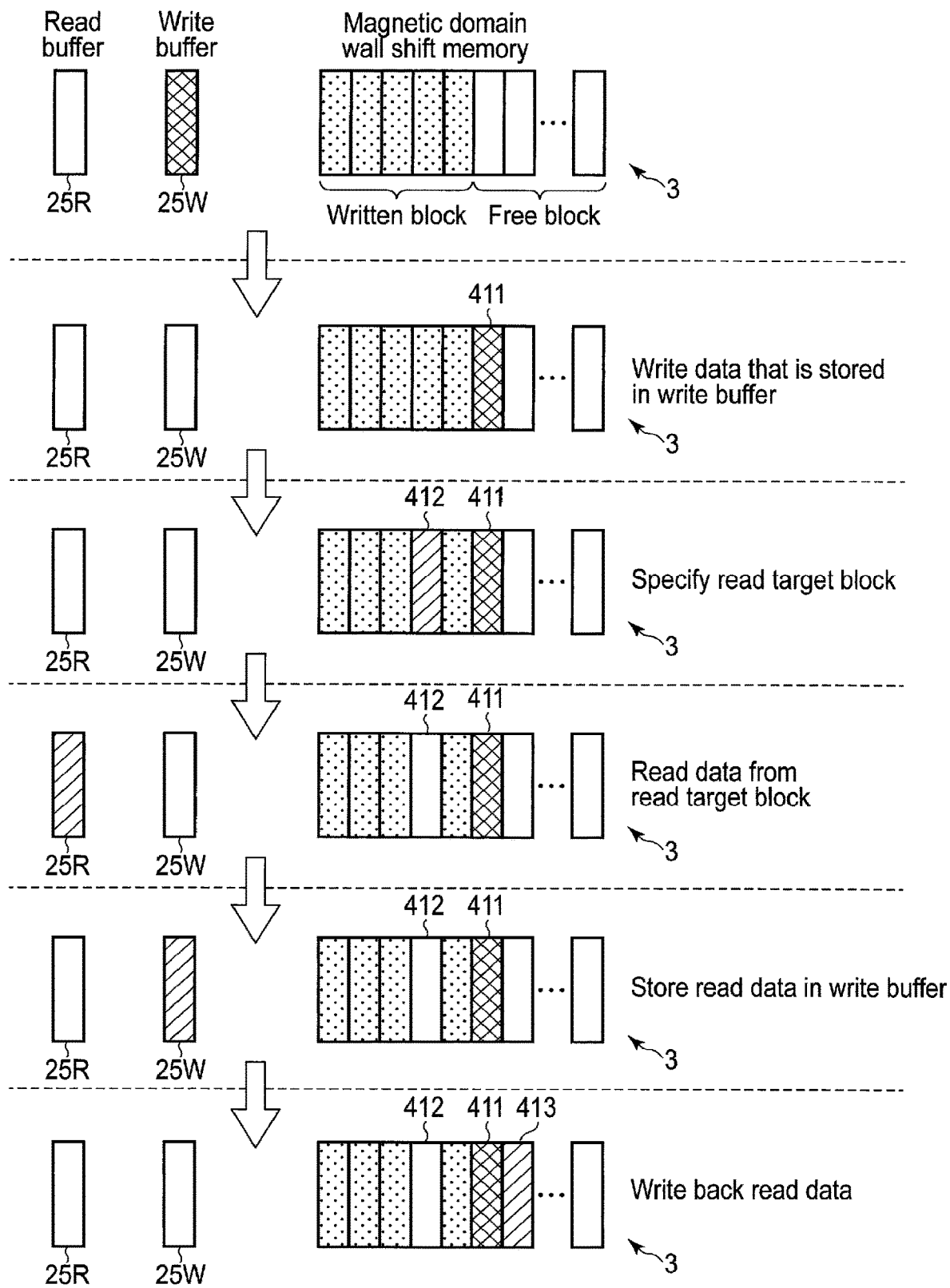
FIG. 8 is a diagram illustrating an example of write and read operations using data buffers for blocks in the magnetic domain wall shift memory in FIG. 4.

FIG. 8 illustrates an example of a write operation and a read operation in the memory system 1 that includes the magnetic domain wall shift memory 3 in the first-in first-out method. In this example, the write operation and the read operation are executed independently for blocks in the magnetic domain wall shift memory 3 in the first-in first-out method, using the read buffer 25R and the write buffer 25W.

The read buffer 25R is a temporary storage area where read data that is read from the magnetic domain wall shift memory 3 is stored temporarily. The write buffer 25W is a temporary storage area where write data to be written into the magnetic domain wall shift memory 3 is stored temporarily. It is assumed here that the magnetic domain wall shift memory 3 includes written blocks storing valid data and free blocks storing no valid data. The valid data is data that is associated with a logical address and that may be read later by the host 4. Data that is not associated with any logical address and that may no longer be read by the host 4 is referred to as invalid data.

When write data of the block size is stored in the write buffer 25W, the memory controller 2 selects one free block in the magnetic domain wall shift memory 3 as a write target block 411. The memory controller 2 writes the write data stored in the write buffer 25W, into the write target block 411. The memory controller 2 releases the write buffer 25W in response to completion of writing of the write data.

Next, when receiving a read request from the host 4, the memory controller 2 specifies a read target block 412 corresponding to the read request. The memory controller 2 stores read data that is read from the read target block 412, in the read buffer 25R. The memory controller 2 returns the read data stored in the read buffer 25R to the host 4.

To write back the read data that is obtained with destructive read, the memory controller 2 stores the read data, which is stored in the read buffer 25R, in the write buffer 25W, as new write data, and releases the read buffer 25R. Then the memory controller 2 selects one free block in the magnetic domain wall shift memory 3 as a write target block 413. The memory controller 2 writes the write data stored in the write buffer 25W, into the write target block 413. The memory controller 2 releases the write buffer 25W upon completion of writing of the write data. Therefore, the read data, which is read from the read target block 412, can be written back to the free block 413.

Reading of data from a block is destructive read by which the data, which is stored in the block, is destructed upon reading. The data stored in the read target block 412 is destructed upon reading. For this reason, the memory controller 2 needs to write back the read data to the magnetic domain wall shift memory 3.

When executing the write operation and the read operation independently, the memory controller 2 stores the read data, which is stored in the read buffer 25R by reading, in the write buffer 25W as new write the data. Then, the memory controller 2 writes back the write data to a free block 413. Write-back of the read data that is read by the destructive read is thereby implemented.

FIG. 9 illustrates an example of a parallel read/write operation in the memory system 1 that includes the magnetic domain wall shift memory 3 in the first-in first-out method. In this example, the parallel read/write operation is executed for blocks in the magnetic domain wall shift memory 3 in the first-in first-out method, using the read buffer 25R and the write buffer 25W.

When receiving a read request from the host 4 in a state where write data of the block size is stored in the write buffer 25W, the memory controller 2 specifies a read target block 421 corresponding to the read request. While reading read data from the read target block 421, the memory controller 2 writes the write data into the read target block 421. The read data that has been read is stored in the read buffer 25R. The memory controller 2 releases the write buffer 25W and returns the read data stored in the read buffer 25R to the host 4 upon completion of reading of the read data and writing of the write data.

Then, the memory controller 2 stores the read data, which is stored in the read buffer 25R, in the write buffer 25W as new write data, and releases the read buffer 25R. Therefore, when receiving a new read request from the host 4, the read data, which is read from the read target block 412, can be written back to a new read target block corresponding to the new read request. That is, while reading read data from the new read target block corresponding to the new read request, the memory controller 2 performs a parallel read/write operation of writing back the read data, which is read from the previous read target block 412, to this new read target block. Write-back of the read data, which is obtained with destructive read, is thereby implemented.

Therefore, since the memory controller 2 performs the write operation of writing back the read data that has been previously read, in parallel to the read operation in accordance with the read request, latency occurring from the write-back operation can be concealed.

<Read Operation Including Shift Trimming>

In the following descriptions, a case where the magnetic domain wall shift memory 3 in the first-in first-out method is used will be mainly explained unless specifically mentioned. In addition, it is assumed that reading and writing for the magnetic domain wall shift memory 3 are executed in units of block.

Shift trimming is an operation for determining a shift parameter suitable for each MML in the block. A shift parameter suitable for an MML is a parameter to be used to shift data stored in layers included in the MML in the first direction from the first layer to the last layer. The shift parameter may include a voltage value and a time length of a shift pulse to be applied (supplied) to the MML, but may be any parameter relevant to the shift operation on the MML. The time length of the shift pulse is also referred to as a pulse width.

The magnetic domain wall shift memory 3 includes, for example, many blocks and each of the blocks is composed of many MMLs. Since these many MMLs may have different characteristics, whether actually shifting upon application of a certain shift pulse occurs in each MML may vary. To deal with the variation, for example, characteristic of each block and characteristic of each MML may be detected and a table including parameters based on the detection result may be prepared. When the magnetic domain wall shift memory 3 includes many blocks, however, the data amount of the table becomes large and is unreal.

For this reason, when a read operation, a write operation, or a parallel read/write operation for a block is to be performed, the shift control circuit 42 of the present embodiment performs, before performing the operation, shift trimming to determine a shift parameter suitable for each MML in the block. Thus, the shift control circuit 42 can perform a shift operation in the read operation, the write operation, or the parallel read/write operation, by using the shift parameter suitable for each MML. In addition, the shift control circuit 42 executes the shift trimming every time the shift control circuit 42 performs a read operation, a write operation, or a parallel read/write operation for a block. Therefore, even if the characteristic of each MML is varied due to wear or the like, the shift control circuit 42 can acquire the shift parameter flexibly following the characteristic at this time.

In the following descriptions, a block on which the shift trimming can be performed is referred to as an applicable block of shift trimming. The applicable block of shift trimming is guaranteed to store a read mark (RM) in one or more layers successive from the last layer of a read target, of layers included in each MML in the block. The last layer of the read target is a layer from which data is to be read first in each MML. Each MML may include a dummy layer below the last layer of the read target. The dummy layer is the last physical layer, but does not store valid data or an RM and is not a read target layer.

The RM has the data size corresponding to one or more layers. For example, when writing data to a block and reading data from a block are performed in units of data corresponding to a first data size, a value obtained by dividing a difference obtained by subtracting the first data size from the block size, by the number of MMLs in the block, may be used as the data size of the RM.

A block which is not guaranteed to store the RM in one or more layers successive from the last layer of layers in each MML in the block is also referred to as an inapplicable block of shift trimming.

The RM includes data of a specific pattern. The RM is data known to at least one of the memory controller 2 and the magnetic domain wall shift memory 3. The RM is used to determine a shift parameter suitable for an MML where the RM is stored. Upon reading the RM from each MML, the shift control circuit 42 of the magnetic domain wall shift memory 3 determines the shift parameter that is used to shift data, which is stored in layers in the MML, in the first direction.

Figure 10:
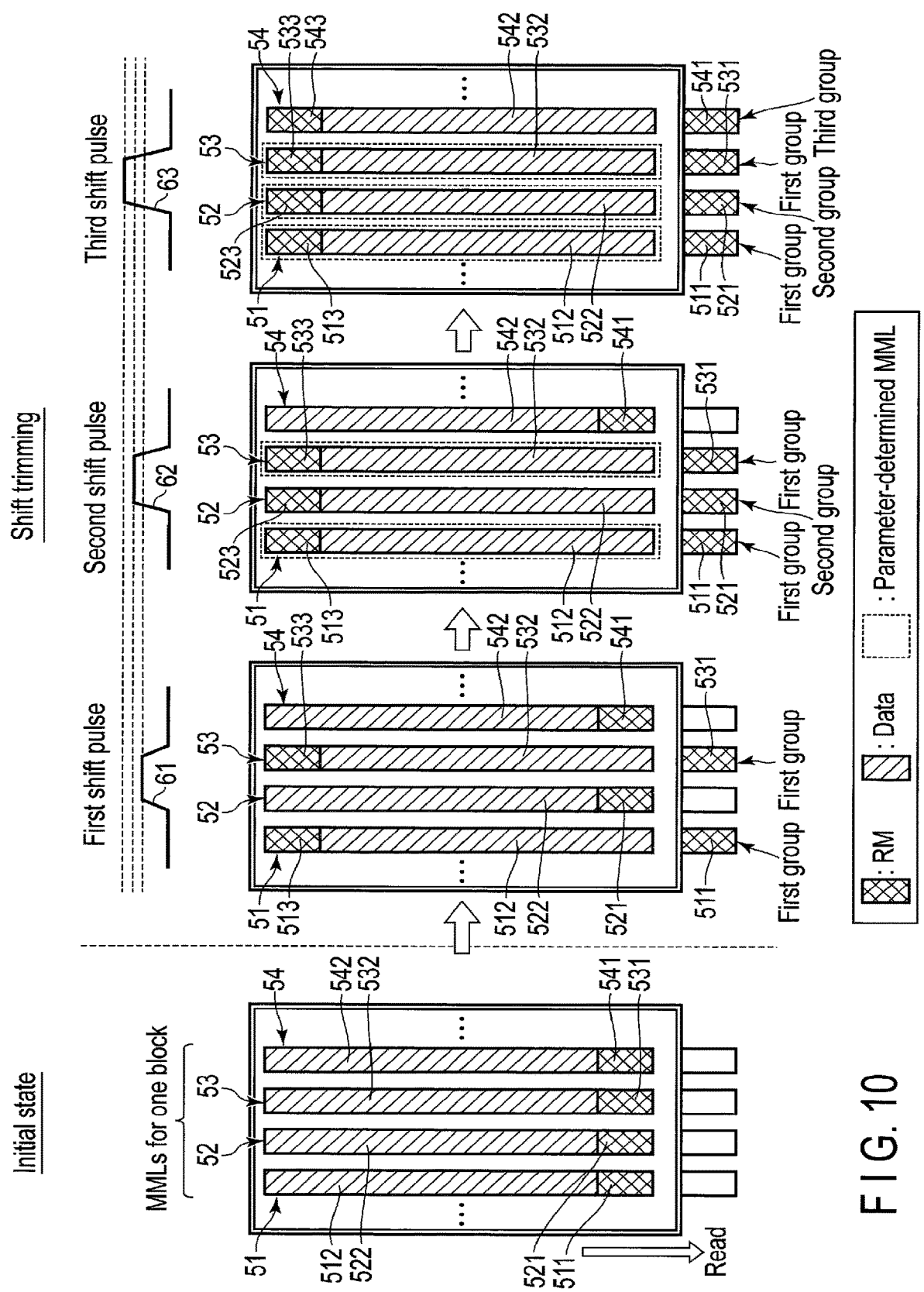
FIG. 10 is a diagram illustrating a first example of a read operation including shift trimming for a block.
Figure 11:
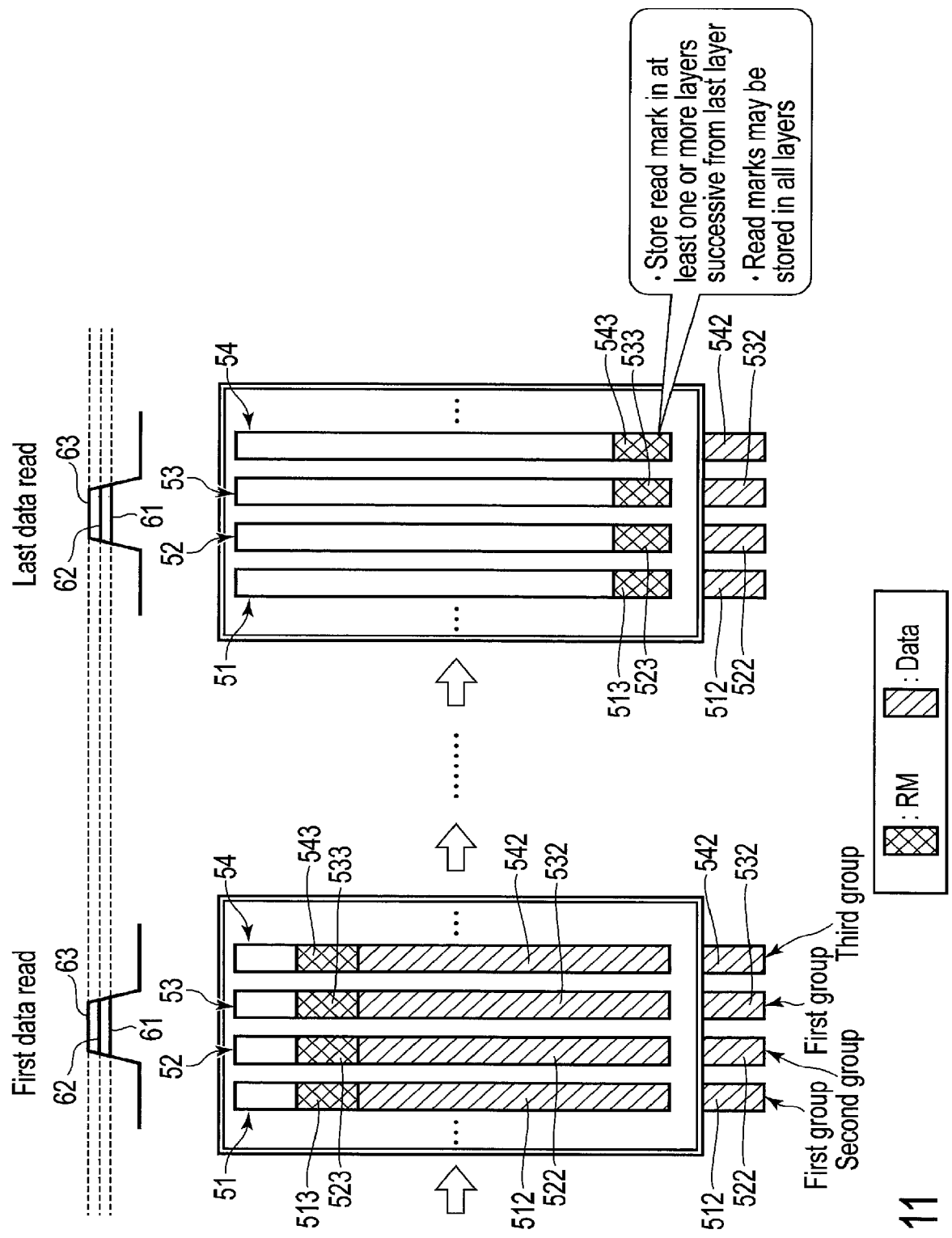
FIG. 11 is a diagram illustrating an example of the read operation subsequent to FIG. 10.

FIGS. 10 and 11 illustrate a first example of a read operation including shift trimming for a block. The cell array of the magnetic domain wall shift memory 3A may include many blocks, but the example illustrates one block including four MMLs 51, 52, 53, and 54. In addition, the example that the block is composed of the four MMLs 51, 52, 53, and 54 is described, but the block may include any number of MMLs. A rectangle illustrated under each of the MMLs 51, 52, 53, and 54 corresponds to a sense latch in the output unit group 44. Each sense latch temporarily stores the read result from the corresponding MML.

As illustrated in FIG. 10, a block in an initial state is an applicable block of shift trimming. That is, the MML 51 stores an RM 511 in one or more layers successive from the last layer of layers in the MML 51. The MML 52 stores an RM 521 in one or more layers successive from the last layer of layers in the MML 52. The MML 53 stores an RM 531 in one or more layers successive from the last layer of layers in the MML 53. The MML 54 stores an RM 541 in one or more layers successive from the last layer of layers in the MML 54.

In addition, in the MML 51, data 512 is stored in layers higher than the layer in which the RM 511 is stored. In the MML 52, data 522 is stored in layers higher than the layer in which the RM 521 is stored. In the MML 53, data 532 is stored in layers higher than the layer in which the RM 531 is stored. In the MML 54, data 542 is stored in layers higher than the layer in which the RM 541 is stored.

The shift control circuit 42 and the read control circuit 45 execute shift trimming for the block of the initial state. Upon reading an RM from an MML, the shift control circuit 42 and the read control circuit 45 determine a shift parameter to be used to shift data, which is stored in layers in the MML, in the first direction.

More specifically, the shift control circuit 42 first applies a first shift pulse 61 to all the MMLs 51, 52, 53, and 54, for read/write shift, by using an RM as input data to each of the MMLs 51, 52, 53, and 54. The number of times the first shift pulse 61 is applied corresponds to the number of layers of the RM.

A read/write shift is a shift operation in the case of performing reading and writing for an MML in parallel in a state of preparing for input data to be written into the MML. A read shift is a shift operation in the case of performing reading for an MML independently. In addition, a write shift is a shift operation in the case of performing writing for an MML independently.

The read control circuit 45 detects the RMs 511 and 531 from read data that is read via sense latches in the output unit group 44 upon the application of the first shift pulse 61. The shift control circuit 42 creates a first group including the MMLs 51 and 53 in which the detected RMs 521 and 531 were stored respectively. The shift control circuit 42 sets a first shift parameter indicative of the first shift pulse 61 for the first group. The first shift parameter includes, for example, the voltage value of the first shift pulse 61.

The first shift parameter suitable for the MMLs 51 and 53 belonging to the first group is thereby determined. In the MMLs 51 and 53 belonging to the first group, the RMs 511 and 531 have been read, the RM 513 set as the input data has been written into one or more layers successive from the first layer in the MML 51, and the RM 533 set as the input data has been written into one or more layers successive from the first layer in the MML 53, in accordance with the read/write shift.

Next, the shift control circuit 42 and the read control circuit 45 execute shift trimming for the remaining MMLs 52 and 54 excluding the MMLs 51 and 53 that belong to the first group (i.e., parameter-determined MMLs). The shift control circuit 42 applies a second shift pulse 62 to the MMLs 52 and 54 for read/write shift, using an RM as the input data to each of the MMLs 52 and 54. The number of times the second shift pulse 62 is applied corresponds to the number of layers of the RM. The second shift pulse 62 is different from the first shift pulse 61. The second shift pulse 62 is, for example, a shift pulse having a voltage higher than the first shift pulse 61.

The read control circuit 45 detects the RM 521 from read data that is read via a sense latch in the output unit group 44 upon the application of the second shift pulse 62. The shift control circuit 42 creates a second group including the MML 52 in which the detected RM 521 was stored. The shift control circuit 42 sets a second shift parameter indicative of the second shift pulse 62 for the second group. The second shift parameter includes, for example, the voltage value of the second shift pulse 62.

The second shift parameter suitable for the MML 52 that belongs to the second group is thereby determined. In the MML 52 belonging to the second group, the RM 521 has been read, and the RM 523 set as the input data has been written into one or more layers successive from the first layer in the MML 52, in accordance with the read/write shift.

Next, the shift control circuit 42 and the read control circuit 45 perform shift trimming for the remaining MML 54 further excluding the MML 52 that belongs to the second group. The shift control circuit 42 applies a third shift pulse 63 for read/write shift to the MML 54, using an RM as input data to the MML 54. The number of times the third shift pulse 63 is applied corresponds to the number of layers of the RM. The third shift pulse 63 is different from the first shift pulse 61 and the second shift pulse 62. The third shift pulse 63 is, for example, a shift pulse having a voltage higher than the second shift pulse 62.

The read control circuit 45 detects the RM 541 from read data that is read via a sense latch in the output unit group 44 upon application of the third shift pulse 63. The shift control circuit 42 creates a third group including the MML 54 in which the detected RM 541 was stored. The shift control circuit 42 sets a third shift parameter indicative of the third shift pulse 63 for the third group. The third shift parameter includes, for example, the voltage value of the third shift pulse 63.

The third shift parameter suitable for the MML 54 that belongs to the third group is thereby determined. In the MML 54 belonging to the third group, the RM 541 has been read, and the RM 543, which is set as the input data, has been written into one or more layers successive from the first layer in the MML 54, in accordance with the read/write shift.

Then, as illustrated in FIG. 11, the shift control circuit 42 and the read control circuit 45 read the data 512, 522, 532, and 542 from the MMLs 51, 52, 53, and 54, by using shift parameters set for the respective groups. That is, the shift control circuit 42 and the read control circuit 45 uses the first shift parameter to read the data 512 and 532 from the MMLs 51 and 53 belonging to the first group. The shift control circuit 42 and the read control circuit 45 uses the second shift parameter to read the data 522 from the MML 52 belonging to the second group. The shift control circuit 42 and the read control circuit 45 uses the third shift parameter to read the data 542 from the MML 54 belonging to the third group.

The shift control circuit 42 may select one or more MMLs from the MMLs 51, 52, 53, and 54 and apply a specific shift pulse to the selected MMLs. In addition, the shift control circuit 42 may apply different shift pulses to the MMLs 51, 52, 53, and 54 in parallel. The shift control circuit 42 may control applications of the shift pulses to the MMLs in parallel, using the switch circuit and the like.

In the example illustrated in FIG. 11, for example, the shift control circuit 42 may control to apply the first shift pulse 61 to the MMLs 51 and 53 belonging to the first group, to apply the second shift pulse 62 to the MML 52 belonging to the second group, and to apply the third shift pulse 63 to the MML 54 belonging to the third group. The shift control circuit 42 may apply the first shift pulse 61, the second shift pulse 62, and the third shift pulse 63 to the respective MMLs 51, 52, 53, and 54 in parallel (or simultaneously). The shift control circuit 42 repeats the application of the shift pulses 61, 62, and 63 until all of the data 512, 522, 532, and 542 are read from the MMLs 51, 52, 53, and 54.

The read control circuit 45 acquires the data 512, 522, 532, and 542 output from the respective MMLs 51, 52, 53, and 54 upon the application of the first shift pulse 61, the second shift pulse 62, and the third shift pulse 63, via the sense latches in the output unit group 44.

Upon completion of reading of the data 512, 522, 532, and 542, each of the MML 51, 52, 53, and 54 becomes in a state in which each of the RMs 513, 523, 533, and 543 is stored in one or more layers successive from the last layer. The shift control circuit 42 uses the RMs 513, 523, 533, and 543 when executing shift trimming for this block next time. Each of the RMs 513, 523, 533, and 543 may have a size corresponding to all layers of the MML.

According to the above-described read operation in the magnetic domain wall shift memory 3, the data 512, 522, 532, and 542 can be read by using the shift parameters suitable for the respective MMLs 51, 52, 53, and 54. In addition, each of the MMLs 51, 52, 53, and 54 in which the read operation is completed stores each of the RMs 513, 523, 533, and 543 for next shift trimming. In other words, the block including the MMLs 51, 52, 53, and 54 in which the read operation is completed is an applicable block of shift trimming.

Figure 12:
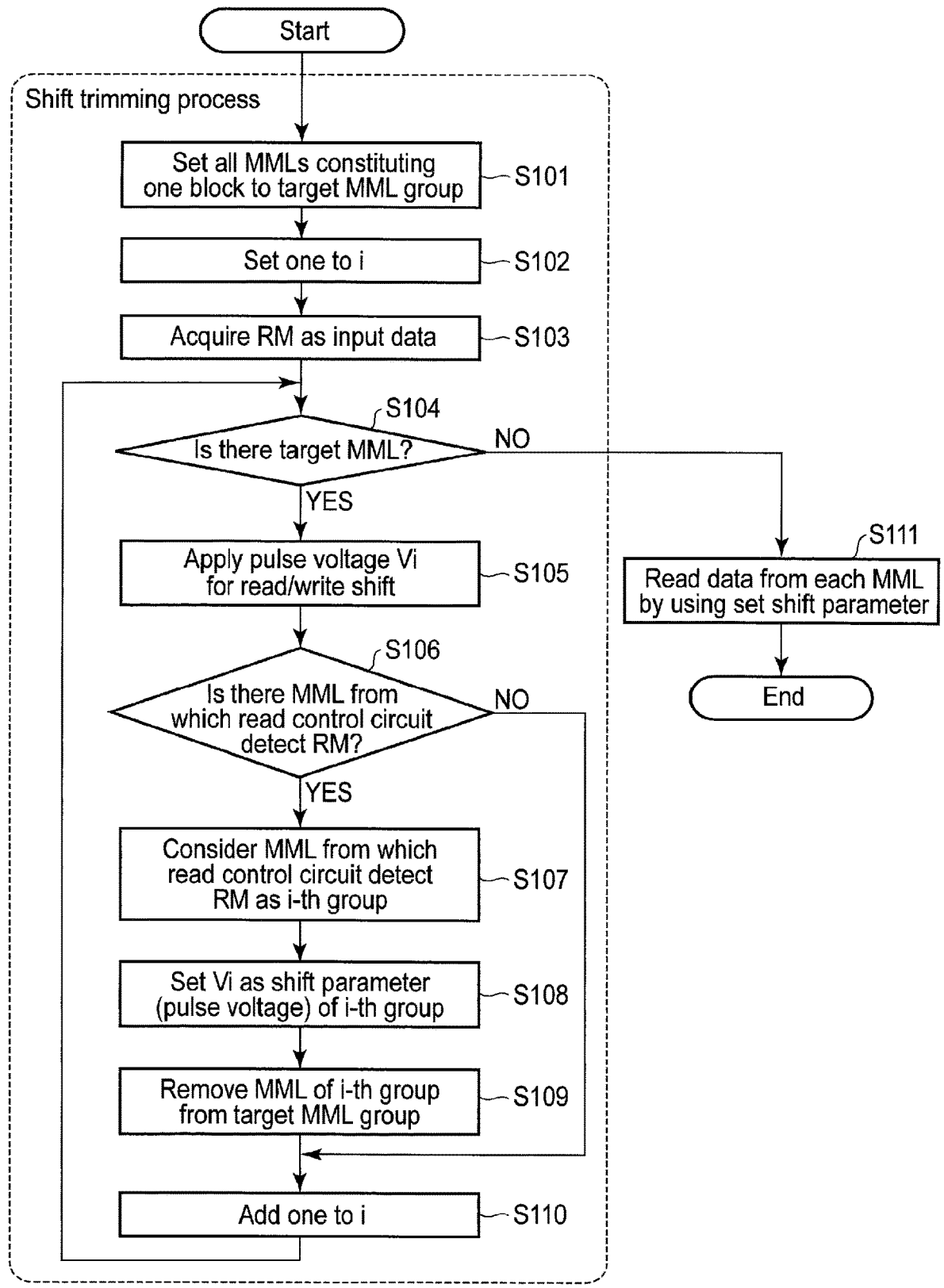
FIG. 12 is a flowchart illustrating a first example of the procedure of a read process including a shift trimming process that is executed in the magnetic domain wall shift memory in the first-in first-out method.

FIG. 12 is a flowchart illustrating a first example of the procedure of a read process including a shift trimming process that is executed in the magnetic domain wall shift memory 3 in the first-in first-out method. It is assumed here that one read target block is specified. Each MML constituting the read target block is an MML to which shift trimming is applicable. That is, each MML stores an RM in one or more layers successive from the last layer.

The shift control circuit 42 sets all the MMLs constituting the read target block to a shift trimming target MML group (step S101). The shift control circuit 42 sets one to a variable i (step S102). The write control circuit 43 acquires input data to each MML that is an RM, and sets the data in the input unit group 41 (step S103).

Then, the shift control circuit 42 determines whether there is an MML of shift trimming target (step S104). That is, the shift control circuit 42 determines whether the target MML group includes an MML. When there is an MML of shift trimming target (YES in step S104), the shift control circuit 42 applies a pulse voltage Vi for read/write shift to the target MML group (step S105). The number of times the shift control circuit 42 applies the pulse voltage Vi corresponds to the number of layers of the RM. In each MML that has been read/write shifted upon the application of the pulse voltage Vi, an RM has been read via a sense latch in the output unit group 44 by the read control circuit 45, and the RM set in the input unit group 41 has been written. In contrast, in each MML that has not been read/write shifted upon the application of the pulse voltage Vi, no RM is read or written. The pulse voltage Vi is larger as the variable i is larger. For example, the pulse voltage Vi increases by a specific value as the variable i increases by one.

The shift control circuit 42 determines whether there is an MML from which an RM has been detected by the read control circuit 45 upon the application of the pulse voltage Vi (step S106). When there is an MML from which an RM has been detected (YES in step S106), the shift control circuit 42 considers the MML as an i-th group (step S107). The shift control circuit 42 sets the pulse voltage Vi as a shift parameter of the i-th group (step S108). That is, the shift control circuit 42 determines the pulse voltage Vi to be applied to each MML that belongs to the i-th group. Then, the shift control circuit 42 removes the MML belonging to the i-th group from the target MML group (step S109).

In contrast, when there is no MML from which an RM has been detected (NO in step S106), the procedure from step S107 to step S109 is skipped.

Then, the shift control circuit 42 adds one to the variable i (step S110), returns to step S104, and performs shift trimming for the target MML group using a new pulse voltage Vi.

In addition, when there is no MML of the shift trimming target (NO in step S104), the shift control circuit 42 and the read control circuit 45 read data from each MML in the read target block, by using the shift parameter set for each group (i.e., set for each MML belonging to each group) (step S111). More specifically, the shift control circuit 42 applies the pulse voltage set for each group to each MML, for read shift. The read control circuit 45 reads data output from each of the MMLs upon the application of this pulse voltage, via the sense latch in the output unit group 44.

The procedure from step S101 to step S110 is a shift trimming process for determining a shift parameter suitable for each MML.

According to the above-described read process in the magnetic domain wall shift memory 3, the data can be read from the read target block by using the shift parameters suitable for the respective MMLs. In addition, new RMs used when the shift trimming process are next performed can be stored in the read target block after reading.

FIG. 13 is a flowchart illustrating a first example of the procedure of a read process that is executed in the memory system 1.

When receiving, for example, a read request from the host 4, the memory controller 2 in the memory system 1 specifies a read target block by using the LUT 231 (step S201). The memory controller 2 requests reading of the specified read target block from the magnetic domain wall shift memory 3 (step S202).

In response to this request, the magnetic domain wall shift memory 3 performs shift trimming process on the read target block (step S203). The shift trimming process has been described above with reference to the flowchart of FIG. 12. The magnetic domain wall shift memory 3, using the shift parameter set in the shift trimming process, reads data from the read target block (step S204) and returns the read data to the memory controller 2 (step S205).

The memory controller 2 receives the read data returned by the magnetic domain wall shift memory 3 (step S206). The memory controller 2 performs an error correction process on the read data (step S207). The error correction process is, for example, an error correction process using an ECC in the read data.

When the error correction process is successful (YES in step S208), the memory controller 2 returns the data on which the error correction process has been performed to the host 4 (step S209). In contrast, when the error correction process is unsuccessful (NO in step S208), the memory controller 2 returns a read error status, which indicates that the requested reading of data is unsuccessful, to the host 4 (step S210).

According to the above-described read process, the memory system 1 can read data from the magnetic domain wall shift memory 3 by using the shift parameter suitable for each MML, when executing the process upon the read request from the host 4.

Figure 14:
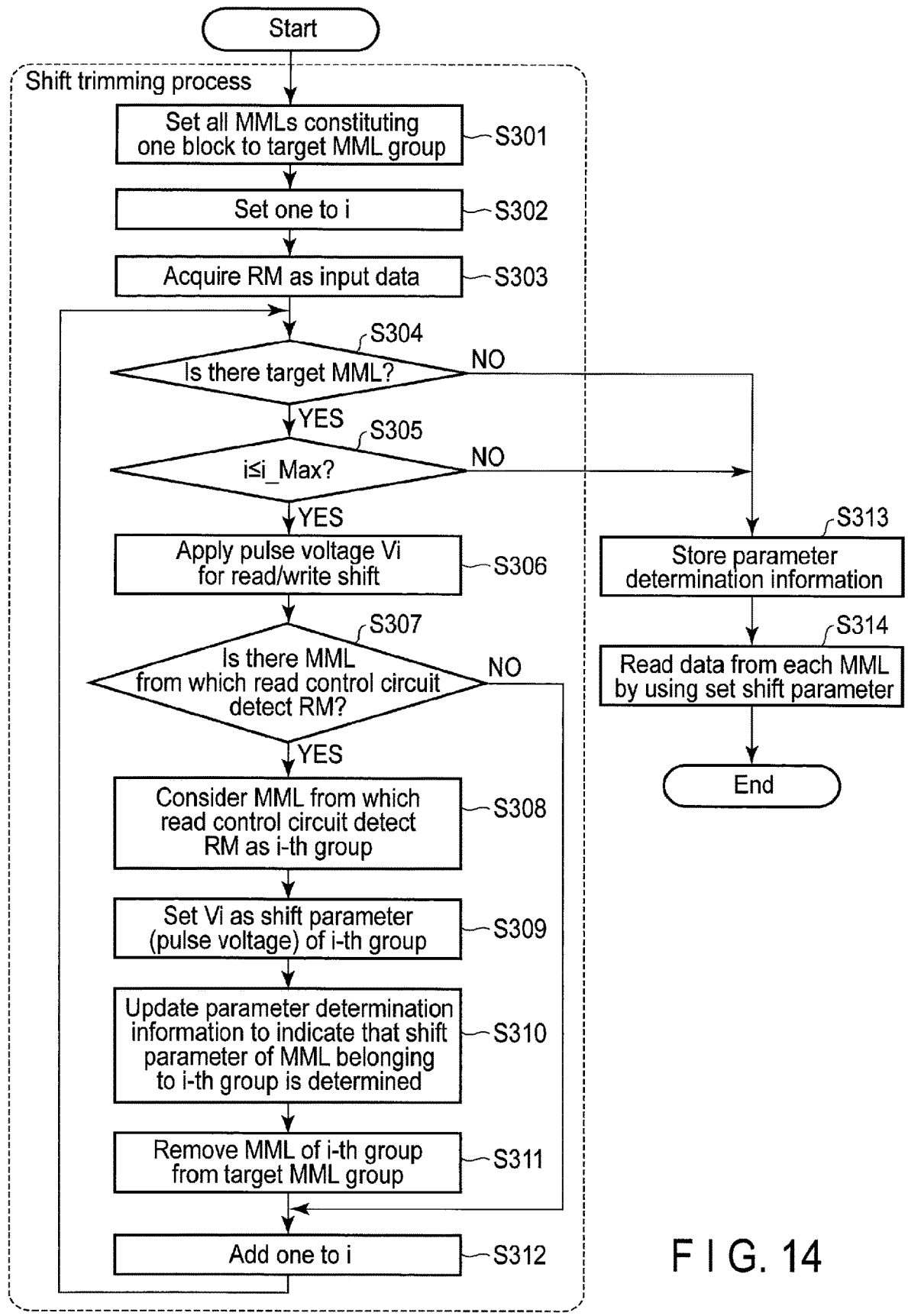
FIG. 14 is a flowchart illustrating a second example of the procedure of a read process including a shift trimming process that is executed in the magnetic domain wall shift memory in the first-in first-out method.

FIG. 14 is a flowchart illustrating a second example of the procedure of a read process including a shift trimming process that is executed in the magnetic domain wall shift memory 3 in the first-in first-out method. In the shift trimming process included in this read process, parameter determination information indicating whether a shift parameter of each MML has been determined is generated.

The procedure from step S301 to step S304 is the same as the procedure from step S101 to step S104 of the read process described above with reference to FIG. 12.

When there is an MML of the shift trimming target (YES in step S304), the shift control circuit 42 determines whether the variable i is lower than or equal to an upper limit i_Max or not (step S305). The upper limit i_Max is indicative of an upper limit of the number of times the process for retrieving the shift parameter for each MML is repeated. That is, i_Max shift parameters at most are attempted to retrieve the shift parameter suitable for each MML. The shift control circuit 42 can be prevented from retrieving the shift parameter infinitely by setting the upper limit i_Max.

When the variable i is lower than or equal to the upper limit i_Max (YES in step S305), the shift control circuit 42 applies a pulse voltage Vi for read/write shift to the target MML group (step S306). The number of times the shift control circuit 42 applies the pulse voltage Vi corresponds to the number of layers of the RM. The shift control circuit 42 determines whether there is an MML from which an RM has been detected by the read control circuit 45 upon the application of the pulse voltage Vi (step S307). When there is an MML from which an RM has been detected (YES in step S307), the shift control circuit 42 considers the MML as an i-th group (step S308). The shift control circuit 42 sets the pulse voltage Vi as the shift parameter of the i-th group (step S309).

The shift control circuit 42 updates parameter determination information so as to indicate that the shift parameter of each MML belonging to the i-th group has been determined (step S310). The shift control circuit 42 generates, for example, the parameter determination information indicating that the shift parameter of each MML has not been determined, at the start of the read process. The parameter determination information includes a bit string in which values to indicate that the shift parameters of MMLs have not been determined are arranged (for example, "000 . . . 0"). In this case, the shift control circuit 42 updates the parameter determination information so as to indicate that the shift parameter of each MML belonging to the i-th group has been determined, upon setting the shift parameter of the i-th group. The shift control circuit 42 varies the value of the bit corresponding to each MML belonging to the i-th group, of the bit string included in the parameter determination information, for example, from '0' indicative of being undetermined to '1' indicative of being determined.

Then, the shift control circuit 42 removes the MML belonging to the i-th group from the target MML group (step S311).

In contrast, when there is no MML from which an RM has been detected (NO in step S307), the procedure from step S308 to S311 is skipped.

Then, the shift control circuit 42 adds one to variable i (step S312) and returns to step S304. Thus, shift trimming using a new pulse voltage Vi is performed for the target MML group while the variable i does not exceed the upper limit i_Max of the number of times the process for retrieving the shift parameter suitable for each MML is repeated.

When there is no MML of the shift trimming target (NO in step S304) or when the variable i exceeds the upper limit i_Max (NO in step S305), the shift control circuit 42 stores the final parameter determination information (step S313). The shift control circuit 42 and the read control circuit 45 read data from each MML in the read target block by using the shift parameter set for each group (step S314). The shift control circuit 42 and the read control circuit 45 may use a specific shift parameter to read data from an MML for which a shift parameter has not been determined. The specific shift parameter may be a predetermined shift parameter or a shift parameter determined by a previous shift trimming process executed prior to the shift trimming process.

The procedure from step S301 to step S312 is the shift trimming process for determining the shift parameter suitable for each MML.

According to the above-described read process in the magnetic domain wall shift memory 3, the data can be read from the read target block by using the shift parameters suitable for the respective MMLs. In addition, the parameter determination information, which indicates whether the shift parameter suitable for each MML has been determined, can be acquired in the retrieval using the shift parameter in a specific range (for example, i_Max pulse voltages from the pulse voltage V1 to Vi_Max). The parameter determination information may be used in, for example, an error correction process of read data executed by the memory controller 2 as described later. In addition, new RMs used when the shift trimming process is next executed can be stored in the read target block after reading.

FIG. 15 is a flowchart illustrating a second example of the procedure of a read process that is executed in the memory system 1. In the read process, parameter determination information, which indicates whether a shift parameter of each MML has been determined, is used.

The procedure of step S401 and step S402 is the same as the procedure of step S201 and step S202 of the read process described above with reference to FIG. 13.

In response to a request by the memory controller 2, the magnetic domain wall shift memory 3 executes a shift trimming process for a read target block (step S403). The shift trimming process has been described above with reference to the flowchart of FIG. 14. The magnetic domain wall shift memory 3 stores the final parameter determination information obtained by the shift trimming process (step S404). The magnetic domain wall shift memory 3 reads, using the shift parameter set in the shift trimming process, data from the read target block (step S405) and returns the parameter determination information and the read data to the memory controller 2 (step S406).

The memory controller 2 receives the parameter determination information and the read data returned by the magnetic domain wall shift memory 3 (step S407). The memory controller 2 performs an error correction process on the read data using the parameter determination information (step S408). More specifically, the memory controller 2 uses the parameter determination information to discriminate between the MML for which the shift parameter has been determined and the MML for which the shift parameter has not been determined. The memory controller 2 performs the error correction process on the read data using, for example, the fact that the read data read from the MML for which the shift parameter is determined has high reliability and that the read data read from the MML for which the shift parameter is undetermined has low reliability.

The procedure from step S409 to step S411 is the same as the procedure from step S208 to step S210 of the read process described above with reference to FIG. 13.

According to the above-described read process, the memory system 1 can read data from the magnetic domain wall shift memory 3 by using the shift parameter suitable for each MML, when executing the process corresponding to the read request from the host 4. In addition, the memory system 1 can improve the accuracy in error correction of the read data, using the parameter determination information indicating whether the shift parameter suitable for each MML has been determined.

Figure 16:
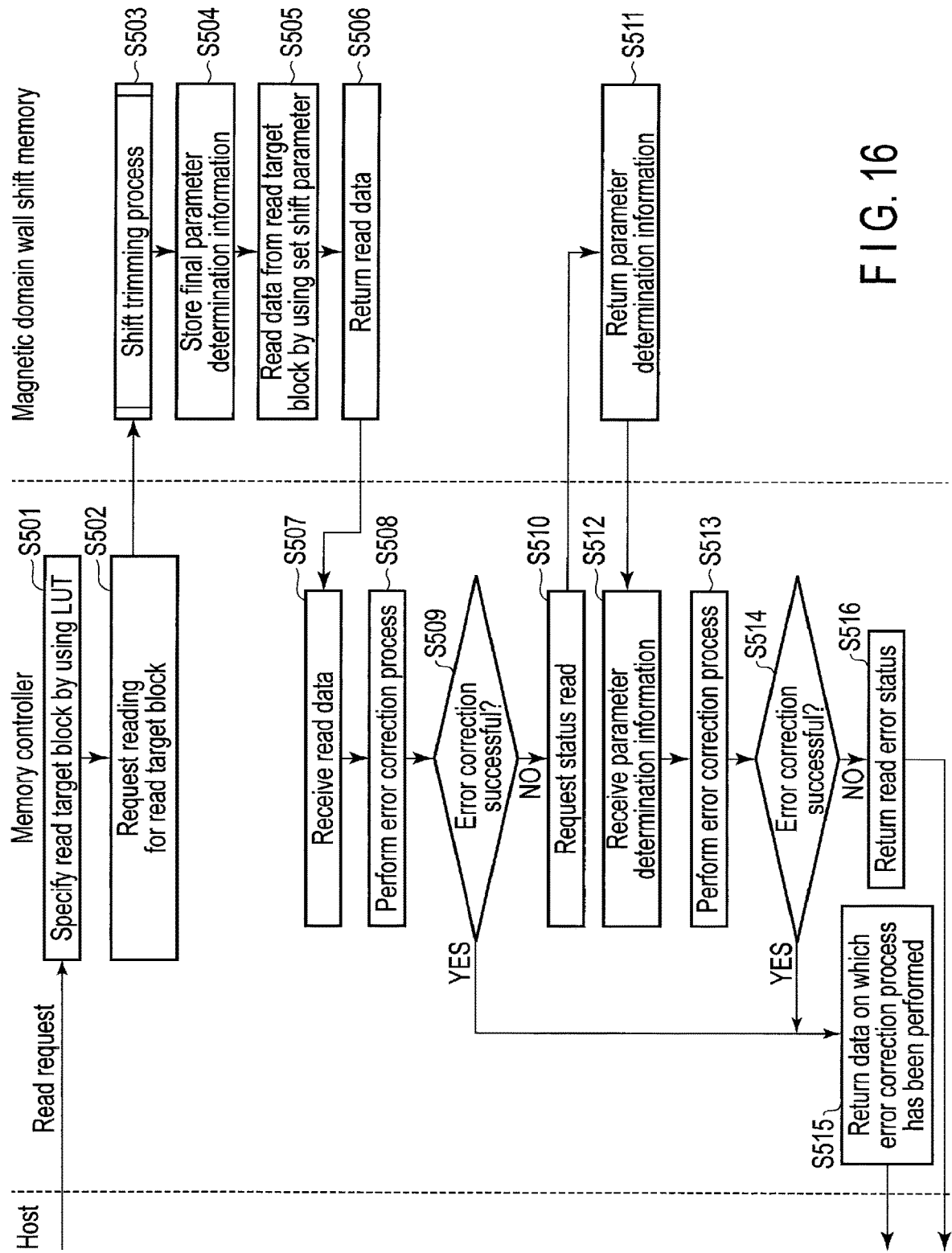
FIG. 16 is a flowchart illustrating a third example of the procedure of a read process that is executed in the memory system of the embodiment.

FIG. 16 is a flowchart illustrating a third example of the procedure of a read process that is executed in the memory system 1. In this read process, the parameter determination information indicating whether the shift parameter suitable for each MML has been determined is used when the error correction process for the read data executed by the memory controller 2 is unsuccessful.

The procedure from step S501 to step S505 is the same as the procedure from step S401 to step S404 of the read process described above with reference to FIG. 15.

After reading data from a read target block, the magnetic domain wall shift memory 3 returns the read data to the memory controller 2 (step S506).

The memory controller 2 receives the read data returned by the magnetic domain wall shift memory 3 (step S507). The memory controller 2 performs an error correction process on the read data (step S508). When the error correction process is successful (YES in step S509), the memory controller 2 returns the data on which the error correction process has been performed, to the host 4 (step S515).

When the error correction process is unsuccessful (NO in step S509), the memory controller 2 requests status read from the magnetic domain wall shift memory (step S510). In response to the request by the host 4, the magnetic domain wall shift memory 3 returns the parameter determination information to the host 4 (step S511).

The memory controller 2 performs the error correction process on the read data again, using the parameter determination information returned by the magnetic domain wall shift memory 3 (step S513). When the error correction process is successful (YES in step S514), the memory controller 2 returns the data on which the error correction has been performed, to the host 4 (step S515). When the error correction process is unsuccessful (NO in step S514), the memory controller 2 returns a read error status indicates that the requested reading of data is unsuccessful, to the host 4 (step S516).

According to the above-described read process, the memory system 1 can read data from the magnetic domain wall shift memory 3 by using the shift parameter suitable for each MML, when executing the process corresponding to the read request from the host 4. In addition, when the error correction process of the read data is unsuccessful, the memory system can improve the accuracy in error correction of the read data, using the parameter determination information indicating whether the shift parameter suitable for each MML has been determined.

<Write Operation Including Shift Trimming>

Figure 17:
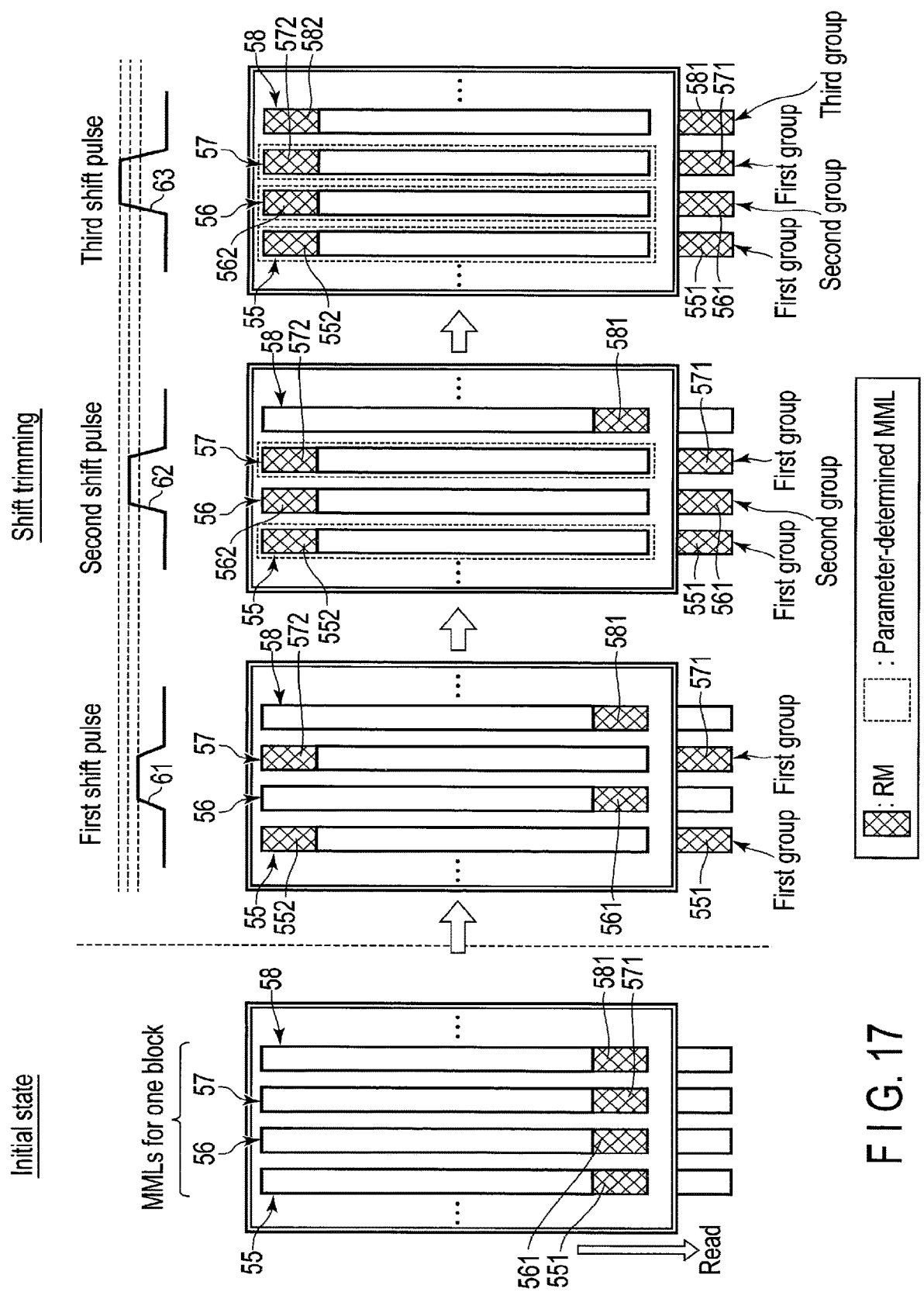
FIG. 17 is a diagram illustrating a first example of a write operation including shift trimming for a block.
Figure 18:
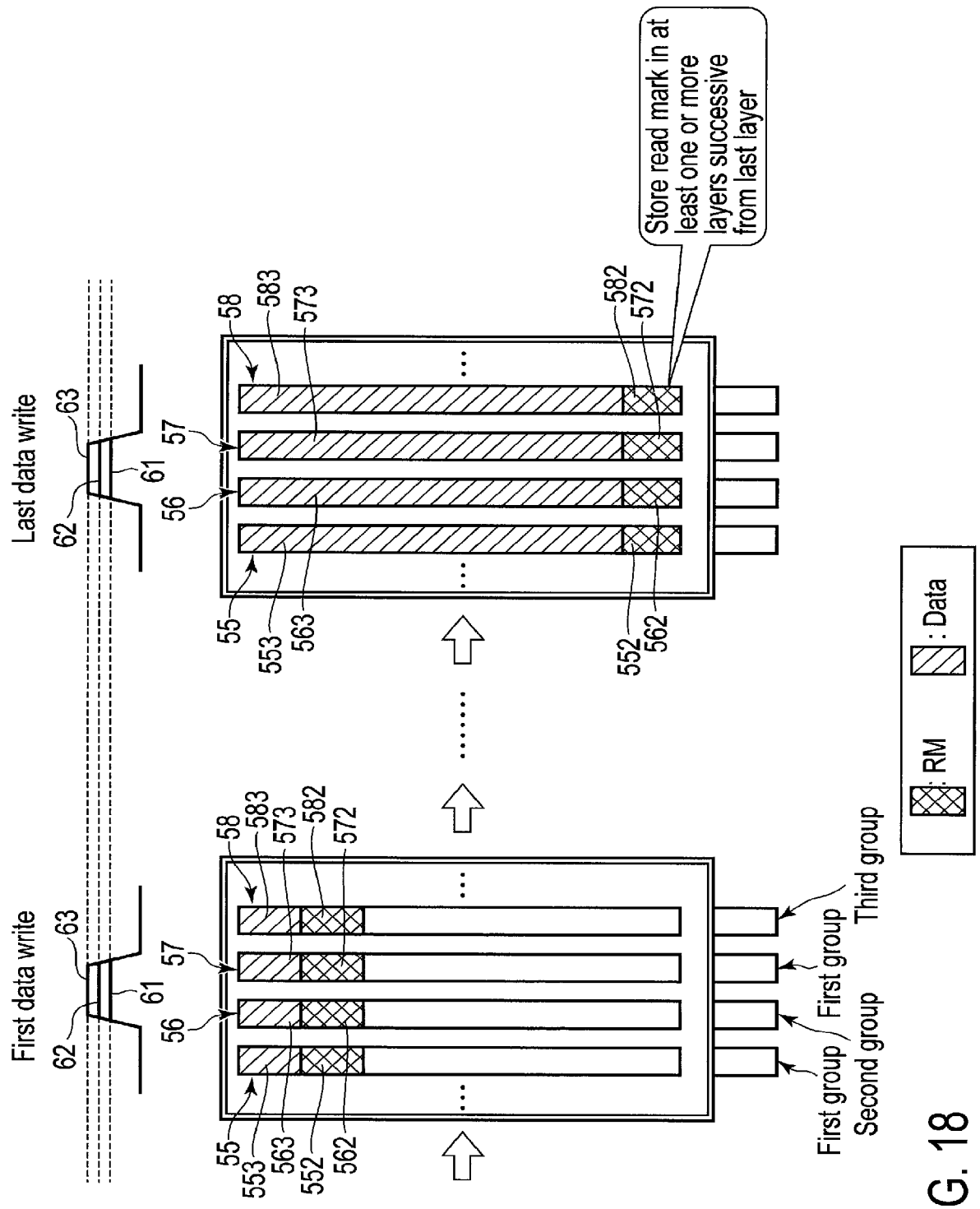
FIG. 18 is a diagram illustrating an example of the write operation subsequent to FIG. 17.

FIGS. 17 and 18 illustrate a first example of a write operation including shift trimming for a block. An example that the block is composed of four MMLs 55, 56, 57, and 58 will be described, but the block may include any number of MMLs.

As illustrated in FIG. 17, the block in an initial state is a block to which the shift trimming is applicable. That is, the MML 55 stores an RM 551 in one or more layers successive from the last layer, of layers included in the MML 55. The MML 56 stores an RM 561 in one or more layers successive from the last layer, of layers included in the MML 56. The MML 57 stores an RM 571 in one or more layers successive from the last layer, of layers included in the MML 57. The MML 58 stores an RM 581 in one or more layers successive from the last layer, of layers included in the MML 58.

In addition, the MML 55 does not store valid data in layers higher than the layer in which the RM 551 is stored. The MML 56 does not store valid data in layers higher than the layer in which the RM 561 is stored. The MML 57 does not store valid data in layers higher than the layer in which the RM 571 is stored. The MML 58 does not store valid data in layers higher than the layer in which the RM 581 is stored.

The shift control circuit 42 and the read control circuit 45 execute shift trimming for the block of the initial state. More specifically, the shift control circuit 42 first applies a first shift pulse 61 to all the MMLs 55, 56, 57, and 58 for read/write shift, using an RM as input data to each of the MMLs 55, 56, 57, and 58. The number of times the first shift pulse 61 is applied corresponds to the number of layers of the RM.

The read control circuit 45 detects the RMs 551 and 571 from read data that is read via sense latches in the output unit group 44 upon the application of the first shift pulse 61. The shift control circuit 42 generates a first group including the MMLs 55 and 57 in which the detected RMs 551 and 571 were stored respectively. The shift control circuit 42 sets a first shift parameter indicative of the first shift pulse 61 for the first group. The first shift parameter includes, for example, the voltage value of the first shift pulse 61.

The first shift parameter suitable for the MMLs 55 and 57 belonging to the first group is thereby determined. In the MMLs 55 and 57 belonging to the first group, the RMs 551 and 571 have been read and the RMs 552 and 572 set as the input data have been written, by the read/write shift.

Next, the shift control circuit 42 and the read control circuit 45 execute shift trimming for the remaining MMLs 56 and 58 excluding the MMLs 55 and 57 belonging to the first group (i.e., the parameter-determined MMLs). The shift control circuit 42 applies a second shift pulse 62 to the MMLs 56 and 58 for read/write shift, using an RM as input data to each of the MMLs 56 and 58. The number of times the second shift pulse 62 is applied corresponds to the number of layers of the RM. The second shift pulse 62 is different from the first shift pulse 61. The second shift pulse 62 is, for example, a shift pulse having a voltage higher than the first shift pulse 61.

The read control circuit 45 detects the RM 561 from read data that is read via a sense latch in the output unit group 44 upon application of the second shift pulse 62. The shift control circuit 42 generates a second group including the MML 56 in which the detected RM 561 was stored. The shift control circuit 42 sets a second shift parameter indicative of the second shift pulse 62 for the second group. The second shift parameter includes, for example, the voltage value of the second shift pulse 62.

The second shift parameter suitable for the MML 56 belonging to the second group is thereby determined. In the MML 56 belonging to the second group, the RM 561 has been read and the RM 562 set as the input data has been written, by the read/write shift.

Next, the shift control circuit 42 and the read control circuit 45 execute shift trimming for the remaining MML 58 further excluding the MML 56 that belongs to the second group. The shift control circuit 42 applies a third shift pulse 63 for read/write shift to the MML 58, using an RM as input data to the MML 58. The number of times the third shift pulse 63 is applied corresponds to the number of layers of the RM. The third shift pulse 63 is different from the first shift pulse 61 and the second shift pulse 62. The third shift pulse 63 is, for example, a shift pulse having a voltage higher than the second shift pulse 62.

The read control circuit 45 detects the RM 581 from read data that is read via a sense latch in the output unit group 44 upon application of the third shift pulse 63. The shift control circuit 42 generates a third group including the MML 58 in which the detected RM 581 was stored. The shift control circuit 42 sets a third shift parameter indicative of the third shift pulse 63 for the third group. The third shift parameter includes, for example, the voltage value of the third shift pulse 63.

The third shift parameter suitable for the MML 58 belonging to the third group is thereby determined. In the MML 58 belonging to the third group, the RM 581 has been read and the RM 582 set as the input data has been written, by the read/write shift.

Then, as illustrated in FIG. 18, the shift control circuit 42 and the write control circuit 43 write data portions 553, 563, 573, and 583 into the MMLs 55, 56, 57, and 58, respectively, using the shift parameters set for the respective groups. That is, the shift control circuit 42 and the write control circuit 43 write the write data portions 553 and 573 into the MMLs 55 and 57, respectively, which belong to the first group, by using the first shift parameter. The shift control circuit 42 and the write control circuit 43 write the write data portion 563 into the MML 56 belonging to the second group, by using the second shift parameter. The shift control circuit 42 and the write control circuit 43 write the write data portion 583 into the MML 58 belonging to the third group, by using the third shift parameter.

As described above, the shift control circuit 42 may select one or more MMLs from the MMLs 55, 56, 57, and 58 and apply a specific shift pulse to the selected MMLs. In addition, the shift control circuit 42 may apply different shift pulses to the MMLs 55, 56, 57, and 58 in parallel.

In the example illustrated in FIG. 18, for example, the shift control circuit 42 may control to apply the first shift pulse 61 to the MMLs 55 and 57 belonging to the first group, to apply the second shift pulse 62 to the MML 56 belonging to the second group, and to apply the third shift pulse 63 to the MML 58 belonging to the third group, by using the write data portions 553, 563, 573, and 583 as the input data. The shift control circuit 42 may apply the first shift pulse 61, the second shift pulse 62, and the third shift pulse 63 to the respective MMLs 55, 56, 57, and 58 in parallel (or simultaneously). The shift control circuit 42 repeats the application of the shift pulses 61, 62, and 63 until all of the write data portions 553, 563, 573, and 583 are written into the MMLs 55, 56, 57, and 58.

Upon completion of writing of the write data portions 553, 563, 573, and 583, each of the MMLs 55, 56, 57, and 58 becomes in a state in which each of the RMs 552, 562, 572, and 582 is stored in one or more layers successive from the last layer. The shift control circuit 42 uses the RMs 552, 562, 572, and 582 when executing the shift trimming for this block next time.

According to the above-described write process in the magnetic domain wall shift memory 3, the write data portions 553, 563, 573, and 583 can be written by using the shift parameters suitable for the respective MMLs 55, 56, 57, and 58. In addition, each of the MMLs 55, 56, 57, and 58 in which the write operation is completed stores each of the RMs 552, 562, 572, and 582 for next shift trimming. In other words, the block including the MMLs 55, 56, 57, and 58 in which the write operation is completed is a block to which shift trimming is applicable.

The writing of the RMs 552, 562, 572, and 582 do not need to be executed parallel to the reading of the RMs 551, 561, 571, and 581, but may be executed after the shift parameter suitable for each MML has been determined. In this case, the shift control circuit 42 and the write control circuit 43 write the RMs 552, 562, 572, and 582 and the write data portions 553, 563, 573, and 583 in sequence, after the shift parameter suitable for each MML has been determined.

Figure 19:
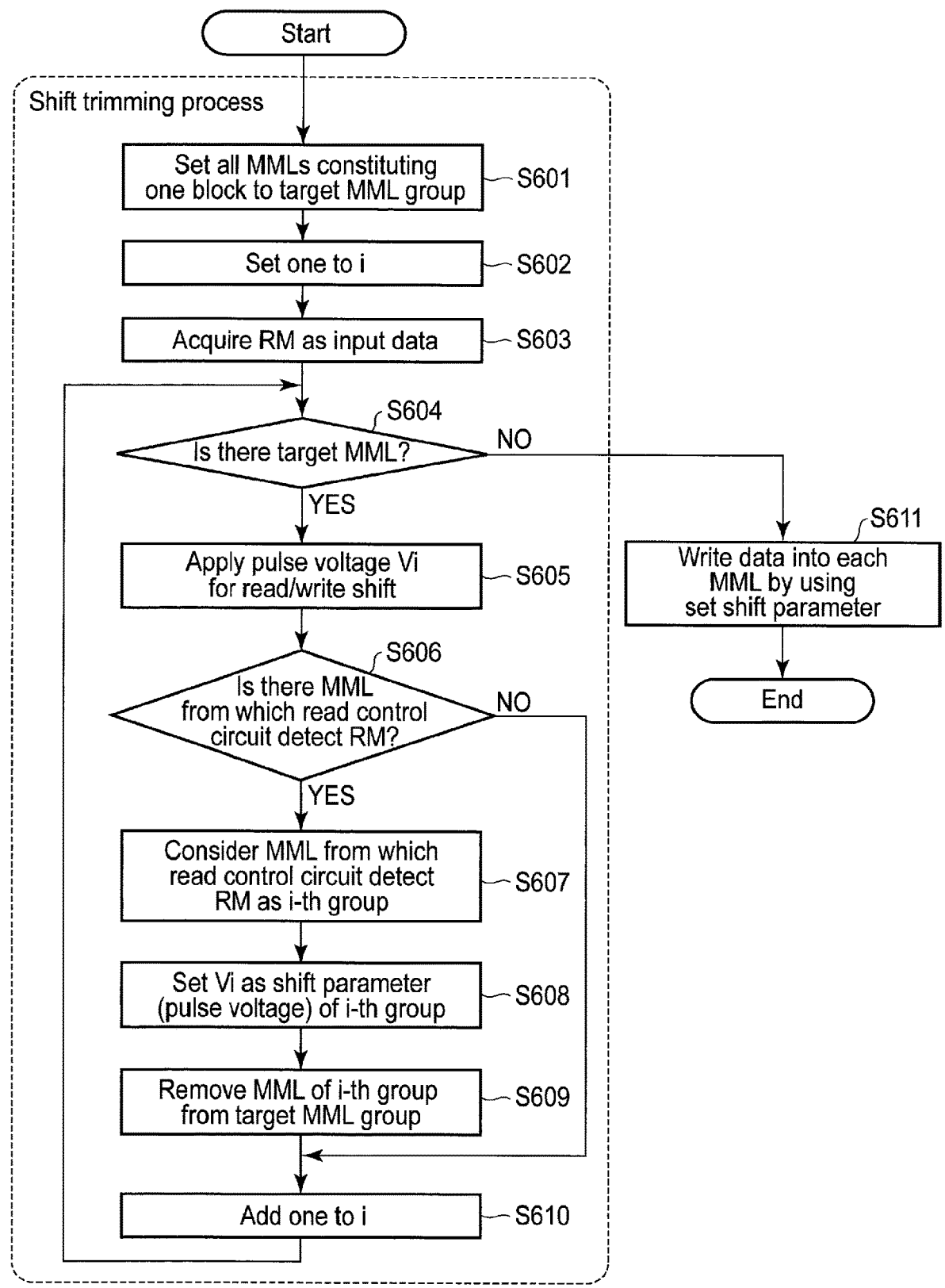
FIG. 19 is a flowchart illustrating a first example of the procedure of a write process including a shift trimming process that is executed in the magnetic domain wall shift memory in the first-in first-out method.

FIG. 19 is a flowchart illustrating a first example of the procedure of a write process including a shift trimming process that is executed in the magnetic domain wall shift memory 3 in the first-in first-out method. It is assumed here that one write target block is determined. Each MML constituting the write target block is an MML to which shift trimming is applicable. That is, each MML stores an RM in one or more layers successive from the last layer.

The procedure of the shift trimming process from step S601 to step S610 is the same as the procedure of the shift trimming process from step S101 to step S110 described above with reference to the flowchart of FIG. 12, and the read target block is merely replaced with the write target block.

When there is an MML of the shift trimming target (NO in step S604), i.e., when the shift parameters suitable for all the MMLs included in the write target block have been determined, the shift control circuit 42 and the write control circuit 43 write a write data portion to each MML in the write target block, by using the shift parameter set for each group (i.e., set for the MML belonging to each group) (step S611). More specifically, the write control circuit 43 sets the write data portion in the input unit group 41, and the shift control circuit 42 applies the pulse voltage set for each group to each MML, for write shift. The number of times the pulse voltage is applied corresponds to the number of layers of the write data portion. Upon the application of this pulse voltage, the write data portion set in the input unit group 41 is written into the MML in the write target block.

According to the above-described write process in the magnetic domain wall shift memory 3, the RMs and the write data portions can be written into the write target block by using the shift parameters suitable for the respective MMLs.

Figure 20:
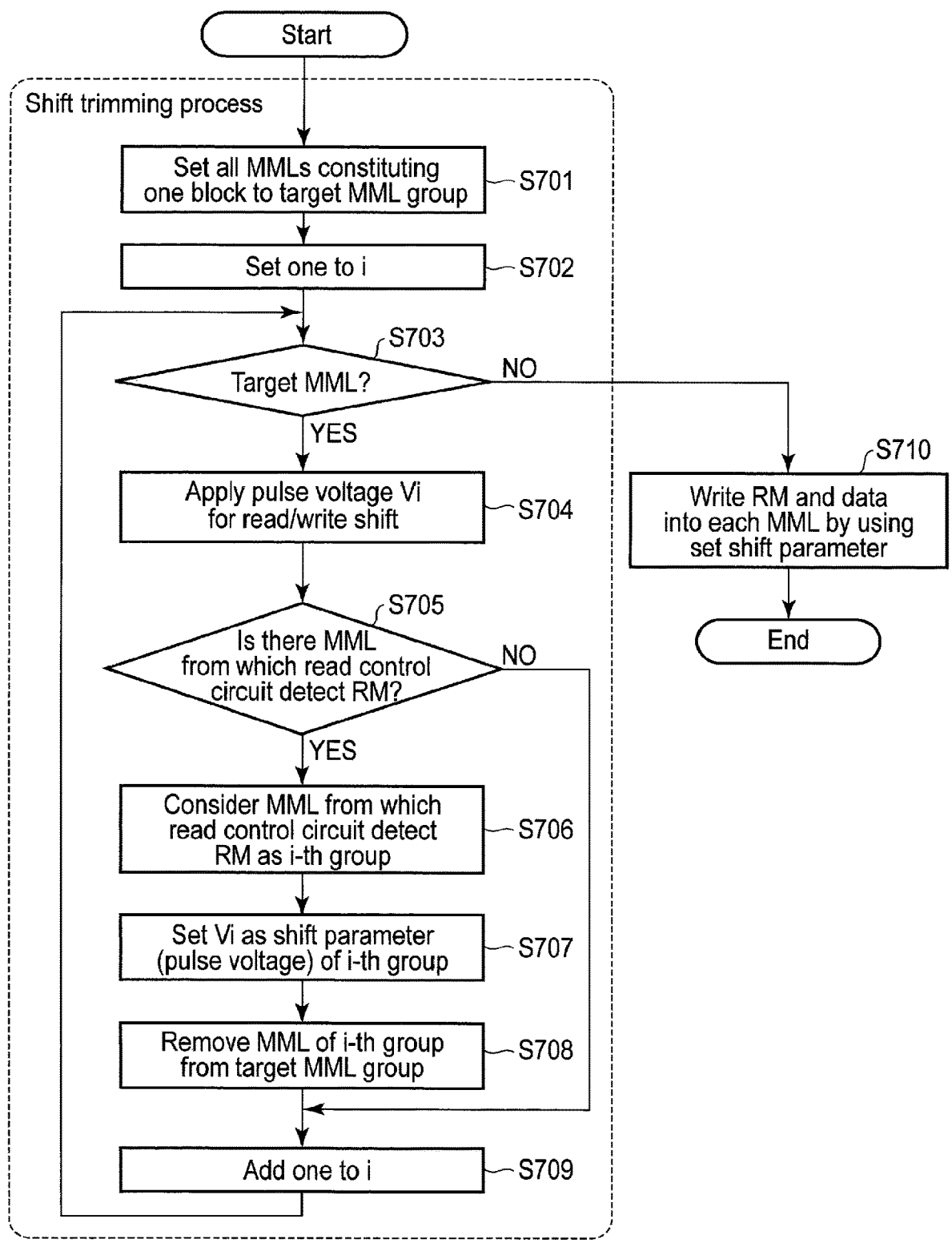
FIG. 20 is a flowchart illustrating a second example of the procedure of a write process including a shift trimming process that is executed in the magnetic domain wall shift memory in the first-in first-out method.

FIG. 20 is a flowchart illustrating a second example of the procedure of a write process including a shift trimming process that is executed in the magnetic domain wall shift memory 3 in the first-in first-out method. In the write process described above with reference to the flowchart of FIG. 19, read/write shift of writing an RM into each MML (i.e., read/write shift using an RM as input data for each MML) in the shift trimming process is executed. In contrast, in the write process illustrated in FIG. 20, only read shift for reading an RM already stored in each MML is executed without writing an RM in the shift trimming process.

The procedure of step S701 and step S702 is the same as the procedure of step S601 and step S602 illustrated in the flowchart of FIG. 19.

Then, the shift control circuit 42 determines whether there is an MML of shift trimming target (step S703). When there is an MML of shift trimming target (YES in step S703), the shift control circuit 42 applies a pulse voltage Vi for read shift to the target MML group (step S704). The number of times the pulse voltage Vi is applied corresponds to the number of layers of the RM. In each MML on which read shift has been performed upon the application of the pulse voltage Vi, the RM is read via a sense latch in the output unit group 44 by the read control circuit 45. In contrast, the RM is not read in each MML on which read shift has not been performed upon the application of the pulse voltage Vi.

The subsequent procedure from step S705 to step S709 is the same as the procedure from step S606 to step S610 illustrated in the flowchart of FIG. 19.

In addition, when there is no MML of shift trimming target (NO in step S703), the shift control circuit 42 and the write control circuit 43 write an RM and a write data portion to each MML in the write target block, by using the shift parameter set for each group (step S710). More specifically, the write control circuit 43 sets an RM in the input unit group 41, and the shift control circuit 42 applies the pulse voltage set for each group to each MML, for write shift. The number of times the pulse voltage is applied corresponds to the number of layers of the RM. Upon the application of this pulse voltage, the RM set in the input unit group 41 is written into the write target block.

Next, the write control circuit 43 sets a write data portion in the input unit group 41, and the shift control circuit 42 applies the pulse voltage set for each group to each MML, for write shift. The number of times the pulse voltage is applied corresponds to the number of layers of the write data portion. Upon the application of this pulse voltage, the write data portion set in the input unit group 41 is written into the write target block.

According to the above-described write process in the magnetic domain wall shift memory 3, the RMs and the write data portions can be written into the write target block by using the shift parameters suitable for the respective MMLs.

FIG. 21 is a flowchart illustrating a first example of the procedure of a write process that is executed in the memory system 1.

When receiving a write request from the host 4, for example, the memory controller 2 in the memory system 1 adds an ECC parity to write data (step S801). The memory controller 2 stores the write data including the ECC parity, in the write buffer 25W (step S802). The memory controller 2 determines a write target block (step S803). The memory controller 2 requests writing for the determined write target block from the magnetic domain wall shift memory 3 (step S804).

In response to this request, the magnetic domain wall shift memory 3 executes a shift trimming process for the write target block (step S805). This shift trimming process corresponds to the shift trimming process described above with reference to the flowchart of FIG. 19 or FIG. 20. The magnetic domain wall shift memory 3 writes the write data stored in the write buffer 25W into the write target block, by using the shift parameter set in the shift trimming process (step S806). When the shift trimming process illustrated in FIG. 20 is executed, the magnetic domain wall shift memory 3 may write an RM into the write target block before writing the write data.

Then, the memory controller 2 updates the LUT 231 so as to indicate mapping between a logical address designated in the write request and a physical address indicative of the write target block into which the write data is written (step S807). The memory controller 2 releases the area in the write buffer 25W in which the write data is stored (step S808).

According to the above-described write process, the memory system 1 can write the write data into the magnetic domain wall shift memory 3 by using the shift parameter suitable for each MML when executing the process responding to the write request from the host 4.

Figure 22:
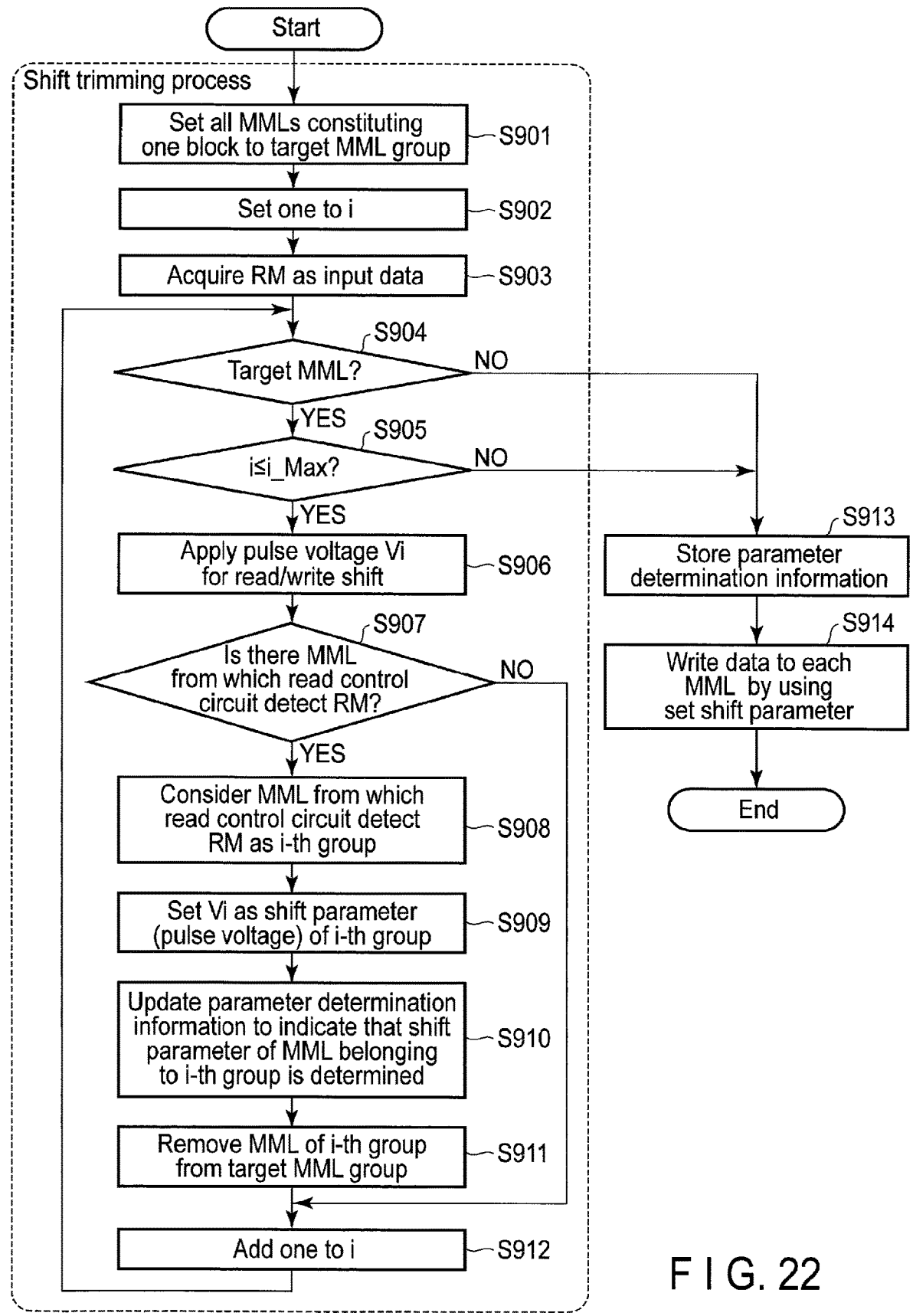
FIG. 22 is a flowchart illustrating a third example of the procedure of a write process including a shift trimming process that is executed in the magnetic domain wall shift memory in the first-in first-out method.

FIG. 22 is a flowchart illustrating a third example of the procedure of a write process including a shift trimming process that is executed in the magnetic domain wall shift memory 3 in the first-in first-out method. In the shift trimming process included in this write process, parameter determination information, which indicates whether a shift parameter for each MML has been determined, is generated.

The procedure of the shift trimming process from step S901 to step S912 is the same as the procedure of the shift trimming process from step S301 to step S312 described above with reference to the flowchart of FIG. 14, and the read target block is merely replaced with a write target block.

When there is an MML of shift trimming target (NO in step S904) or when the variable i exceeds the upper limit i_Max (NO in step S905), the shift control circuit 42 stores the parameter determination information (step S913). The shift control circuit 42 and the write control circuit 43 write a write data portion to each MML into the write target block by using the shift parameter set for each group (step S914). The shift control circuit 42 and the write control circuit 43 may use a specific shift parameter to write a write data portion to an MML for which a shift parameter has not been determined. The specific shift parameter may be a predetermined shift parameter or a shift parameter determined by a previous shift trimming process executed prior to the shift trimming process.

According to the above-described write process in the magnetic domain wall shift memory 3, the RMs and the write data portions can be written to the write target block by using the shift parameters suitable for the respective MMLs. In addition, the parameter determination information, which indicates whether the shift parameter suitable for each MML has been determined, can be acquired in the retrieval using shift parameters in a specific range. The parameter determination information may be used in, for example, determination of success or failure of a write operation executed by the memory controller 2 as described later.

Similarly to the write process illustrated in FIG. 12, the magnetic domain wall shift memory 3 may execute only read shift for reading an RM already stored in each MML without writing an RM in the shift trimming process, and write RMs and write data portions into the write target block after determining the shift parameters.

FIG. 23 is a flowchart illustrating a second example of the procedure of a write process that is executed in the memory system 1. In the write process, parameter determination information, which indicates whether a shift parameter of each MML has been determined, is used.

The procedure from step S1001 to step S1004 is the same as the procedure from step S801 to step S804 described above with reference to the flowchart of FIG. 21.

In response to a request by the memory controller 2, the magnetic domain wall shift memory 3 executes a shift trimming process for the write target block (step S1005). The shift trimming process has been described above with reference to the flowchart of FIG. 22. The magnetic domain wall shift memory 3 stores the final parameter determination information obtained by the shift trimming process (step S1006). The magnetic domain wall shift memory 3 writes the write data stored in the write buffer 25W to the write target block, by using the shift parameter set in the shift trimming process (step S1007).

Then, the memory controller 2 updates the LUT 231 so as to illustrate mapping between a logical address designated in the write request and a physical address indicative of the write target block into which the write data is written (step S1008). The memory controller 2 requests status read from the magnetic domain wall shift memory 3 (step S1009). In response to this request, the magnetic domain wall shift memory 3 returns the parameter determination information to the memory controller 2 (step S1010).

The memory controller 2 determines whether the status concerning the write operation for the write target block is PASS or FAIL, by using the parameter determination information (step S1011). That is, the memory controller 2 determines whether writing of the write data into the write target block is successful, by using the parameter determination information.

More specifically, the memory controller 2, using the parameter determination information, determines that the status is PASS when, for example, the number of MMLs for which the shift parameters have not been determined is less than a threshold value, and determines that the status is FAIL when the number of MMLs for which the shift parameters have not been determined is more than or equal to the threshold value. Alternatively, the memory controller 2, using the parameter determination information, may determine that the status is PASS when, for example, the ratio of MMLs for which the shift parameter has not been determined to all the MMLs in the write target block is less than a threshold value, and may determine that the status is FAIL when the ratio is more than or equal to the threshold value.

When the status is PASS (YES in step S1011), the memory controller 2 releases the area in the write buffer 25W in which the write data is stored (step S1012).

In contrast, when the status is FAIL (NO in step S1011), the memory controller 2 determines another block as a new write target block (step S1013) and returns to step S1004. The write data is thereby written into the new write target block.

According to the above-described write process, the memory system 1 can write data into the magnetic domain wall shift memory 3 by using the shift parameter suitable for each MML when executing the process responding to the write request from the host 4. In addition, the memory system 1 can determine whether writing of the write data into the write target block is successful, by using the parameter determination information indicating whether the shift parameter suitable for each MML is determined.

<Operation for Inapplicable Block of Shift Trimming>

Figure 24:
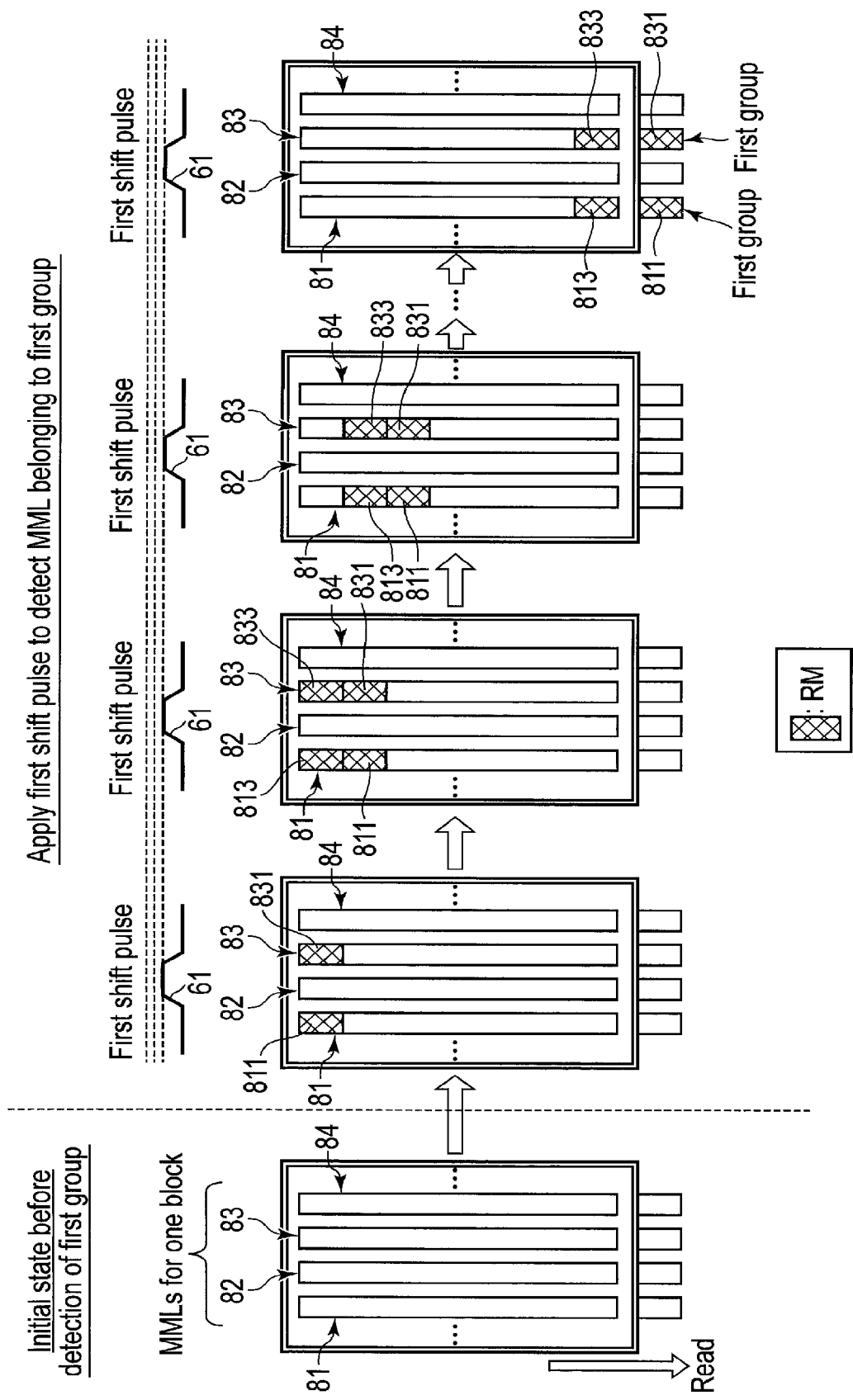
FIG. 24 is a diagram illustrating an example of an operation of making a block to which shift trimming is applicable.
Figure 26:
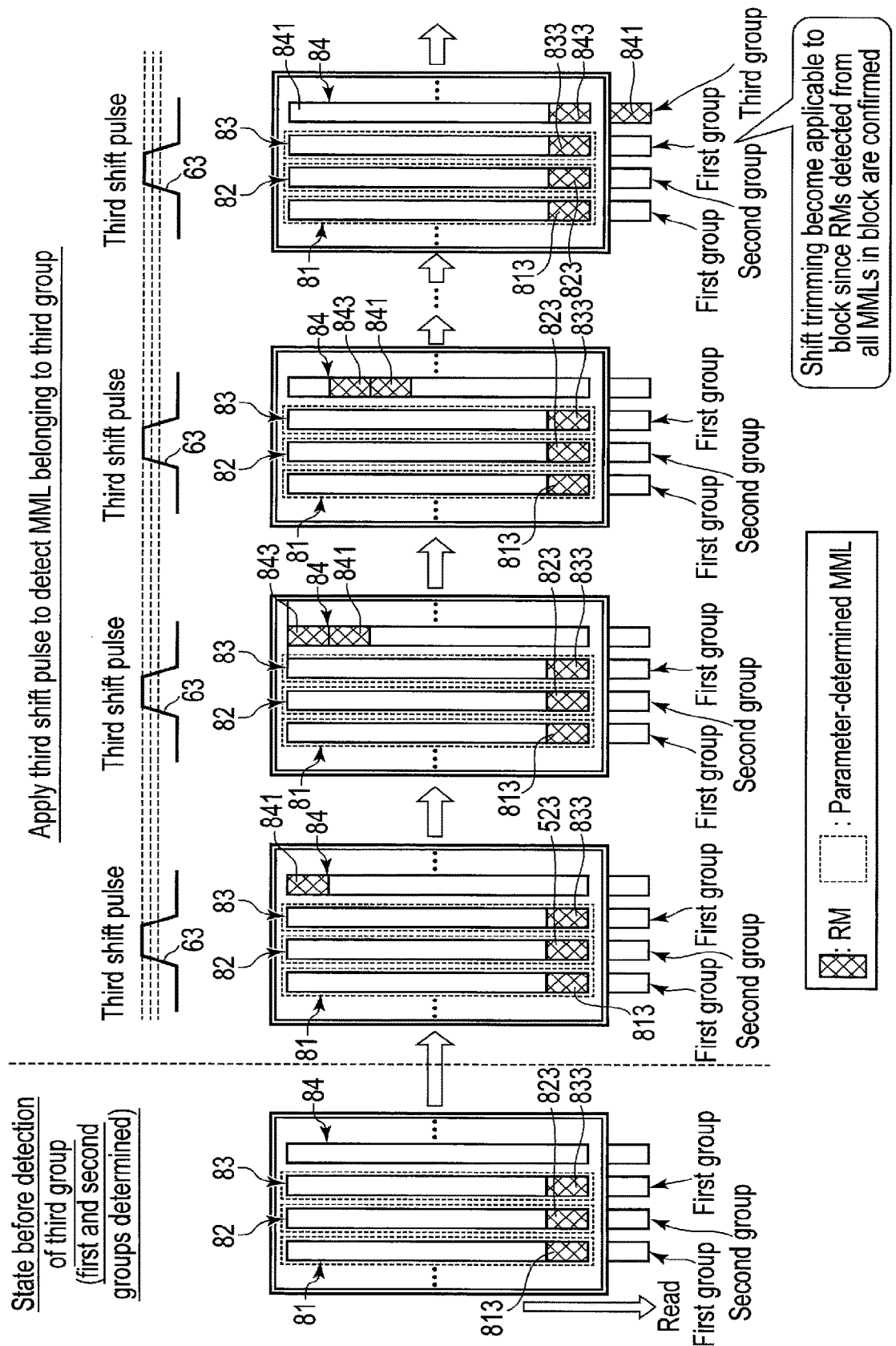
FIG. 26 is a diagram illustrating an example of the operation subsequent to FIG. 25.

FIGS. 24, 25, and 26 illustrate an example of an operation for setting a block to which shift trimming is inapplicable (i.e., inapplicable block of shift trimming) to a block to which shift trimming is applicable (i.e., applicable block of shift trimming). As described above, the inapplicable block of shift trimming is a block that is not guaranteed to store an RM in one or more layers successive from the last layer of layers included in each MML in the block. The inapplicable block of shift trimming is, for example, a block included in the magnetic domain wall shift memory 3 in the memory system 1 immediately after shipment, or a block that does not have an RM stored in one or more layers successive from the last layer of at least one MML due to an error or the like.

An example that the block is composed of four MMLs 81, 82, 83, and 84 will be described, but the block may include any number of MMLs. In addition, the example will describe a case where the four MMLs 81, 82, 83, and 84 are divided into three groups to which different shift parameters are to be applied, respectively.

FIG. 24 illustrates an example of detecting an MML belonging to a first group from a block in an initial state. The first group is a group where an MML to which a first shift pulse 61 is to be applied belong. As illustrated in FIG. 24, the block in an initial state is a free block where no RM or valid data is stored. That is, each of the MMLs 81, 82, 83, and 84 stores no RM or valid data.

The shift control circuit 42 applies the first shift pulse 61 to each of the MMLs 81, 82, 83, and 84 in the block in the initial state, by using two RMs as input data. At this time, the number of times the shift control circuit 42 applies the first shift pulse 61 corresponds to a sum of the number of layers corresponding to one RM and the number of layers included in each MML. The read control circuit 45 reads an RM from an MML shifted upon the application of the first shift pulse 61. The shift control circuit 42 can detect the MML from which the RM has been read, as an MML to which the first shift pulse 61 is to be applied and which belongs to the first group.

More specifically, the shift control circuit 42 first applies the first shift pulse 61 for write shift to all the MMLs 81, 82, 83, and 84 by using a first RM as input data to each of the MMLs 81, 82, 83, and 84. The number of times the first shift pulse 61 is applied corresponds to the number of layers of the RM. To the MMLs 81 and 83 shifted upon the application of the first shift pulse 61, RMs 811 and 831 set as the input data are written, respectively. In contrast, RMs are not written to the MMLs 82 and 84 that are not shifted upon the application of the first shift pulse 61.

Next, the shift control circuit 42 applies the first shift pulse 61 for write shift to all the MMLs 81, 82, 83, and 84 by using a second RM as input data to each of the MMLs 81, 82, 83, and 84. The number of times the shift control circuit 42 applies the first shift pulse 61 corresponds to the number of layers of the RM. To the MMLs 81 and 83 shifted upon the application of the first shift pulse 61, RMs 813 and 833 set as the input data are written, respectively. In contrast, RMs are not written to the MMLs 82 and 84 that are not shifted upon the application of the first shift pulse 61.

Furthermore, the shift control circuit 42 continues the application of the first shift pulse 61 to all the MMLs 81, 82, 83, and 84. More specifically, the number of times the shift control circuit 42 applies the first shift pulse 61 corresponds to the number of times necessary to read the first RM that is first used as the input data, from the MMLs 81, 82, 83, and 84.

The read control circuit 45 reads the RMs 811 and 831 from the MMLs 81 and 83 shifted upon the application of the first shift pulse 61, via sense latches in the output unit group 44. The shift control circuit 42 can detect the MMLs 81 and 83 from which the RMs 811 and 831 has been read, as MMLs to which the first shift pulse 61 is to be applied and which belong to the first group. The shift control circuit 42 sets, for example, the voltage value of the first shift pulse 61 as a shift parameter for the MMLs 81 and 83 belonging to the first group.

FIG. 25 illustrates an example of detecting an MML belonging to a second group from the block for which the first group has been determined. The second group is a group where an MML to which the second shift pulse 62 larger than the first shift pulse 61 is to be applied belong. As illustrated in FIG. 25, the MMLs 81 and 83 belonging to the first group store the RMs 813 and 833 in one or more layers successive from the last layer, in the block for which the first group has been determined and the second and the third groups have not been detected. In contrast, groups to which the MMLs 82 and 84 belong has not been determined, and each of the MMLs 82 and 84 does not store an RM or valid data.

The MMLs 81 and 83 are MMLs for which the shift parameters have already been determined (i.e., parameter-determined MMLs), and the MMLs 82 and 84 are MMLs for which the shift parameters has not been determined.

The shift control circuit 42 applies the second shift pulse 62 to each of the MMLs 82 and 84 for which the shift parameters has not been determined, by using two RMs as the input data. At this time, the number of times the shift control circuit 42 applies the second shift pulse 62 corresponds to a sum of the number of layers corresponding to one RM and the number of layers in the MML. The read control circuit 45 reads an RM from the MML shifted upon the application of the second shift pulse 62. The shift control circuit 42 can detect the MML from which the RM has been read, as an MML to which the second shift pulse 62 is to be applied and which belongs to the second group.

More specifically, the shift control circuit 42 first applies the second shift pulse 62 for write shift to the MMLs 82 and 84, by using a first RM as the input data to each of the MMLs 82 and 84. The number of times the shift control circuit 42 applies the second shift pulse 62 corresponds to the number of layers of the RM. The RM 821 set as the input data is written into the MML 82 shifted upon the application of the second shift pulse 62. In contrast, the RM is not written into the MML 84 that is not shifted upon the application of the second shift pulse 62.

Next, the shift control circuit 42 applies the second shift pulse 62 for write shift to the MMLs 82 and 84, by using a second RM as input data to each of the MML 82 and 84. The number of times the shift control circuit 42 applies the second shift pulse 62 corresponds to the number of layers of the RM. The RM 823 set as the input data is further written into the MML 82 shifted upon the application of the second shift pulse 62. In contrast, the RM is not written into the MML 84 that is not shifted upon the application of the second shift pulse 62.

Furthermore, the shift control circuit 42 continues the application of the second shift pulse 62 to the MMLs 82 and 84. More specifically, the number of times the shift control circuit 42 applies the second shift pulse 62 corresponds to the number of times necessary to read the first RM that is first used as the input data, from the MMLs 82 and 84.

The read control circuit 45 reads the RM 821 from the MML 82 shifted upon the application of the second shift pulse 62, via a sense latch in the output unit group 44. The shift control circuit 42 can detect the MML 82 from which the RM 821 has been read, as an MML to which the second shift pulse 62 is to be applied and which belongs to the second group. The shift control circuit 42 sets, for example, the voltage value of the second shift pulse 62 as the shift parameter of the MML 82 belonging to the second group.

FIG. 26 illustrates an example of detecting an MML belonging to the third group from the block for which the first and second groups are determined. The third group is a group where an MML to which the third shift pulse 63 larger than the second shift pulse 62 is to be applied belongs. As illustrated in FIG. 26, the MMLs 81 and 83 belonging to the first group and the MML 82 belonging to the second group store the RMs 813, 823, and 833 in one or more layers successive from the last layer, in the block for which the first and second groups have been determined and the third group has not been detected. In contrast, a group to which the MML 84 belongs has not been determined, and the MML 84 does not store an RM or valid data. The MMLs 81, 82, and 83 are MMLs for which the shift parameters has already been determined (i.e., parameter-determined MMLs) and the MML 84 is an MML for which the shift parameter has not been determined.

The shift control circuit 42 applies a third shift pulse 63 to the MML 84 for which the shift parameter has not been determined, by using two RMs as input data. At this time, the number of times the shift control circuit 42 applies the third shift pulse 63 corresponds to a sum of the number of layers corresponding to one RM and the number of layers in the MML. The read control circuit 45 reads one RM from the MML shifted upon the application of the third shift pulse 63. The shift control circuit 42 can detect the MML from which the RM has been read, as an MML to which the third shift pulse 63 is to be applied and which belongs to the third group.

More specifically, the shift control circuit 42 first applies the third shift pulse 63 for write shift to the MML 84, by using a first RM as input data. The number of times the shift control circuit 42 applies the third shift pulse 63 corresponds to the number of layers of the RM. The RM 841 set as the input data is written into the MML 84 shifted upon the application of the third shift pulse 63.

Next, the shift control circuit 42 applies the third shift pulse 63 for write shift to the MML 84, by using a second RM as input data to the MML 84. The number of times the shift control circuit 42 applies the third shift pulse 63 corresponds to the number of layers of the RM. The RM 823 set as the input data is further written into the MML 84 shifted upon the application of the third shift pulse 63.

Furthermore, the shift control circuit 42 continues the application of the third shift pulse 63 to the MML 84. More specifically, the number of times the shift control circuit 42 applies the third shift pulse 63 corresponds to the number of times necessary to read the first RM, which is first used as the input data, from the MML 84.

The read control circuit 45 reads the RM 841 from the MML 84 shifted upon the application of the third shift pulse 63, via a sense latch in the output unit group 44. The shift control circuit 42 can detect the MML 84 for which the RM 841 has been read, as an MML to which the third shift pulse 63 is to be applied and which belongs to the third group. The shift control circuit 42 sets, for example, the voltage value of the third shift pulse 63 as the shift parameter of the MML 84 belonging to the third group.

The shift control circuit 42 and the read control circuit 45 can confirm the RMs 811, 821, 831, and 841 read from the respective MMLs 81, 82, 83, and 84, by the operations of applying the first shift pulse 61, the second shift pulse 62, and the third shift pulse 63. In addition, the MMLs 81, 82, 83, and 84 store the RMs 813, 823, 833, and 843, respectively, in one or more layers successive from the last layer. The shift control circuit 42 can execute next shift trimming for this block with the RMs 813, 823, 833, and 843. This block is therefore an applicable block of shift trimming.

Figure 27:
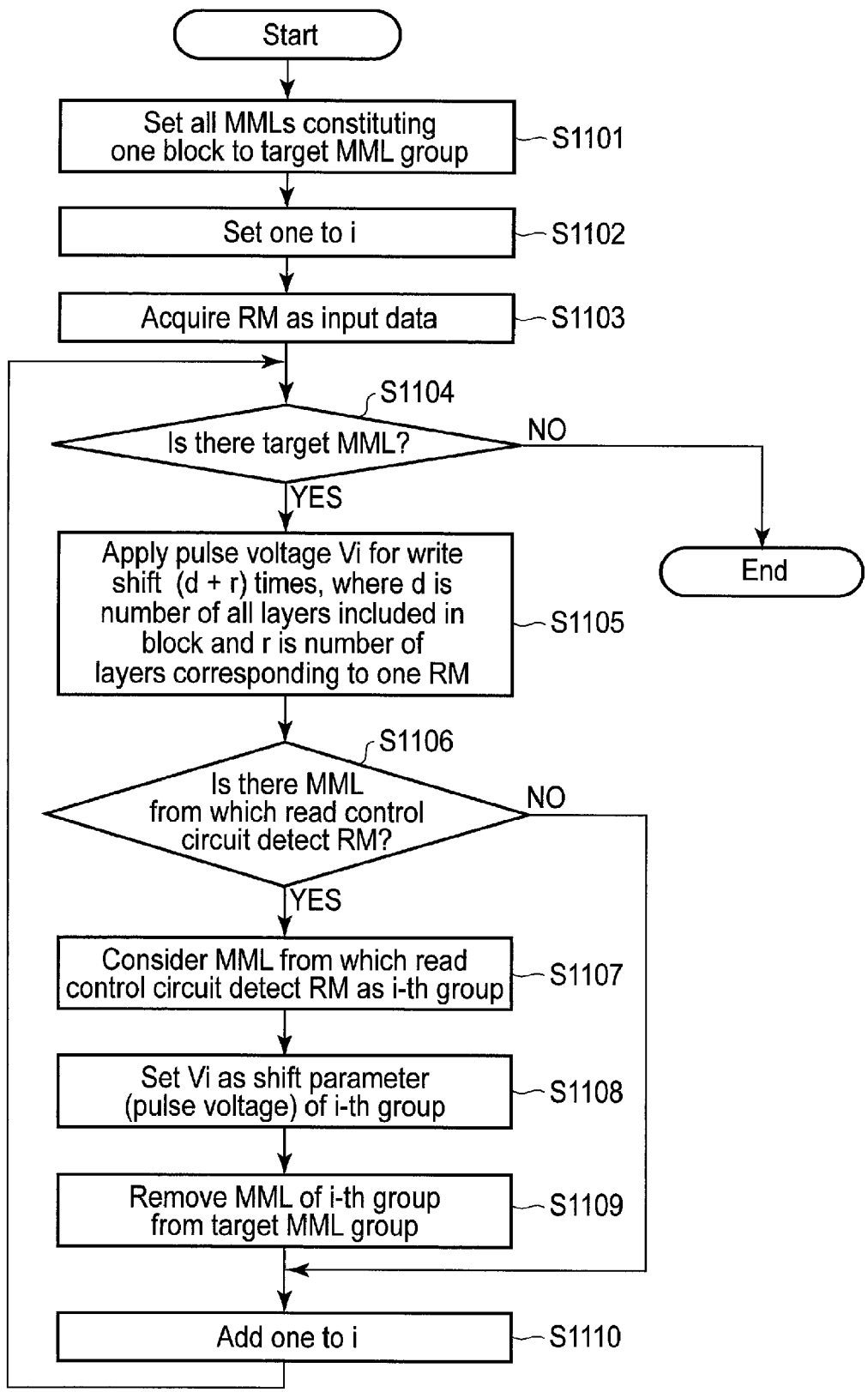
FIG. 27 is a flowchart illustrating an example of the procedure of a shift trimming preprocess that is executed in the magnetic domain wall shift memory in the first-in first-out method.

FIG. 27 is a flowchart illustrating an example of the procedure of a shift trimming preprocess that is executed in the magnetic domain wall shift memory 3 in the first-in first-out method. In the shift trimming preprocess, an inapplicable block of shift trimming is processed to be an applicable block of shift trimming. It is assumed here that one process target block to which shift trimming is inapplicable is determined. Each MML in the process target block does not store an RM in one or more layers successive from the last layer.

The process target block is composed of d layers. That is, the number of all layers included in the process target block is d. In addition, one RM has the size corresponding to r layers.

The shift control circuit 42 sets all the MMLs constituting the process target block to a process target MML group (step S1101). The shift control circuit 42 sets one to a variable i (step S1102). The write control circuit 43 acquires input data to each MML that is two RMs, and sets the data in the input unit group 41 (step S1103). One of the RMs first input to the input unit group 41 (i.e., the RM first written into the MML) is referred to as a first RM, and the other of the RMs input later is referred to as a second RM.

The shift control circuit 42 determines whether there is an MML of process target (step S1104). That is, the shift control circuit 42 determines whether there is an MML included in the process target MML group. When there is an MML of process target (YES in step S1104), the shift control circuit 42 applies a pulse voltage Vi for write shift to the process target MML group (step S1105). In step S1105, the number of times the shift control circuit 42 applies the pulse voltage Vi corresponds to a sum (d+r) of the number d of all layers included in the process target block and the number r of layers corresponding to one RM.

In each MML on which write shift is performed upon the application of the pulse voltage Vi, the first RM and the second RM set in the input unit group 41 are sequentially written and shifted. Thus, the first RM first written is output via a sense latch in the output unit group 44, and the second RM subsequently written is stored in one or more layers successive from the last layer. In contrast, no RM is written into each MML on which write shift is not performed upon the application of the pulse voltage Vi. The pulse voltage Vi becomes larger as the variable i is larger, and increases by, for example, a specific value as the variable i increases by one.

The shift control circuit 42 determines whether there is an MML from which an RM has been detected by the read control circuit 45 upon the application of the pulse voltage Vi (step S1106). When there is an MML from which an RM has been detected (YES in step S1106), the shift control circuit 42 considers the MML from which the RM has been detected as an i-th group (step S1107). The shift control circuit 42 sets the pulse voltage Vi as a shift parameter of the i-th group (step S1108). That is, the shift control circuit 42 determines the pulse voltage Vi to be applied to each MML belonging to the i-th group. Then, the shift control circuit 42 removes the MML belonging to the i-th group from the target MML group (step S1109).

In contrast, when there is no MML from which an RM has been detected (NO in step S1106), the procedure from step S1107 to S1109 is skipped.

Then, the shift control circuit 42 adds one to the variable i (step S1110), returns to step S1104, and executes a process using a new pulse voltage Vi for the target MML group.

When there is no MML of process target (NO in step S1104), the shift control circuit 42 ends the shift trimming preprocess.

According to the above-described shift trimming preprocess in the magnetic domain wall shift memory 3, the process target block that is an inapplicable block can be translated into an applicable block of shift trimming.

<Write Verify in Magnetic Domain Wall Shift Memory 3 in First-In First-Out Method>

As described above, reading of data from the magnetic domain wall shift memory 3 is destructive read. For this reason, if the magnetic domain wall shift memory 3 employs a method of reading written data and verifying whether the written data is correctly written, the written data is destructed by the reading.

For this reason, the shift control circuit 42 and the read control circuit 45 of the present embodiment execute write verify for verifying success or failure of a write operation of writing write data to a block, by using a write mark (WM). The WM is used to determine whether a write operation of sequentially writing the WM and the write data is successful. The shift control circuit 42 and the read control circuit 45 determine that the write operation is successful when the WM is detected from data that is read from each MML.

The WM has the data size corresponding to one or more layers. In addition, the write data has, for example, the data size corresponding to one block.

The WM includes data of a specific pattern. The WM is data known to at least one of the memory controller 2 and the magnetic domain wall shift memory 3. This specific pattern may be a pattern suitable for the read control circuit 45 that reads data from each MML and detects a WM from the read data. For example, when data composed of a fixed value (for example, "000 . . . 0") is stored in each MML in an initial state, a WM may include data composed of a value (for example, "111 . . . 1") obtained by reversing the fixed value. Alternatively, a data portion corresponding to the size of a WM may be acquired from the leading part of the write data that is to be written into each MML, and data obtained by revering each bit value of the data portion may be used as a WM.

Figure 28:
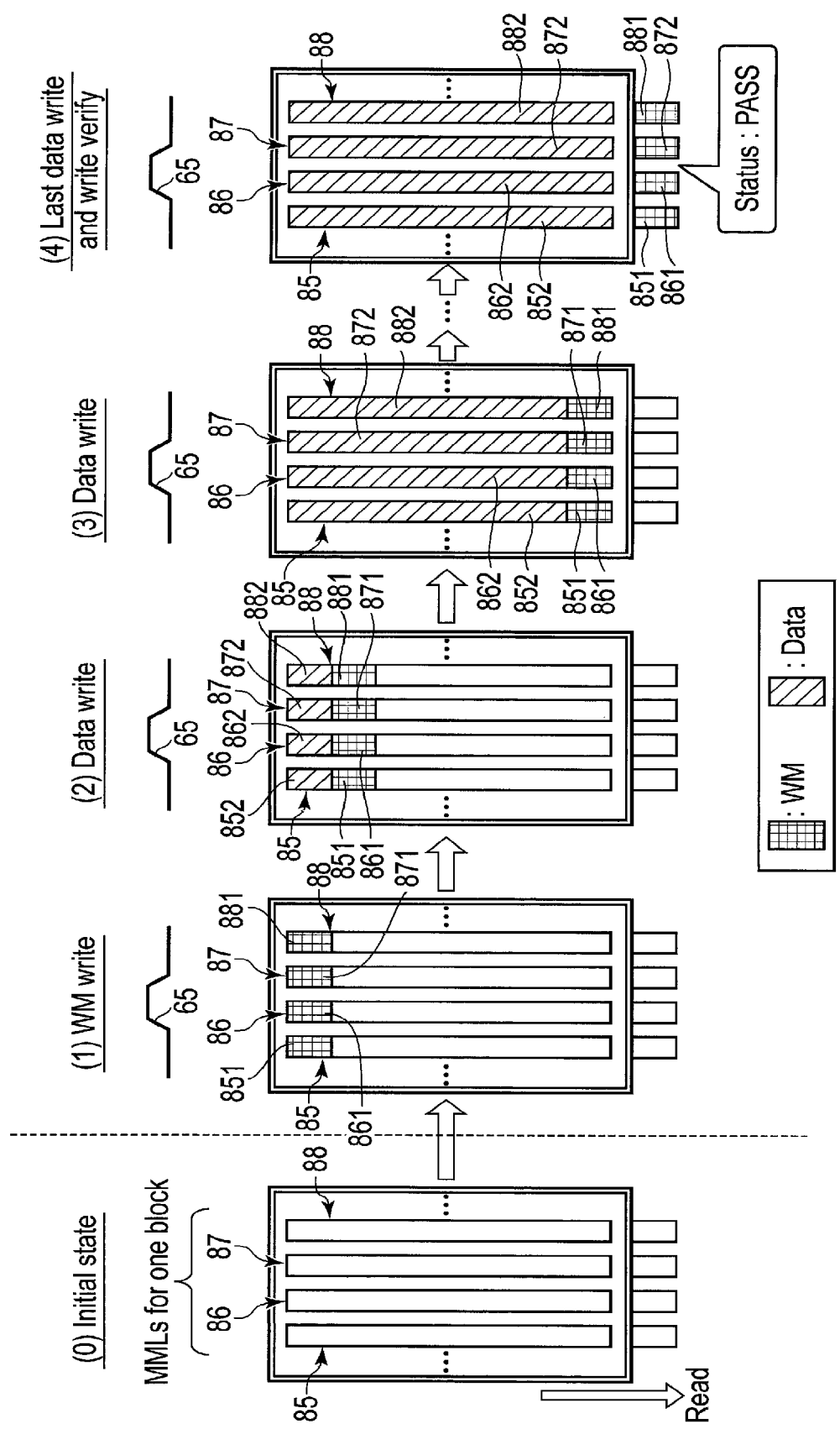
FIG. 28 is a diagram illustrating an example where a write operation including write verify for a block is successful.

FIG. 28 illustrates an example where it is determined that a write operation for a block is successful by performing write verify.

The shift control circuit 42 applies a shift pulse 65 to each of MMLs 85, 86, 87, and 88 included in the block in an initial state, by using one WM and write data as input data. At this time, the number of times the shift control circuit 42 applies the shift pulse 65 corresponds to a sum of the number of layers corresponding to one WM and the number of layers included in the MML.

The read control circuit 45 reads data from the MMLs 85, 86, 87, and 88 shifted upon the application of the shift pulse 65, via sense latches in the output unit group 44. The read control circuit 45 performs write verify to verify whether the write operation is successful, by using the read data.

More concrete operations will be described below.

(0) Initial State

The block in an initial state is a free block where no valid data is stored. That is, each of the MMLs 85, 86, 87, and 88 stores no valid data.

(1) WM Write

Next, the shift control circuit 42 first applies a first shift pulse 65 for write shift to all the MMLs 85, 86, 87, and 88, by using a WM as input data to each of the MMLs 85, 86, 87, and 88. The number of times the shift control circuit 42 applies the first shift pulse 65 corresponds to the number of layers of the WM. WMs 851, 861, 871, and 881 set as the input data are written, respectively, into the MMLs 85, 86, 87, and 88 that are normally shifted upon the application of the shift pulse 65.

(2) Data Write

The shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers of each write data portion. The write data portions 852, 862, 872, and 882 are written into the MMLs 85, 86, 87, and 88 that are normally shifted upon the application of the shift pulse 65.

(3) Data Write

Similarly to (2) Data Write, the shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers of the write data portion. In the MMLs 85, 86, 87, and 88 that are normally shifted upon the application of the shift pulse 65, the write data portions 852, 862, 872, and 882 are further written, and the WMs 851, 861, 871, and 881 written prior to the write data portions 852, 862, 872, and 882 reach the last layers of the MMLs 85, 86, 87, and 88.

(4) Last Data Write and Write Verify

Similarly to (2) Data Write, the shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers for each write data portion. All the write data portions 852, 862, 872, and 882 are written into the MMLs 85, 86, 87, and 88 that are normally shifted upon the application of the shift pulse 65.

In addition, the read control circuit 45 reads data from the MMLs 85, 86, 87, and 88 that are shifted upon the application of the shift pulse 65, via sense latches in the output unit group 44. The read control circuit 45 detects the WMs 851, 861, 871, and 881 from the data read from the MMLs 85, 86, 87, and 88, respectively. That is, the data read from the MMLs 85, 86, 87, and 88 match the WMs 851, 861, 871, and 881, respectively. The read control circuit 45 therefore determines that the write operation is successful. Then, the read control circuit 45 sets PASS indicating that the write operation is successful, in a status indicative of the result of the write operation.

Figure 29:
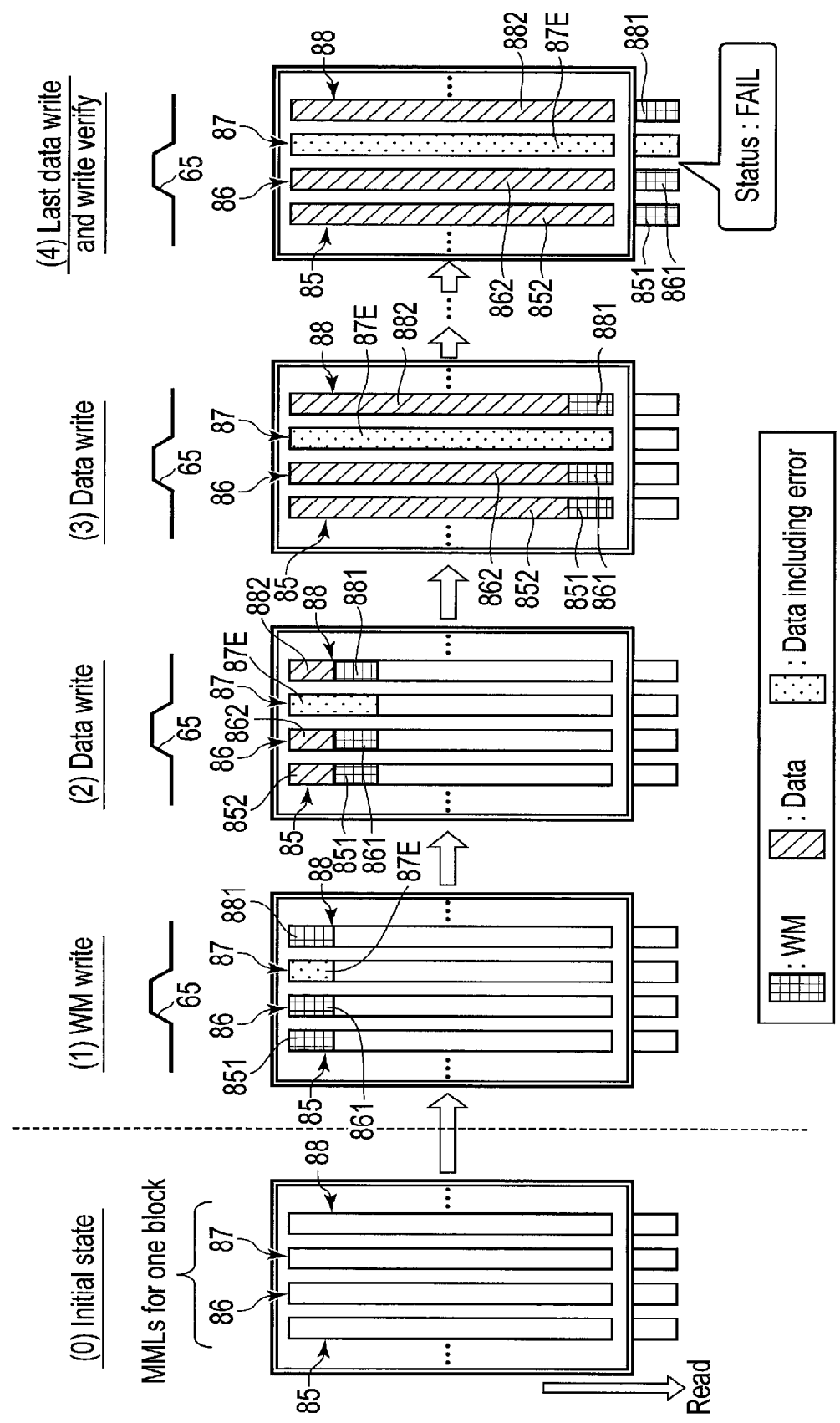
FIG. 29 is a diagram illustrating an example where a write operation including write verify for a block is unsuccessful.

In contrast, FIG. 29 illustrates an example where it is determined that a write operation for a block is unsuccessful by performing write verify. Concrete operations will be described below.

(0) Initial State

The block in an initial state is a free block where no valid data is stored. That is, each of MMLs 85, 86, 87, and 88 stores no valid data.

(1) WM Write

Next, the shift control circuit 42 applies a first shift pulse 65 for write shift to all the MMLs 85, 86, 87, and 88, by using a WM as input data to the respective MMLs 85, 86, 87, and 88. The number of times the shift control circuit 42 applies the first shift pulse 65 corresponds to the number of layers for the WM. The WMs 851, 861, and 881 set as the input data are written, respectively, to the MMLs 85, 86, and 88 that are normally shifted upon the application of the shift pulse 65. In contrast, the WM is not correctly written, but data 87E including an error is written into the MML 87 that is not normally shifted upon the application of the shift pulse 65.

(2) Data Write

The shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers for each write data portions. The write data portions 852, 862, and 882 are further written into the MMLs 85, 86, and 88 that are normally shifted upon the application of the shift pulse 65. In contrast, the data 87E including an error is written into the MML 87.

(3) Data Write

Similarly to (2) Data Write, the shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers for each write data portion. In the MMLs 85, 86, and 88 that are normally shifted upon the application of the shift pulse 65, the write data portions 852, 862, and 882 are further written, and the WMs 851, 861, and 881 written prior to the write data portions 852, 862, and 882 reach the last layers of the MMLs 85, 86, and 88. In contrast, in the MML 87, the data 87E including an error reaches the last layer of the MML 87.

(4) Last Data Write and Write Verify

Similarly to (2) Data Write, the shift control circuit 42 applies the shift pulse 65 for write shift to all the MMLs 85, 86, 87, and 88, by using write data portions as input data to the respective MMLs 85, 86, 87, and 88. The number of times the shift control circuit 42 applies the shift pulse 65 corresponds to the number of layers of each write data portion. All the write data portions 852, 862, and 882 are written into the MMLs 85, 86, and 88 that are normally shifted upon the application of the shift pulse 65.

In addition, the read control circuit 45 reads data from the MMLs 85, 86, 87, and 88 that are shifted upon the application of the shift pulse 65, via sense latches in the output unit group 44. The read control circuit 45 detects the WMs 851, 861, and 881 from the data read from the MMLs 85, 86, and 88, respectively, but cannot detect a WM from the data read from the MML 87.

When the number of MMLs from which data corresponding to the WM cannot be read exceeds a threshold value, the read control circuit 45 determines that the write operation is unsuccessful. For example, when the WM cannot be detected from the data read from the MML 87 of the four MMLs 85, 86, 87, and 88 and the threshold value is zero, the read control circuit 45 determines that the write operation is unsuccessful. Then, the read control circuit 45 sets FAIL indicating that the write operation is unsuccessful, in the status indicative of the result of the write operation.

In the above-described example, when the WM is written into the MML 87, the MML 87 is not normally shifted and an error occurs in the written data. However, even if a WM is correctly written into the MML 87, and then the MML 87 is not normally shifted and an error occurs while writing write data portions into the MML 87, the read control circuit 45 may perform the write verify. The read control circuit 45 can detect an error that occurs in the write operation using the WM and the write data portions as input data, according to whether the WM is detected.

Figure 30:
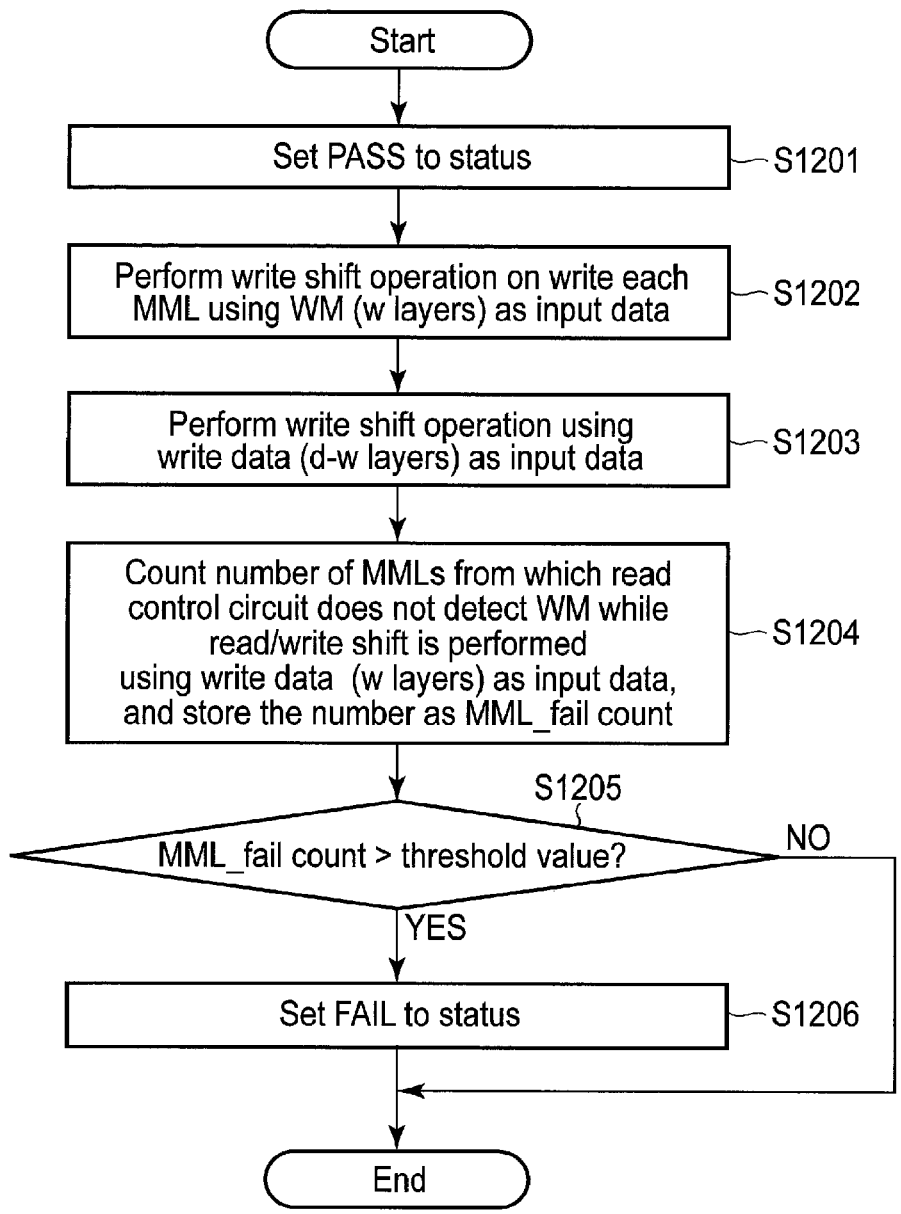
FIG. 30 is a flowchart illustrating an example of the procedure of a write verify process that is executed in the magnetic domain wall shift memory in the first-in first-out method.

FIG. 30 is a flowchart illustrating an example of the procedure of a write verify process that is executed in the magnetic domain wall shift memory 3 in the first-in first-out method. It is assumed here that one write target block is determined. The write target block is, for example, a free block where no valid data is stored. The write target block is composed of d layers. That is, the number of all layers included in the write target block is d. In addition, one WM has the size corresponding to w layers.

The shift control circuit 42 sets PASS as an initial value of a status indicative of the result of the write verify (step S1201). The shift control circuit 42 performs write shift on each MML by using a WM corresponding to w layers as input data (step S1202). That is, the shift control circuit 42 applies a shift pulse for write shift to each MML. Then, the shift control circuit 42 performs write shift on each MML by using write data corresponding to (d-w) layers as input data (step S1203).

Next, the read control circuit 45 counts the number of MMLs from which the WMs are not detected, respectively, while the shift control circuit 42 performs read/write shift on each MML by using write data corresponding to w layers as input data (step S1204). The read control circuit 45 stores the counted number of MMLs as an MML_fail number.

The read control circuit 45 determines whether the MML_fail number exceeds a threshold value (step S1205). When the MML_fail number exceeds the threshold value (YES in step S1205), the read control circuit 45 sets FAIL in the status (step S1206). In contrast, when the MML_fail number is smaller than or equal to the threshold value (NO in step S1205), the read control circuit 45 executes no process but PASS remains set in the status.

According to the above-described write verify process, the magnetic domain wall shift memory 3 can verify whether the write data has been correctly written, according to whether the read control circuit 45 detects the WM from each MML, and can set the verification result as the status.

FIG. 31 is a flowchart illustrating a third example of the procedure of a write process that is executed in the memory system 1.

The procedure from step S1301 to step S1304 is the same as the procedure from step S801 to step S804 described above with reference to the flowchart of FIG. 21.

In response to the request by the memory controller 2, the magnetic domain wall shift memory 3 executes a write verify process for a write target block (step S1305). This write verify process corresponds to the write verify process described above with reference to the flowchart of FIG. 30.

After completing the write verify process, the memory controller 2 requests reading of a status indicative of the result of the write verify process from the magnetic domain wall shift memory 3 (step S1306). In response to this request, the magnetic domain wall shift memory 3 returns the status to the memory controller 2 (step S1307).

The memory controller 2 determines whether the status returned by the magnetic domain wall shift memory 3 is PASS or FAIL (step S1308). When the status is PASS (YES in step S1308), the memory controller 2 updates the LUT 231 so as to indicate mapping between a logical address designated in the write request and a physical address indicative of the write target block to which write data is written (step S1309). Then, the memory controller 2 releases an area in the write buffer 25W in which the write data is stored (step S1310).

In contrast, when the status is FAIL (NO in step S1308), the memory controller 2 determines another block as a new write target block (step S1311) and returns to step S1304. The write data is thereby written into the new write target block.

According to the above-described write process, the memory system 1 can determine whether the write operation in the magnetic domain wall shift memory 3 is normally executed, when executing the process responding to the write request from the host 4, and can further execute writing of the write data to another block when an abnormality occurs.

<Shift Trimming and Write Verify>

Figure 32:
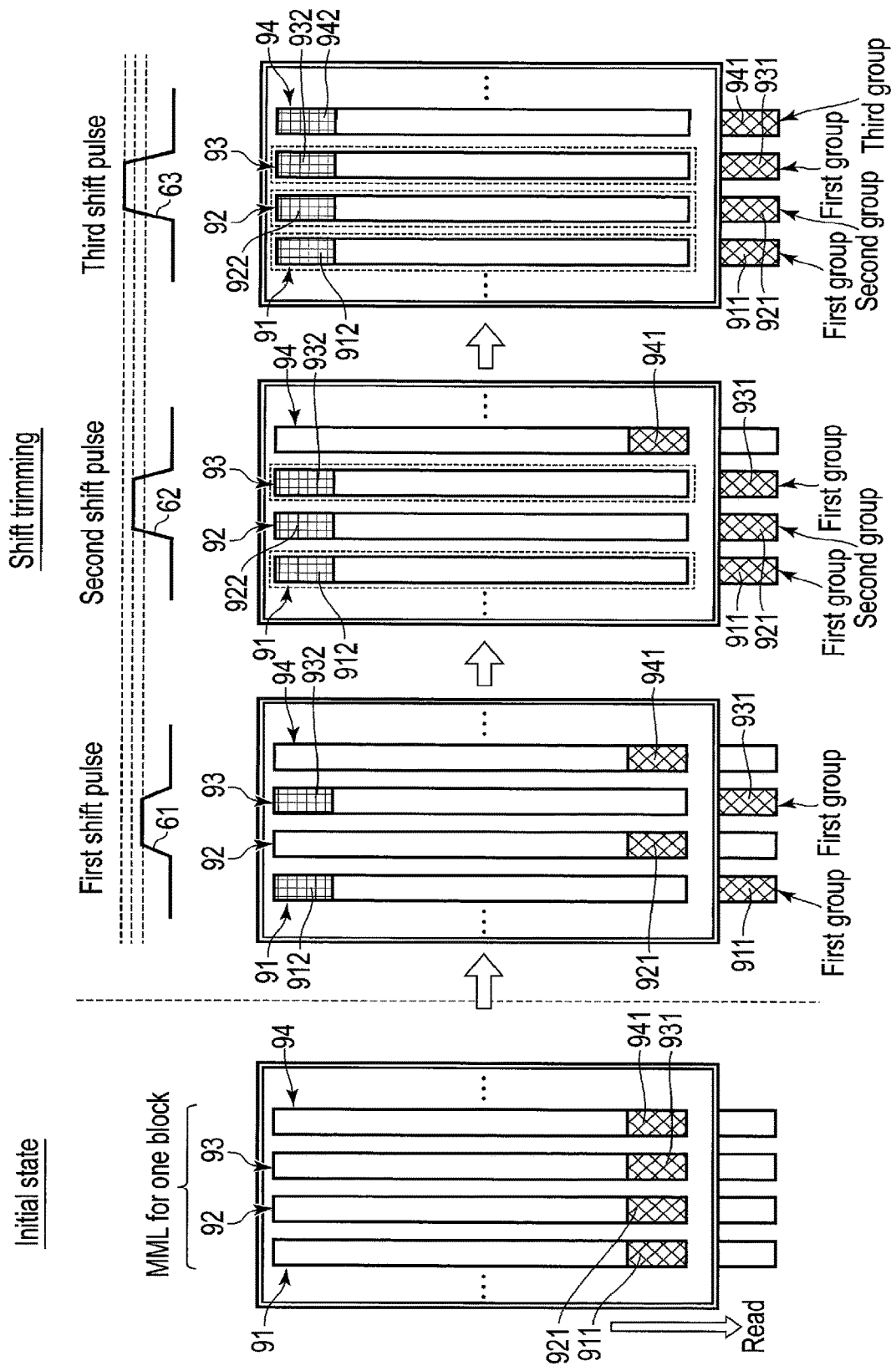
FIG. 32 is a diagram illustrating an example of a write operation including shift trimming and write verify for a block.
Figure 33:
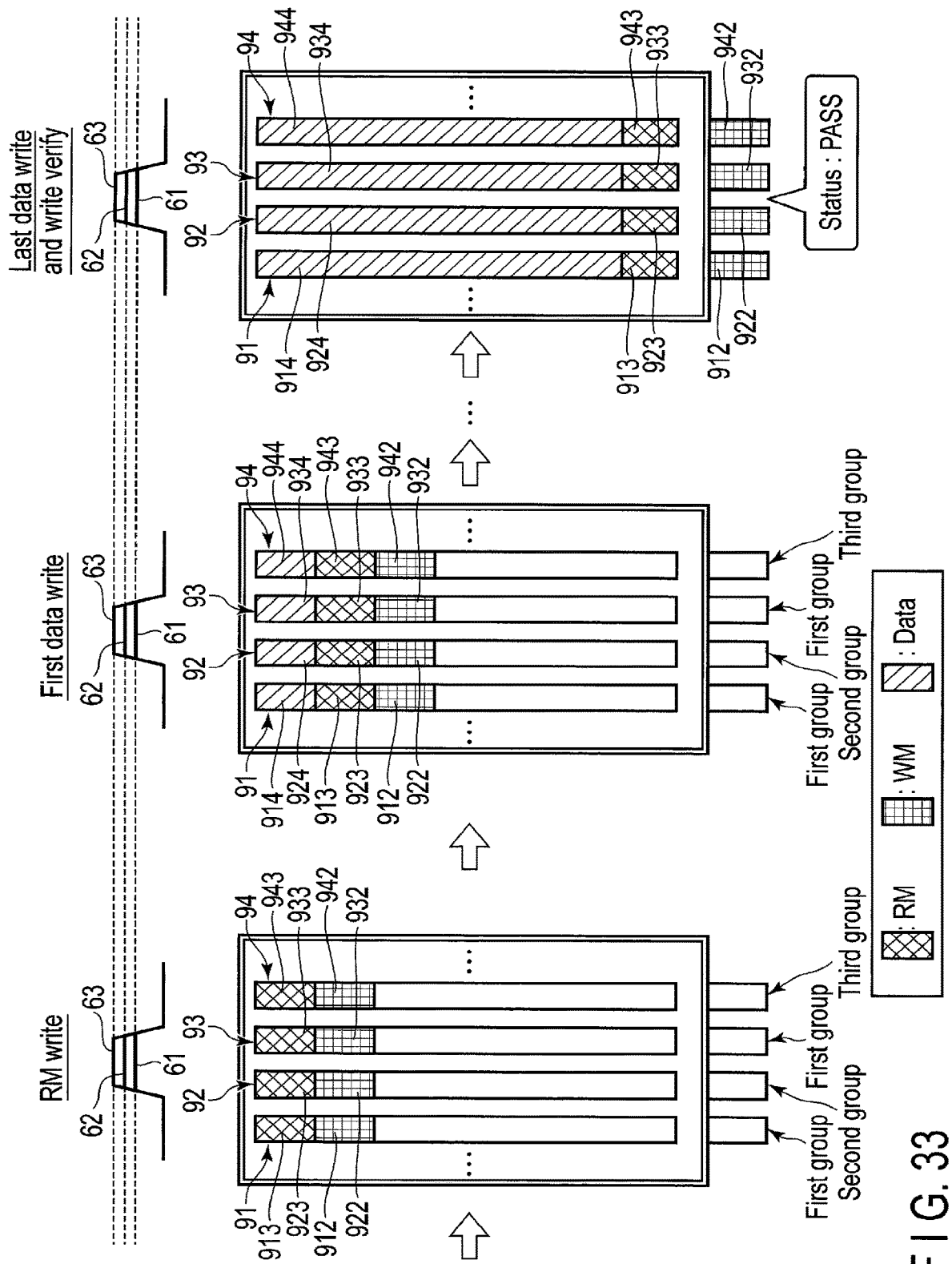
FIG. 33 is a diagram illustrating an example where the write operation including shift trimming and write verify for the block is successful.
Figure 34:
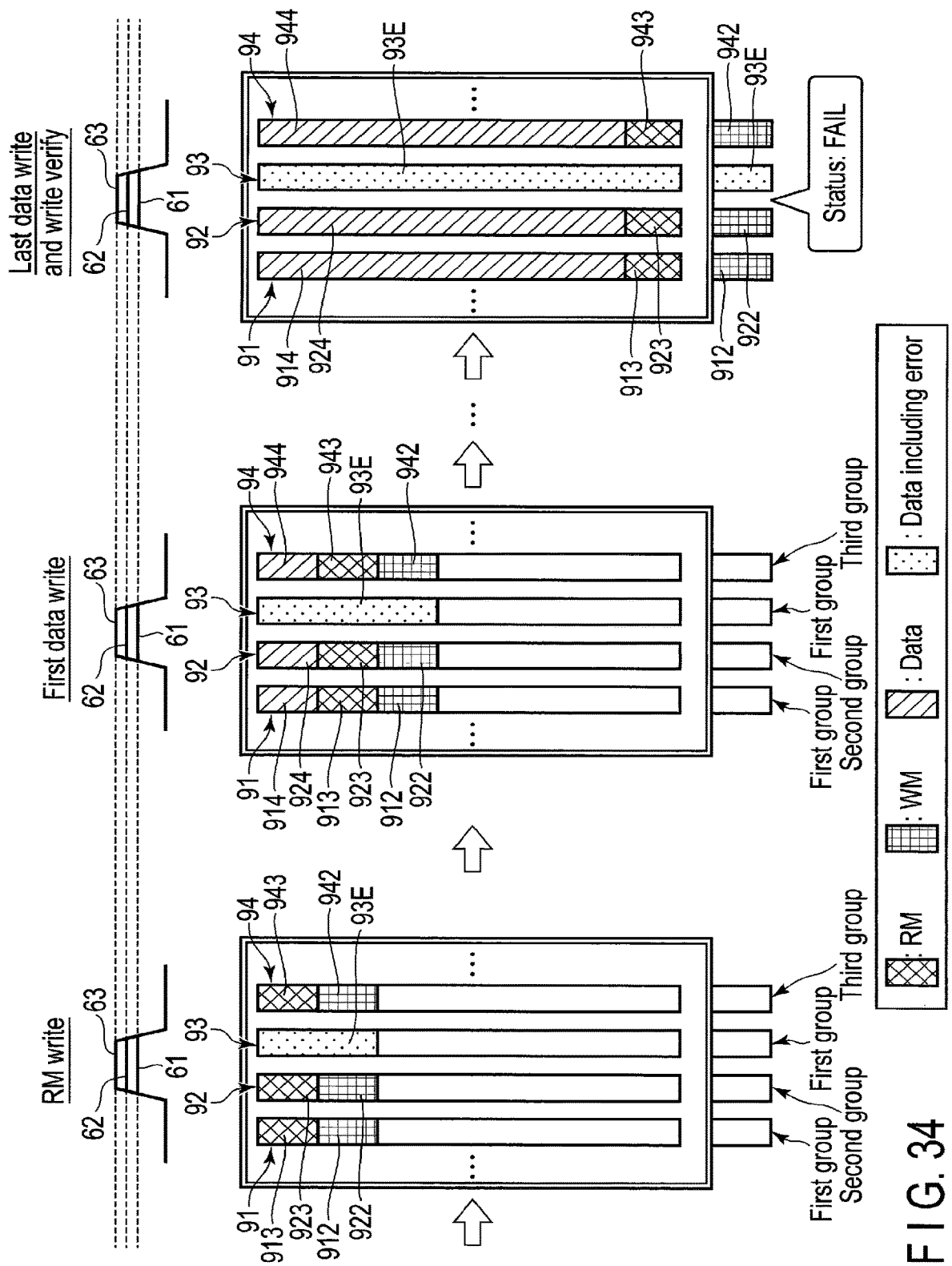
FIG. 34 is a diagram illustrating an example where the write operation including shift trimming and write verify for the block is unsuccessful.

FIGS. 32, 33, and 34 illustrate an example of a write operation including shift trimming and write verify for a block. An example that the block is composed of four MMLs 91, 92, 93, and 94 will be described, but the block may include any number of MMLs. Write data to be written in the write operation has a size obtained by subtracting the data size, which corresponds to four RMs stored in the four MMLs 91, 92, 93, and 94, from the block size. In addition, an RM and a WM used in this write operation are assumed to have the same data size.

FIG. 32 illustrates an example of shift trimming in the write operation. In the shift trimming, a WM is written into each of the MMLs 91, 92, 93, and 94.

The block in the initial state is an applicable block of shift trimming. That is, the MML 91 stores an RM 911 in one or more layers successive from the last layer, of layers included in the MML 91. The MML 92 stores an RM 921 in one or more layers successive from the last layer, of layers included in the MML 92. The MML 93 stores an RM 931 in one or more layers successive from the last layer, of layers included in the MML 93. The MML 94 stores an RM 941 in one or more layers successive from the last layer, of layers included in the MML 94.

The shift control circuit 42 and the read control circuit 45 execute shift trimming for the block in the initial state. More specifically, the shift control circuit 42 first applies a first shift pulse 61 for read/write shift to all the MMLs 91, 92, 93, and 94, by using a WM as input data to each MML 91, 92, 93, and 94. The number of times the shift control circuit 42 applies the first shift pulse 61 corresponds to the number of layers for the WM (=the number of layers for an RM).

The read control circuit 45 detects the RMs 911 and 931 from read data that is read via sense latches in the output unit group 44 upon the application of the first shift pulse 61. The shift control circuit 42 creates a first group including the MMLs 91 and 93 in which the detected RMs 911 and 931 were stored respectively. The shift control circuit 42 sets a first shift parameter indicative of the first shift pulse 61 for the first group. The first shift parameter includes, for example, the voltage value of the first shift pulse 61.

The first shift parameter suitable for the MMLs 91 and 93 belonging to the first group is thereby determined. In the MMLs 91 and 93 belonging to the first group, the RMs 911 and 931 is read and the WMs 912 and 932 set as the input data is written, by performing the read/write shift.

Then, the shift control circuit 42 and the read control circuit 45 execute shift trimming for the remaining MMLs 92 and 94 excluding the MMLs 91 and 93 belonging to the first group (i.e., parameter-determined MMLs). The shift control circuit 42 applies a second shift pulse 62 for read/write shift to the MMLs 92 and 94, by using a WM as input data to each of the MMLs 92 and 94. The number of times the shift control circuit 42 applies the second shift pulse 62 corresponds to the number of layers for the WM.

The read control circuit 45 detects the RM 921 from read data that is read via a sense latch in the output unit group 44 upon application of the second shift pulse 62. The shift control circuit 42 creates a second group including the MML 92 in which the detected RM 921 was stored. The shift control circuit 42 sets a second shift parameter indicative of the second shift pulse 62 for the second group. The second shift parameter includes, for example, the voltage value of the second shift pulse 62.

The second shift parameter suitable for the MML 92 belonging to the second group is thereby determined. In the MML 92 belonging to the second group, the RM 921 is read and the WM 922 set as the input data is written, by performing the read/write shift.

Next, the shift control circuit 42 and the read control circuit 45 execute shift trimming for the remaining MML 94 further excluding the MML 92 belonging to the second group. The shift control circuit 42 applies a third shift pulse 63 for read/write shift to the MML 94, by using a WM as input data to the MML 94. The number of times the shift control circuit 42 applies the third shift pulse 63 corresponds to the number of layers for the WM.

The read control circuit 45 detects the RM 941 from read data that is read via a sense latch in the output unit group 44 upon application of the third shift pulse 63. The shift control circuit 42 creates a third group including the MML 94 in which the detected RM 941 was stored. The shift control circuit 42 sets a third shift parameter indicative of the third shift pulse 63 for the third group. The third shift parameter includes, for example, the voltage value of the third shift pulse 63.

The third shift parameter suitable for the MML 94 belonging to the third group is thereby determined. In the MML 94 belonging to the third group, the RM 941 is read and the WM 942 set as the input data is written, by performing the read/write shift.

FIG. 33 illustrates an example where it is determined that a write operation for the block on which the shift trimming has been performed is successful, by performing write verify.

The shift control circuit 42 applies the shift pulses 61, 62, and 63 set for the respective groups to all the MMLs 91, 92, 93, and 94, by using an RM as input data to each of the MMLs 91, 92, 93, and 94. The number of times the shift control circuit 42 applies the shift pulses 61, 62, and 63 corresponds to the number of layers for the RM. The RMs 913, 923, 933, and 943 set as the input data are written, respectively, into the MMLs 91, 92, 93, and 94 that are normally shifted upon the application of the shift pulses 61, 62, and 63.

Then, the shift control circuit 42 applies the shift pulses 61, 62, and 63 to all the MMLs 91, 92, 93, and 94, by using write data portions as input data to the respective MMLs 91, 92, 93, and 94. The number of times the shift control circuit 42 applies the shift pulses 61, 62, and 63 corresponds to the number of layers of each write data portion. The write data portions 914, 924, 934, and 944 are written into the MMLs 91, 92, 93, and 94 that are normally shifted upon the application of the shift pulses 61, 62, and 63.

Similarly, the shift control circuit 42 applies the shift pulses 61, 62, and 63 to all the MMLs 91, 92, 93, and 94, by using the remaining write data portions as input data to the respective MMLs 91, 92, 93, and 94. The number of times the shift control circuit 42 applies the shift pulses 61, 62, and 63 corresponds to the number of layers of each remaining write data portion. All the write data portions 914, 924, 934, and 944 are written into the MMLs 91, 92, 93, and 94 that are normally shifted upon the application of the shift pulses 61, 62, and 63. In addition, the RMs 913, 923, 933, and 943 written prior to the write data portions 914, 924, 934, and 944 reach the last layers of the MMLs 91, 92, 93, and 94.

The read control circuit 45 reads data from the MMLs 91, 92, 93, and 94 shifted upon the application of the shift pulses 61, 62, and 63, via sense latches in the output unit group 44. The read control circuit 45 detects the WMs 912, 922, 932, and 942 from the data read from the MMLs 91, 92, 93, and 94, respectively. That is, the data read from the MMLs 91, 92, 93, and 94 match the WMs 912, 922, 932, and 942, respectively. The read control circuit 45 determines that the write operation is successful on the basis of the detection of the WMs 912, 922, 932, and 942 from the read data. Then, the read control circuit 45 sets PASS in a status indicative of the result of the write operation.

Note that the writing of the WMs 912, 922, 932, and 942 do not need to be executed parallel to the reading of the RMs 911, 921, 931, and 941, but may be executed after the shift parameter suitable for each MML has been determined. In this case, the shift control circuit 42 and the write control circuit 43 sequentially write the WMs 912, 922, 932, and 942, the RMs 913, 923, 933, and 943 and the write data portions 914, 924, 934, and 944 after the shift parameter suitable for each MML has been determined.

FIG. 34 illustrates an example where it is determined that a write operation for the block on which the shift trimming has been performed is unsuccessful, by performing write verify.

The shift control circuit 42 applies the shift pulses 61, 62, and 63 set for the respective groups to all the MMLs 91, 92, 93, and 94, by using an RM as input data to each of the MMLs 91, 92, 93, and 94. The number of times the shift control circuit 42 applies the shift pulses 61, 62, and 63 corresponds to the number of layers of the RM. The RMs 913, 923, and 943 set as the input data are written into the MMLs 91, 92, and 94 that are normally shifted upon the application of the shift pulses 61, 62, and 63. In contrast, an RM is not correctly written, but data 93E including an error is written into the MML 93 which is not normally shifted upon the application of the shift pulse 61.

Then, the shift control circuit 42 applies the shift pulses 61, 62, and 63 to all the MMLs 91, 92, 93, and 94, by using a write data portion as input data to each of the MMLs 91, 92, 93, and 94. The number of times the shift control circuit 42 applies the shift pulses 61, 62, and 63 corresponds to the number of layers of the write data portion. The write data portions 914, 924, and 944 are written into the MMLs 91, 92, and 94 that are normally shifted upon the application of the shift pulses 61, 62, and 63. In contrast, the data 93E including an error is written into the MML 93.

Similarly, the shift control circuit 42 applies the shift pulses 61, 62, and 63 to all the MMLs 91, 92, 93, and 94, by using the remaining write data portion as input data to each of the MMLs 91, 92, 93, and 94. The number of times the shift control circuit 42 applies the shift pulses 61, 62, and 63 corresponds to the number of layers of the remaining write data portion. All the write data portions 914, 924, and 944 are written into the MMLs 91, 92, and 94 that are normally shifted upon the application of the shift pulses 61, 62, and 63. In addition, in the MMLs 91, 92, and 94, the RMs 913, 923, and 943 written prior to the write data portions 914, 924, and 944 reach the last layers of the MMLs 91, 92, and 94. In contrast, in the MML 93, the data 93E including an error reaches the last layer of the MML 93.

The read control circuit 45 reads data from the MMLs 91, 92, 93, and 94 shifted upon the application of the shift pulses 61, 62, and 63, via the sense latches in the output unit group 44. The read control circuit 45 detects the WM 912, 922, and 942 from the data read from the MMLs 91, 92, and 94, respectively, but cannot detect the WM from the data read from the MML 93. When the number of MMLs for which data corresponding to the WM cannot be read exceeds a threshold value, the read control circuit 45 determines that the write operation is unsuccessful. For example, when the WM cannot be detected from the data read from the MML 93 of the four MMLs 91, 92, 93, and 94 and the threshold value is zero, the read control circuit 45 determines that the write operation is unsuccessful. Then, the read control circuit 45 sets FAIL in a status indicative of the result of the write operation.

In the above-described example, when the RM is written into the MML 93, the MML 93 is not normally shifted and an error occurs in the written data. However, if the MML 93 is not normally shifted and an error occurs while writing a WM into the MML 93, or if a WM and an RM are correctly written into the MML 93, and then the MML 93 is not normally shifted and an error occurs while writing write data portions into the MML 93, the read control circuit 45 may perform the write verify. The read control circuit 45 can detect an error that occurs in the write operation using the WM, the RM, and the write data portions as input data, according to whether the WM is detected.

Figure 35:
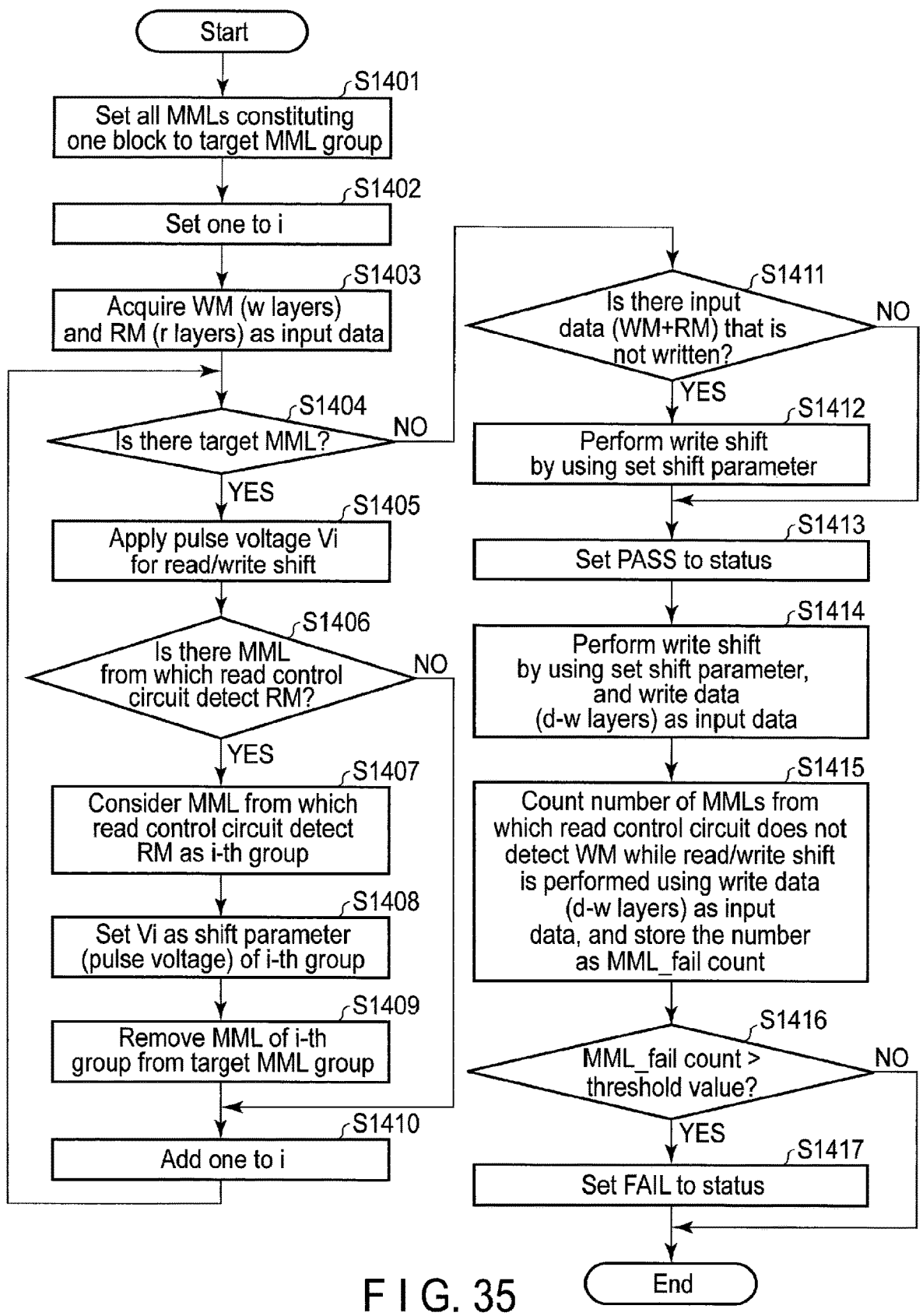
FIG. 35 is a flowchart illustrating an example of the procedure of a shift trimming and write verify process that is executed in the magnetic domain wall shift memory in the first-in first-out method.

FIG. 35 is a flowchart illustrating an example of the procedure of a shift trimming and write verify process that is executed in the magnetic domain wall shift memory 3 in the first-in first-out method. It is assumed here that one write target block is specified. Each MML constituting the write target block is an MML to which shift trimming is applicable. That is, each MML stores an RM in one or more layers successive from the last layer.

The write target block is composed of (d+r) layers. That is, the number of all layers included in the write target block is (d+r). One WM has a size corresponding to w layers. In addition, one RM has a size corresponding to r layers.

The shift control circuit 42 sets all the MMLs constituting the write target block to a shift trimming target MML group (step S1401). The shift control circuit 42 sets one to a variable i (step S1402). The write control circuit 43 acquires input data to each MML that is a WM and an RM, and sets the data in the input unit group 41 (step S1403).

The procedure from step S1404 to step S1410 is the same as the procedure from step S104 to step S110 described above with reference to the flowchart of FIG. 12. The shift control circuit 42 determines the shift parameter suitable for each MML by the procedure from step S1404 to step S1410.

When there is no MML of the shift trimming target (NO in step S1404), i.e., when shift parameters suitable for all the MMLs included in the write target block has been determined, the shift control circuit 42 and the write control circuit 43 determine whether the input data that has not been written is left (step S1411). That is, the shift control circuit 42 and the write control circuit 43 determine whether at least a part of the WM and the RM set as the input data is left and has not been written into the write target block.

When the input data that has not been written is left (YES in step S1411), the shift control circuit 42 performs write shift on each MML by using the shift parameter for each group (i.e., for the MML belonging to each group) to write the input data that has not been written (step S1412). When all the input data is has been written (NO in step S1411), the procedure of step S1412 is skipped.

Then, the shift control circuit 42 sets PASS as an initial value of a status indicative of the result of the write verify (step S1413). Then, the shift control circuit 42 performs write shift on each MML using the shift parameter set for each group, by using write data corresponding to (d−w) layers as input data (step S1414).

Next, the read control circuit 45 counts the number of MMLs in which the WMs are not detected, respectively, while the shift control circuit 42 performs read/write shift on each MML using the shift parameter set for each group, by using write data corresponding to w layers as input data (step S1415). The read control circuit 45 stores the counted number of MMLs as an MML_fail number.

The read control circuit 45 determines whether the MML_fail number exceeds a threshold value (step S1416). When the MML_fail number exceeds the threshold value (YES in step S1416), the read control circuit 45 sets FAIL in the status (step S1417). In contrast, when the MML_fail number is smaller than or equal to the threshold value (NO in step S1417), the read control circuit 45 executes no process but PASS remains set in the status.

According to the above-described shift trimming and write verify process, the magnetic domain wall shift memory 3 can write the write data by using the shift parameter suitable for each MML, and verify whether the write data has been correctly written, according to whether the WM is detected from each MML by the read control circuit 45, and can set the determination result as the status.

When the WM, RM, and the write data are written after the shift parameter is determined, step S1403 is omitted, and the application of the pulse voltage Vi in step S1405 is not the application for read/write shift, but the application for read shift. In addition, the shift control circuit 42 performs write shift of the WM and the RM in sequence in step S1412.

Figure 36:
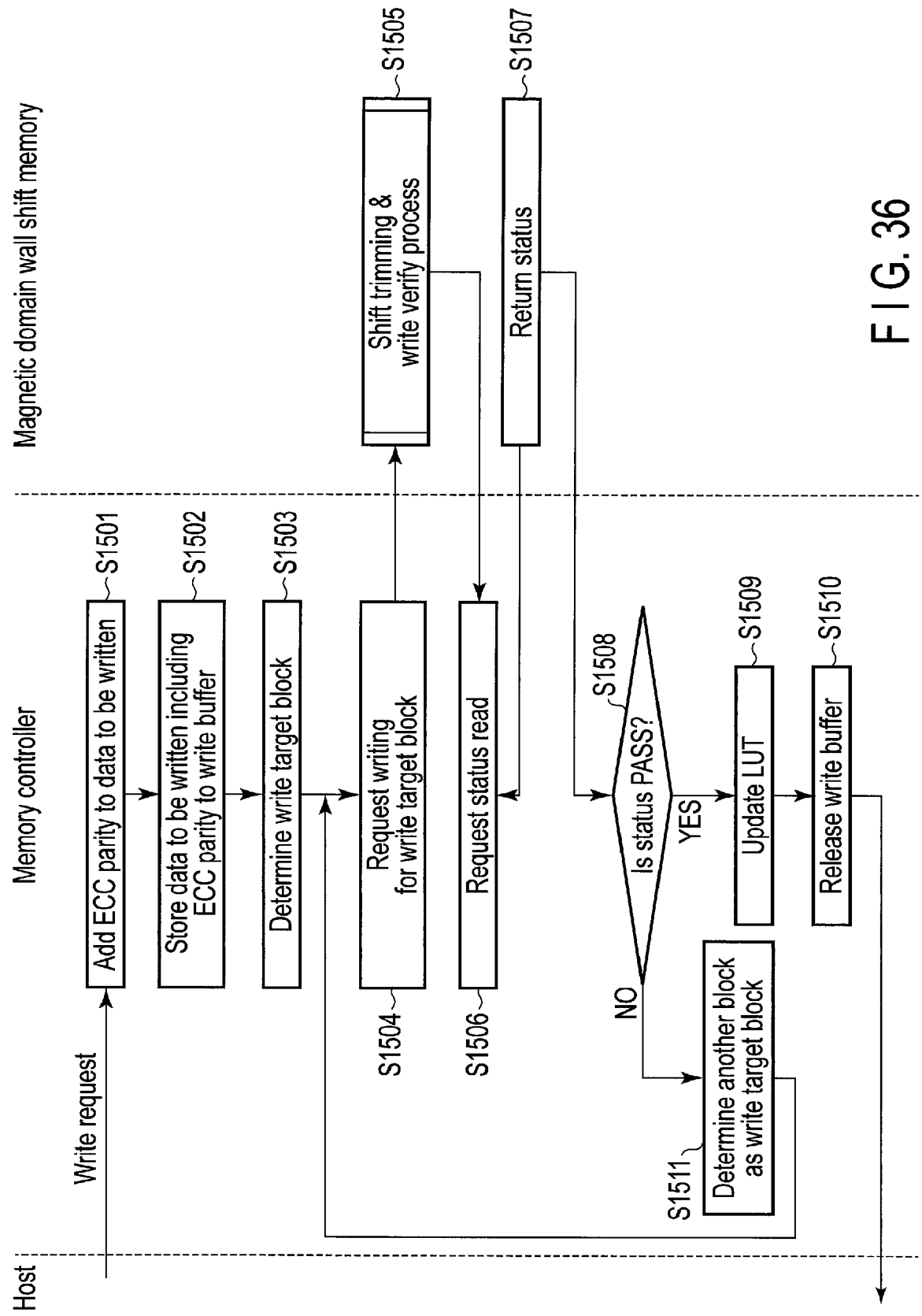
FIG. 36 is a flowchart illustrating a fourth example of the procedure of a write process that is executed in the memory system of the embodiment.

FIG. 36 is a flowchart illustrating a fourth example of the procedure of a write process that is executed in the memory system 1.

The procedure from step S1501 to step S1510 is the same as the procedure from step S1301 to step S1310 described above with reference to the flowchart of FIG. 31, except for a feature that the write verify process of step S1305 is replaced with the shift trimming and write verify process of step S1505. The shift trimming and write verify process has been described above with reference to the flowchart of FIG. 35.

According to the above-described write process, when executing the process responding to a write request from the host 4, the memory system 1 can write data, which is to be written, into the magnetic domain wall shift memory 3 by using the shift parameter suitable for each MML and then verify whether the write operation has been normally executed. When abnormality occurs in the write operation, the memory system 1 can further execute writing of the data to another block.

<Parallel Read/Write Operation including Shift Trimming>

Figure 37:
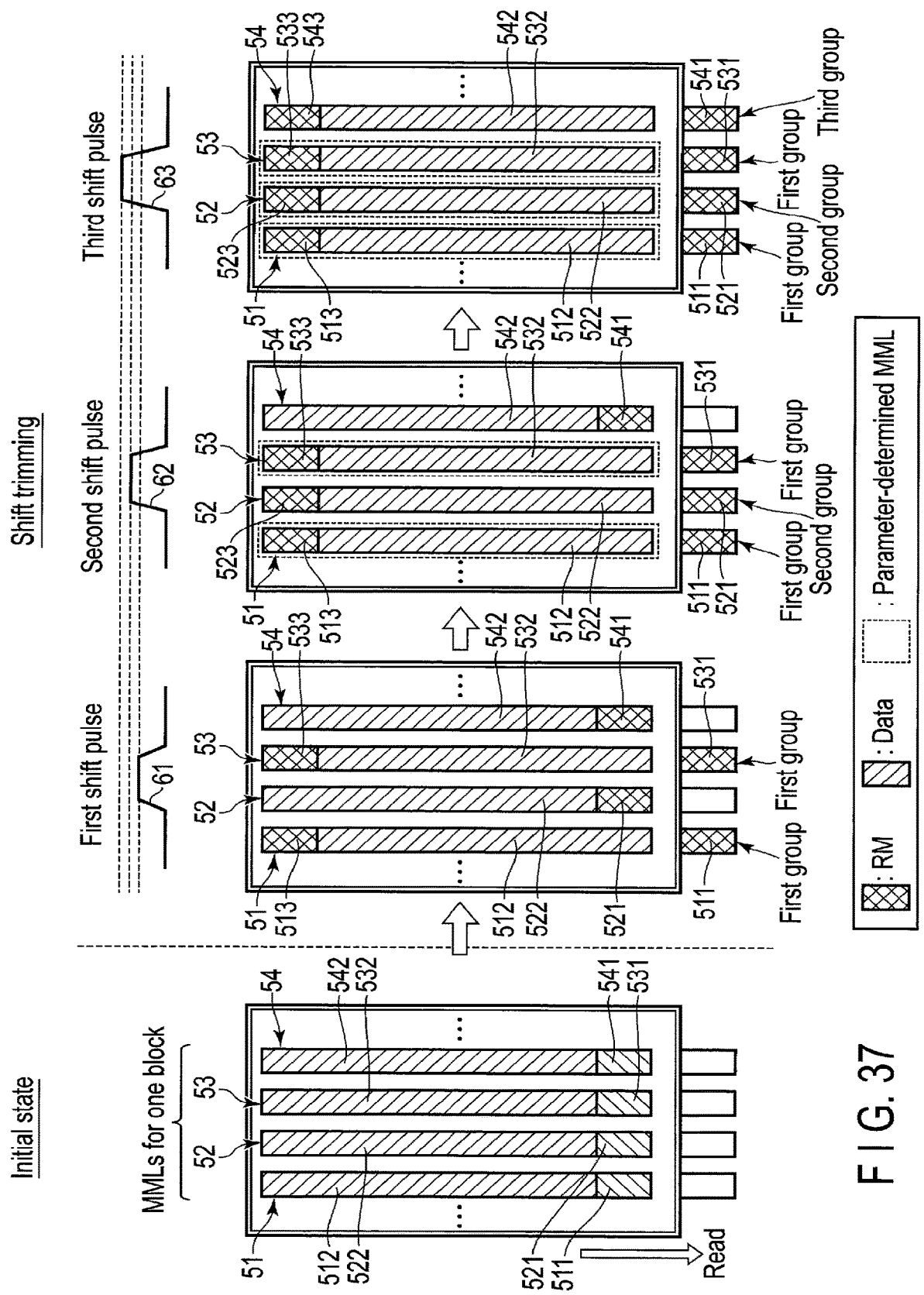
FIG. 37 is a diagram illustrating a first example of a parallel read/write operation including shift trimming for a block.
Figure 38:
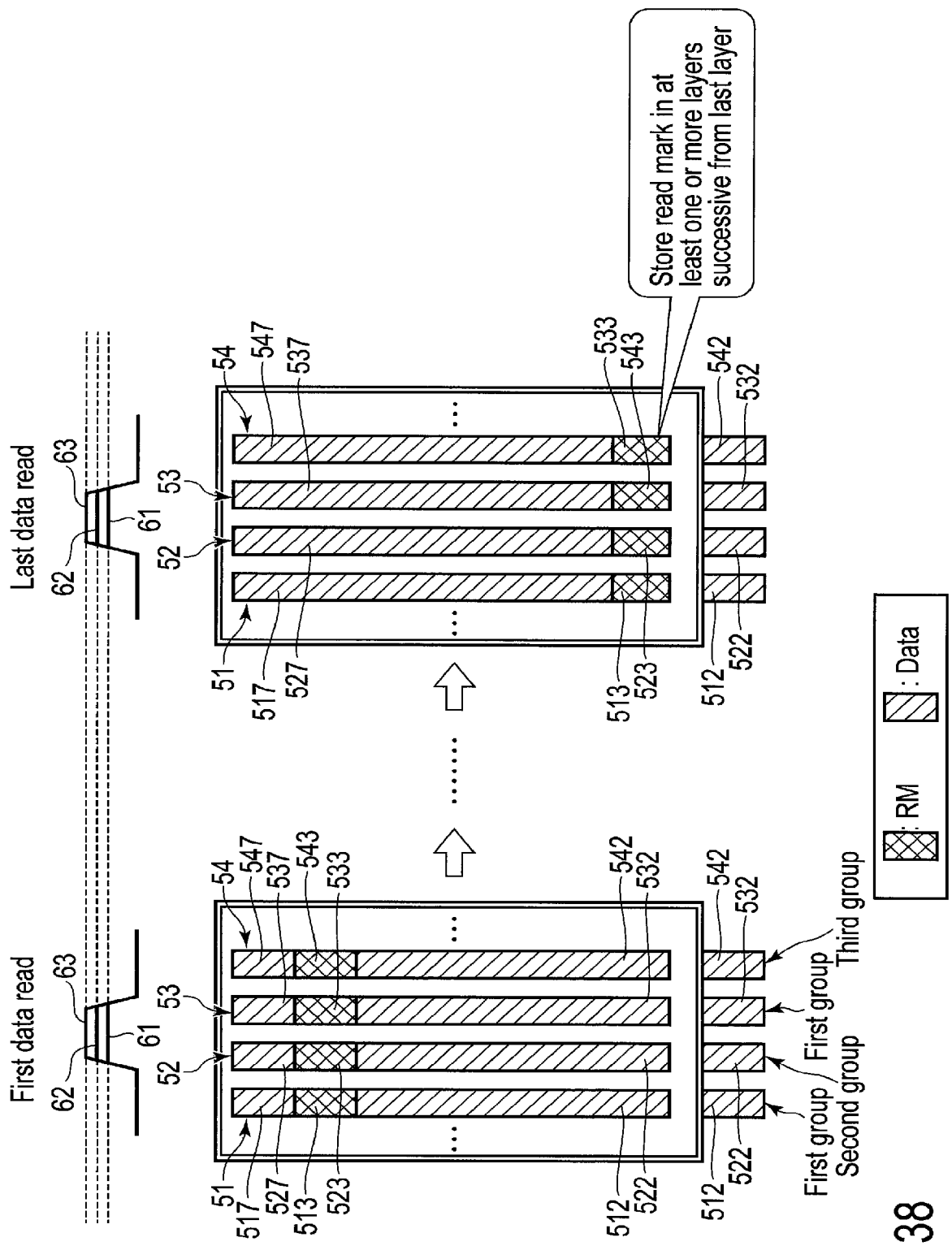
FIG. 38 is a diagram illustrating an example of the parallel read/write operation subsequent to FIG. 37.

FIGS. 37 and 38 illustrate an example of a parallel read/write operation including shift trimming for a block. The parallel read/write operation is an operation of executing, when reading of the block is requested, the read operation on the block and the write operation on the block using data, which is to be written and is prepared in advance, as input data, in parallel.

FIG. 37 illustrates an example of shift trimming in the parallel read/write operation. This shift trimming is the same as the shift trimming in the read operation illustrated in FIG. 10 and its description is omitted.

The shift control circuit 42 performs this shift trimming to set a shift parameter suitable for each group. Similarly to the example illustrated in FIG. 10, the shift control circuit 42 sets the first shift parameter for the first group to which the MMLs 51 and 53 belong. The first shift parameter is indicative of, for example, the voltage value of the first shift pulse 61. The shift control circuit 42 sets the second shift parameter for the second group to which the MML 52 belongs. The second shift parameter is indicative of, for example, the voltage value of the second shift pulse 62. The shift control circuit 42 sets the third shift parameter for the third group to which the MML 54 belongs. The third shift parameter is indicative of, for example, the voltage value of the third shift pulse 63.

FIG. 38 illustrates an example of the parallel read/write operation for the block after the shift trimming. The shift control circuit 42, the write control circuit 43, and the read control circuit 45 execute in parallel writing of write data 517, 527, 537, and 547 into the MMLs 51, 52, 53, and 54 and reading of the data 512, 522, 532, and 542 from the MMLs 51, 52, 53, and 54, by using the shift parameters set for the respective groups.

That is, the shift control circuit 42, the write control circuit 43, and the read control circuit 45 read the data 512 and 532 from the MMLs 51 and 53 belonging to the first group while writing the write data 517 and 537 into the MMLs 51 and 53, by using the first shift parameter. The shift control circuit 42, the write control circuit 43, and the read control circuit 45 read the data 522 from the MML 52 belonging to the second group while writing the write data 527 to the MML 52, by using the second shift parameter. In addition, the shift control circuit 42, the write control circuit 43, and the read control circuit 45 read the data 542 from the MML 54 belonging to the third group while writing the write data 547 to the MML 54, by using the third shift parameter.

In the example illustrated in FIG. 38, for example, the shift control circuit 42 can control to apply the first shift pulse 61 to the MMLs 51 and 53 belonging to the first group, to apply the second shift pulse 62 to the MML 52 belonging to the second group, and to apply the third shift pulse 63 to the MML 54 belonging to the third group, by using the write data 517, 527, 537, and 547 as the input data. The shift control circuit 42 can apply the first shift pulse 61, the second shift pulse 62, and the third shift pulse 63 to the respective MMLs 51, 52, 53, and 54 in parallel (or simultaneously). The shift control circuit 42 repeats the application of the shift pulses 61, 62, and 63 until all of the write data 517, 527, 537, and 547 are written into the MMLs 51, 52, 53, and 54 and all of the data 512, 522, 532, and 542 are read from the MMLs 51, 52, 53, and 54.

Upon completion of the writing of the write data 517, 527, 537, and 547 and the reading of the data 512, 522, 532, and 542, each of the MMLs 51, 52, 53, and 54 become in a state in which each of the RMs 513, 523, 533, and 543 is stored in one or more layers successive from the last layer and each write data 517, 527, 537, and 547 is stored in the other layers. The shift control circuit 42 uses the RMs 513, 523, 533, and 543 when executing the shift trimming for this block next time.

According to the above-described parallel read/write operation in the magnetic domain wall shift memory 3, the writing of the write data 517, 527, 537, and 547 and the reading of the data 512, 522, 532, and 542 can be executed in parallel by using the shift parameters suitable for the respective MMLs 51, 52, 53, and 54. In addition, the RMs 513, 523, 533, and 543 for next shift trimming can be stored in the respective MMLs 51, 52, 53, and 54 in which the parallel read/write operation is completed.

<Parallel Read/Write Operation Including Shift Trimming and Write Verify>

Figure 39:
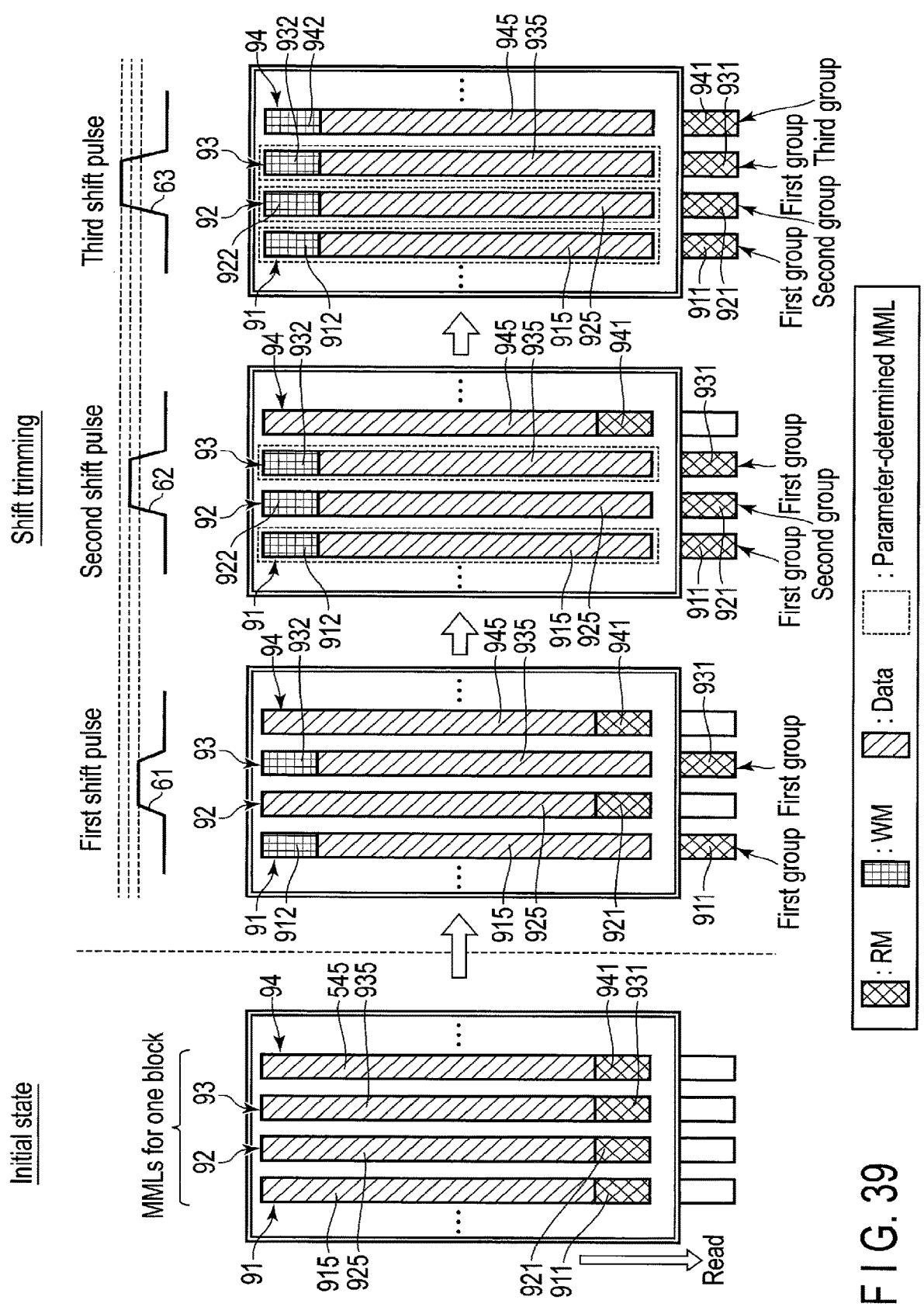
FIG. 39 is a diagram illustrating an example of a parallel read/write operation including shift trimming and write verify for a block.
Figure 40:
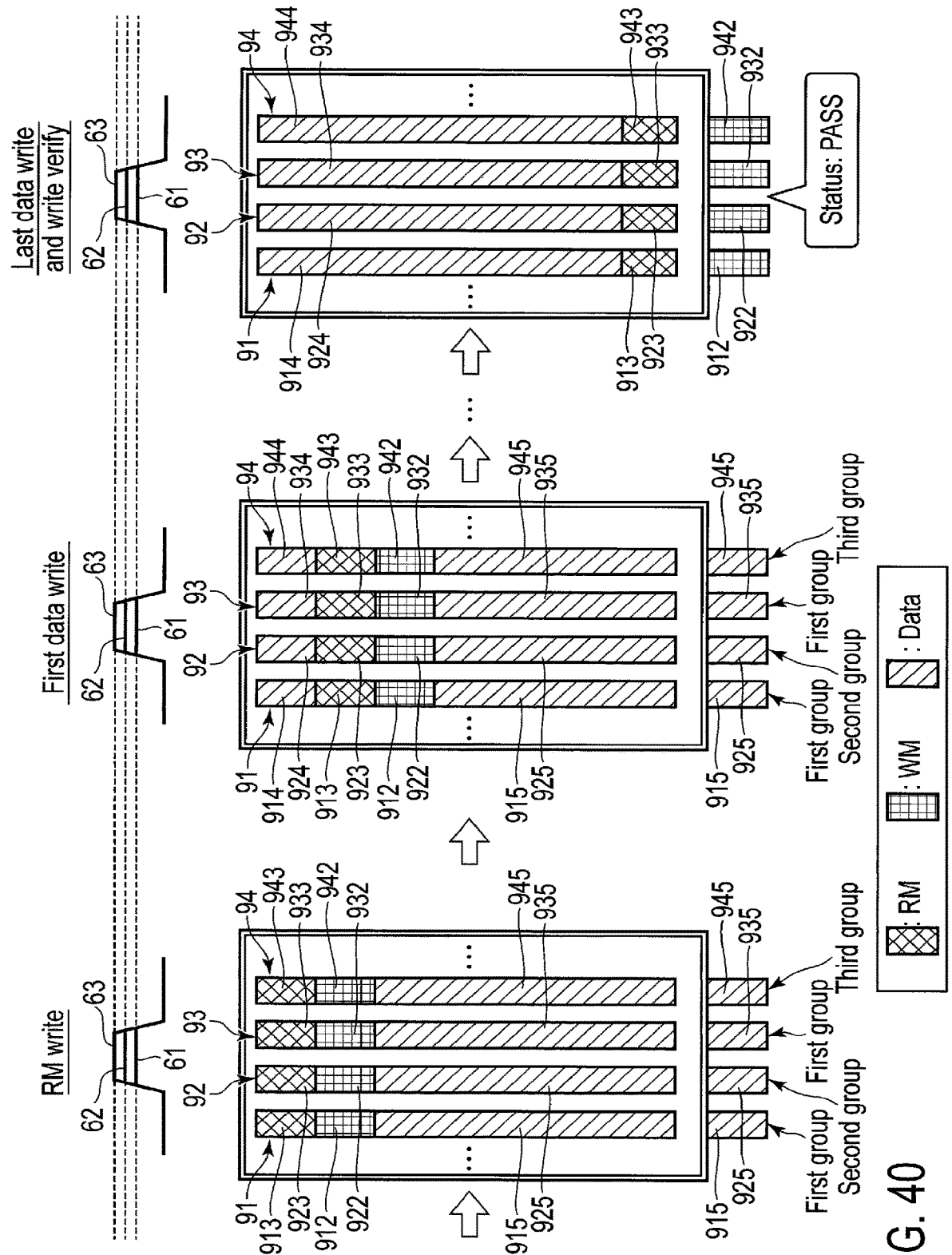
FIG. 40 is a diagram illustrating an example where the parallel read/write operation including shift trimming and write verify for the block is successful.

FIGS. 39, 40, and 41 illustrate an example of a parallel read/write operation including shift trimming and write verify for a block. An example that the block is composed of four MMLs 91, 92, 93, and 94 will be described, but the block may include any number of MMLs. The size of data to be written in the operation has a size obtained by subtracting the data size corresponding to four RMs stored in the four MMLs 91, 92, 93, and 94 from the block size. In addition, an RM and a WM used in the operation is assumed to have the same data size.

FIG. 39 illustrates an example of shift trimming in the parallel read/write operation. This shift trimming is the same as the shift trimming in the write operation illustrated in FIG. 32, except for storing data 915, 925, 935, and 945 in layers other than the layers in which the RMs 911, 921, 931, and 941 are stored, in the initial-state MMLs 91, 92, 93, and 94.

The shift control circuit 42 performs this shift trimming to set a shift parameter suitable for each group. Similarly to the example illustrated in FIG. 32, the shift control circuit 42 sets the first shift parameter for the first group to which the MMLs 91 and 93 belong. The first shift parameter is indicative of, for example, the voltage value of the first shift pulse 61. The shift control circuit 42 sets the second shift parameter for the second group to which the MML 92 belongs. The second shift parameter is indicative of, for example, the voltage value of the second shift pulse 62. The shift control circuit 42 sets the third shift parameter for the third group to which the MML 94 belongs. The third shift parameter is indicative of, for example, the voltage value of the third shift pulse 63.

FIG. 40 illustrates an example where it is determined that the parallel read/write operation for the block after shift trimming is successful, by performing write verify. The shift control circuit 42, the write control circuit 43, and the read control circuit 45 execute in parallel writing of RMs 913, 923, 933, and 943 and write data 914, 924, 934, and 944 into the MMLs 91, 92, 93, and 94 and reading of the data 915, 925, 935, and 945 from the MMLs 91, 92, 93, and 94, by using the shift parameters set for the respective groups.

That is, the shift control circuit 42, the write control circuit 43, and the read control circuit 45 read the data 915 and 935 from the MMLs 91 and 93 belonging to the first group while writing the RMs 913 and 933 and the write data 914 and 934 into the MMLs 91 and 93, by using the first shift parameter. The shift control circuit 42, the write control circuit 43, and the read control circuit 45 read the data 925 from the MML 92 belonging to the second group while writing the RM 923 and the write data 924 into the MML 92, by using the second shift parameter. In addition, the shift control circuit 42, the write control circuit 43, and the read control circuit 45 read the data 945 from the MML 94 belonging to the third group while writing the RM 943 and the write data 944 into the MML 94, by using the third shift parameter.

More specifically, as illustrated in FIG. 40, the shift control circuit 42 applies the shift pulses 61, 62, and 63 set for the respective groups to all the MMLs 91, 92, 93, and 94, by using an RM as input data to each of the MMLs 91, 92, 93, and 94. The number of times the shift control circuit 42 applies the shift pulses 61, 62, and 63 corresponds to the number of layers for the RM. The RMs 913, 923, 933, and 943 set as the input data are written, respectively, into the MMLs 91, 92, 93, and 94 that are normally shifted upon the application of the shift pulses 61, 62, and 63. In addition, the read control circuit 45 reads portions of the data 915, 925, 935, and 945 from the MMLs 91, 92, 93, and 94 that are normally shifted upon the application of the shift pulses 61, 62, and 63, via sense latches in the output unit group 44.

Then, the shift control circuit 42 applies the shift pulses 61, 62, and 63 to all the MMLs 91, 92, 93, and 94, by using write data portions as input data to the respective MMLs 91, 92, 93, and 94. The number of times the shift control circuit 42 applies the shift pulses 61, 62, and 63 corresponds to the number of layers of each write data portion. The write data portions 914, 924, 934, and 944 are written into the MMLs 91, 92, 93, and 94 that are normally shifted upon the application of the shift pulses 61, 62, and 63. In addition, the read control circuit 45 further reads portions of the data 915, 925, 935, and 945 from the MMLs 91, 92, 93, and 94 that are normally shifted upon the application of the shift pulses 61, 62, and 63, via the sense latches in the output unit group 44.

Similarly, the shift control circuit 42 applies the shift pulses 61, 62, and 63 to all the MMLs 91, 92, 93, and 94, by using the remaining write data portions as input data to the respective MMLs 91, 92, 93, and 94. The number of times the shift control circuit 42 applies the shift pulses 61, 62, and 63 corresponds to the number of layers of each remaining write data portion All the write data 914, 924, 934, and 944 is written into the MMLs 91, 92, 93, and 94 that are normally shifted upon the application of the shift pulses 61, 62, and 63.

In addition, the read control circuit 45 reads the remaining portions of the data 915, 925, 935, and 945 from the MMLs 91, 92, 93, and 94 that are normally shifted upon the application of the shift pulses 61, 62, and 63, and detects the WMs 912, 922, 932, and 942 from data read later. That is, the data read from the MMLs 91, 92, 93, and 94 match the WMs 912, 922, 932, and 942, respectively. The read control circuit 45 determines that the parallel read/write operation is successful, on the basis of the detection of the WMs 912, 922, 932, and 942 from the read data. Then, the read control circuit 45 sets PASS in a status indicative of the result of the parallel read/write operation.

Furthermore, the RMs 913, 923, 933, and 943 written prior to the write data 914, 924, 934, and 944 reach the last layers of the MMLs 91, 92, 93, and 94. That is, when the write data 914, 924, 934, and 944 is written and the success is determined by performing write verify, each of the MMLs 91, 92, 93, and 94 becomes in a state in which each of the RMs 913, 923, 933, and 943 are stored in one or more layers successive from the last layer and each write data 914, 924, 934, and 944 is stored in the other layers. The shift control circuit 42 uses the RMs 913, 923, 933, and 943 when executing the shift trimming for this block next time.

According to the above-described parallel read/write operation in the magnetic domain wall shift memory 3, the writing of the WMs 912, 922, 932, and 942 and the write data 914, 924, 934, and 944 and the reading of the data 915, 925, 935, and 945 can be executed in parallel by using the shift parameters suitable for the respective MMLs 91, 92, 93, and 94. In addition, write verify to determine whether the write operation is successful by using the WMs 912, 922, 932, and 942 can be executed. Furthermore, the RMs 513, 523, 533, and 543 for next shift trimming can be stored in the respective MMLs 51, 52, 53, and 54 in which the parallel read/write operation is completed.

In contrast, FIG. 41 illustrates an example where it is determined that the parallel read/write operation for the block after shift trimming is unsuccessful, by performing write verify.

The shift control circuit 42 applies the shift pulses 61, 62, and 63 set for the respective groups to all the MMLs 91, 92, 93, and 94, by using an RM as input data to each of the MMLs 91, 92, 93, and 94. The number of times the shift control circuit 42 applies the shift pulses 61, 62, and 63 corresponds to the number of layers of the RM. The RMs 913, 923, and 943 set as the input data are written, respectively, into the MMLs 91, 92, and 94 that are normally shifted upon the application of the shift pulses 61, 62, and 63. In addition, the read control circuit 45 reads portions of the data 915, 925, and 945 from the MMLs 91, 92, and 94 that are normally shifted upon the application of the shift pulses 61, 62, and 63, via sense latches in the output unit group 44.

In contrast, in the MML 93 which is not normally shifted upon the application of the shift pulse 63, the WM is not correctly written, but data 93E including an error is written, and a portion of the data 93E including an error is read via a sense latch in the output unit group 44.

Then, the shift control circuit 42 applies the shift pulses 61, 62, and 63 to all the MMLs 91, 92, 93, and 94, by using write data portions as input data to the respective MMLs 91, 92, 93, and 94. The number of times the shift control circuit 42 applies the shift pulses 61, 62, and 63 corresponds to the number of layers of each write data portion. The write data 914, 924, and 944 is written into the MMLs 91, 92, and 94 that are normally shifted upon the application of the shift pulses 61, 62, and 63. In addition, the read control circuit 45 further reads potions of the data 915, 925, and 945 from the MMLs 91, 92, and 94 that are normally shifted upon the application of the shift pulses 61, 62, and 63, via the sense latches in the output unit group 44.

In contrast, in the MML 93 which is not normally shifted upon the application of the shift pulse 63, the WM is not correctly written, but data 93E including an error is written, and a portion of the data 93E including an error is read via the sense latch in the output unit group 44.

Similarly, the shift control circuit 42 applies the shift pulses 61, 62, and 63 to all the MMLs 91, 92, 93, and 94, by using the remaining write data portions as input data to the respective MMLs 91, 92, 93, and 94. The number of times the shift control circuit 42 applies the shift pulses 61, 62, and 63 corresponds to the number of layers of each remaining write data portion. All the write data 914, 924, and 944 is written into the MMLs 91, 92, and 94 that are normally shifted upon the application of the shift pulses 61, 62, and 63.

In addition, the read control circuit 45 reads the remaining portions of the data 915, 925, and 945 from the MMLs 91, 92, and 94 that are normally shifted upon the application of the shift pulses 61, 62, and 63, and detects the WMs 912, 922, and 942 from data read later. That is, the data read from the MMLs 91, 92, and 94 match the WMs 912, 922, and 942, respectively. The read control circuit 45 is unable to detect the WM from the data 93E read from the MML 93.

When the number of MMLs from which data corresponding to the WM cannot be read exceeds a threshold value, the read control circuit 45 determines that the write operation is unsuccessful. For example, when the WM cannot be detected from the data read from the MML 93 of the four MMLs 91, 92, 93, and 94 and the threshold value is zero, the read control circuit 45 determines that the write operation is unsuccessful. Then, the read control circuit 45 sets FAIL in a status indicative of the result of the write operation.

The read control circuit 45 may execute write verify using the result of performing an error correction process on the data read from the MMLs 91, 92, 93, and 94 without using the WMs. More specifically, the read control circuit 45 performs the error correction process using an ECC on the data read from the MMLs 91, 92, 93, and 94. Then, the read control circuit 45 acquires the number of MMLs in which errors have occurred, from the result of the error correction process. The read control circuit 45 determines that the write operation is successful when the number of MMLs in which errors have occurred is smaller than or equal to a threshold value, and determines that the write operation is unsuccessful when the number of MMLs in which errors have occurred exceeds the threshold value.

In a case where WMs are not used, since data corresponding to the number of layers for the WMs is written, the memory area can be used effectively.

<Write Operation Including Shift Trimming for Magnetic Domain Wall Shift Memory in Last-In First-Out Method>

Figure 42:
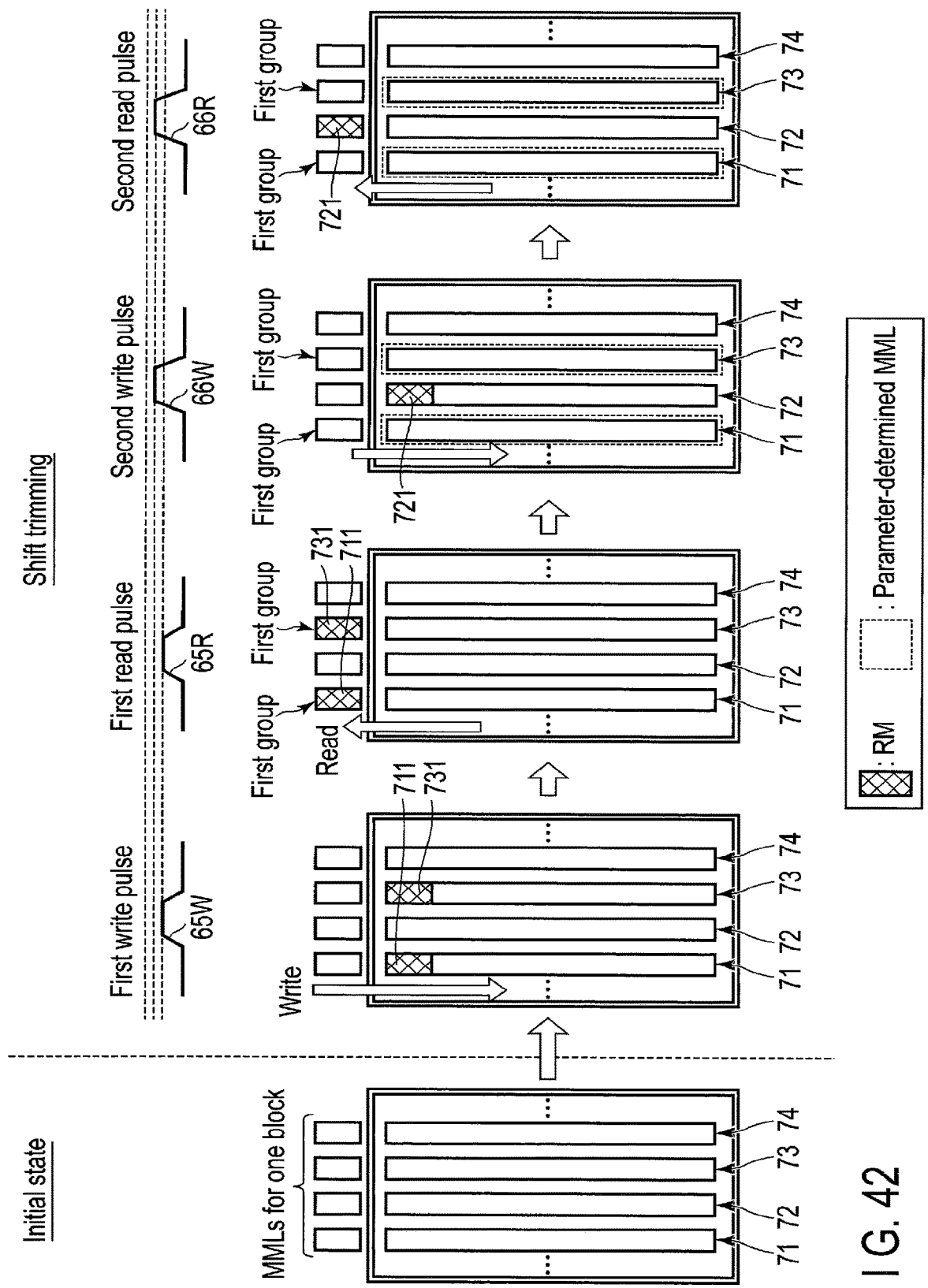
FIG. 42 is a diagram illustrating a second example of a write operation including shift trimming for a block.
Figure 43:
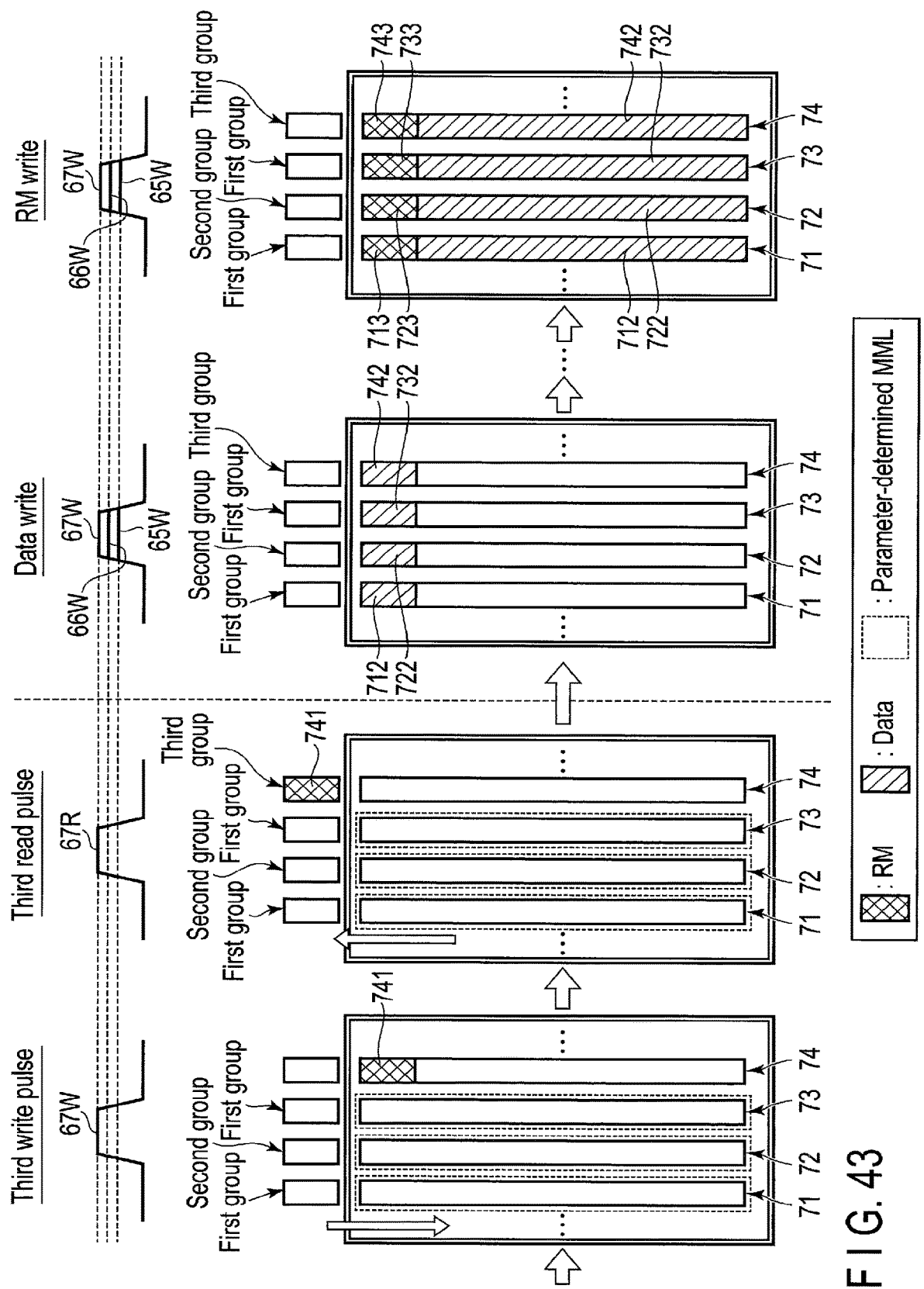
FIG. 43 is a diagram illustrating an example of the write operation subsequent to FIG. 42.

FIGS. 42 and 43 illustrate an example of performing a write operation including shift trimming, for a block in the magnetic domain wall shift memory 3 in the last-in first-out method. An example that the block is composed of four MMLs 71, 72, 73, and 74 will be described, but the block may include any number of MMLs. A rectangle illustrated above each of the MMLs 71, 72, 73, and 74 corresponds to a sense latch in the input/output unit group 31. Each sense latch temporarily stores the read result from the corresponding MML.

As described above, in the block in the magnetic domain wall shift memory 3 in the last-in first-out method, when a write operation of writing data is executed, written data is shifted in the direction from the first layer to the last layer (i.e., the first direction) in units of layer and the write data is written into the first layer. In addition, when a read operation of reading data from this block is executed, the data written in the first layer is read, and the data written in each layer is shifted in a direction from the last layer to the first layer (i.e., a second direction) in units of layer.

In the magnetic domain wall shift memory 3 in the first-in first-out method, an applicable block of shift trimming is a block in which an RM is stored in one or more layers successive from the last layer of read target. In contrast, an applicable block of shift trimming in the magnetic domain wall shift memory 3 in the last-in first-out method is a block in which an RM is stored in one or more layers successive from the first layer of read target. The first layer of the read target is the first layer that is the read target in each MML. Each MML may include a dummy layer at an upper part of the first layer of the read target. The dummy layer is the first physical layer, but does not store valid data or an RM and is not a read target layer.

As illustrated in FIG. 42, the block in an initial state is a free block where no RM or valid data is stored. The shift control circuit 32 and the read/write control circuit 33 execute shift trimming for the block in the initial state. Upon reading the RM from an MML, the shift control circuit 32 and the read/write control circuit 33 determine a shift parameter to be used to shift data stored in layers in the MML, in the first direction or in the second direction.

More specifically, the shift control circuit 32 first applies a first write pulse 65W for write shift to all the MMLs 71, 72, 73, and 74, by using an RM as input data to each of the MMLs 71, 72, 73, and 74. The number of times the shift control circuit 32 applies the first write pulse 65W corresponds to the number of layers of the RM. The RMs 711 and 731 are written into the MMLs 71 and 73 that are normally shifted upon the application of the first write pulse 65W.

Next, the shift control circuit 32 applies a first read pulse 65R for read shift to all the MMLs 71, 72, 73, and 74. The number of times the shift control circuit 32 applies the first read pulse 65R corresponds to the number of layers of the RM. The first read pulse 65R and the first write pulse 65W have the same voltage value. The read/write control circuit 33 detects the RMs 711 and 731 from read data that is read via the sense latches in the input/output unit group 31 upon the application of the first read pulse 65R.

The shift control circuit 32 creates a first group including the MMLs 71 and 73 in which the detected RMs 711 and 731 were stored respectively. The shift control circuit 32 sets a first shift parameter indicative of the first read pulse 65R (or the first write pulse 65W) for the first group. The first shift parameter includes, for example, the voltage value of the first read pulse 65R. The first shift parameter suitable for the MMLs 71 and 73 belonging to the first group is thereby determined.

Next, the shift control circuit 32 and the read/write control circuit 33 execute shift trimming for the remaining MMLs 72 and 74 excluding the MMLs 71 and 73 belonging to the first group (i.e., parameter-determined MMLs). The shift control circuit 32 applies a second write pulse 66W for write shift to the MMLs 72 and 74, by using an RM as input data to each of the MMLs 72 and 74. The number of times the shift control circuit 32 applies the second write pulse 66W corresponds to the number of layers for the RM. The second write pulse 66W is different from the first write pulse 66W. The second write pulse 66W is, for example, a shift pulse having a voltage larger than the first write pulse 65W. The RM 721 is written into the MML 72 that is normally shifted upon the application of the second write pulse 66W.

The shift control circuit 32 applies a second read pulse 66R for read shift to the MMLs 72 and 74. The number of times the shift control circuit 32 applies the second read pulse 66R corresponds to the number of layers of the RM. The second read pulse 66R and the second write pulse 66W have the same voltage value. The read/write control circuit 33 detects the RM 721 from read data that is read via the sense latch in the input/output unit group 31 upon the application of the second read pulse 66R.

The shift control circuit 32 generates a second group including the MML 72 in which the detected RM 721 was stored. The shift control circuit 32 sets a second shift parameter indicative of the second read pulse 66R (or the second write pulse 66W) for the second group. The second shift parameter includes, for example, the voltage value of the second read pulse 66R. The second shift parameter suitable for the MML 72 belonging to the second group is thereby determined.

Furthermore, as illustrated in FIG. 43, the shift control circuit 32 and the read/write control circuit 33 execute shift trimming for the remaining MML 74 excluding the MML 71, 72 and 73 belonging to the first and second groups (i.e., parameter-determined MMLs). The shift control circuit 32 applies a third write pulse 67W for write shift to the MML 74, by using an RM as input data to the MML 74. The number of times the shift control circuit 32 applies the third write pulse 67W corresponds to the number of layers of the RM The third write pulse 67W is different from the first write pulse 65W and the second write pulse 66W. The third write pulse 67W is, for example, a shift pulse having a voltage larger than the second write pulse 66W. The RM 741 is written into the MML 74 that is normally shifted upon the application of the third write pulse 67W.

The shift control circuit 32 applies a third read pulse 67R for read shift to the MML 74. The number of times the shift control circuit 32 applies the third read pulse 67R corresponds to the number of layers of the RM. The third read pulse 67R and the third write pulse 67W have the same voltage value. The read/write control circuit 33 detects the RM 741 from the read data that is read via the sense latch in the input/output unit group 31 upon the application of the third read pulse 67R.

The shift control circuit 32 generates a third group including the MML 74 in which the detected RM 941 was stored. The shift control circuit 32 sets a third shift parameter indicative of the third read pulse 67R (or the third write pulse 67W) for the third group. The third shift parameter includes, for example, the voltage value of the third read pulse 67R. The third shift parameter suitable for the MML 74 belonging to the third group is thereby determined.

Then, the shift control circuit 32 and the read/write control circuit 33 write data 712, 722, 732, and 742, which is to be written, into the MMLs 71, 72, 73, and 74, by using the shift parameters set for the respective groups. That is, the shift control circuit 32 and the read/write control circuit 33 write the data 712 and 732 into the MMLs 71 and 73 belonging to the first group, by using the first shift parameter, write the data 722 into the MML 72 belonging to the second group, by using the second shift parameter, and write the data 742 to the MML 74 belonging to the third group, by using the third shift parameter.

The shift control circuit 32 may select one or more MMLs from the MMLs 71, 72, 73, and 74 and apply a specific shift pulse to the selected MMLs. In addition, the shift control circuit 32 may apply different shift pulses to the MMLs 71, 72, 73, and 74 in parallel. The shift control circuit 32 can control applications of the shift pulses to the MMLs in parallel by using a switch circuit and the like.

In the example illustrated in FIG. 43, for example, the shift control circuit 32 may control to apply the first write pulse 65W to the MMLs 71 and 73 belonging to the first group, to apply the second write pulse 66W to the MML 72 belonging to the second group, and to apply the third write pulse 67W to the MML 74 belonging to the third group, by using the write data 712, 722, 732, and 742 as the input data. The shift control circuit 32 may apply the first write pulse 65W, the second write pulse 66W, and the third write pulse 67W to the respective MMLs 71, 72, 73, and 74 in parallel (or simultaneously). The shift control circuit 32 repeats the application of the write pulses 65W, 66W, and 67W until all of the write data 712, 722, 732, and 742 are written into the MMLs 71, 72, 73, and 74.

Then, the shift control circuit 32 and the read/write control circuit 33 write RMs 713, 723, 733, and 743 into the MMLs 71, 72, 73, and 74, by using the shift parameters set for the respective groups. More specifically, the shift control circuit 32 applies the write pulses 65W, 66W, and 67W to the MML 71, 72, 73, and 74, by using the RMs 713, 723, 733, and 743 as input data. The number of times the shift control circuit 32 applies the write pulses 65W, 66W, and 67W corresponds to the number of layers for each RM. Each of the MMLs 71, 72, 73, and 74 become in a state where each of the RMs 713, 723, 733, and 743 is stored in one or more layers successive from the first layer. The shift control circuit 32 may use the RMs 713, 723, 733, and 743 when executing the shift trimming for this block next time.

According to the above-described write operation in the magnetic domain wall shift memory 3 in the last-in first-out method, the write data 712, 722, 732, and 742 and the RMs 713, 723, 733, and 743 can be written by using the shift parameters suitable for the respective MMLs 71, 72, 73, and 74.

Figure 44:
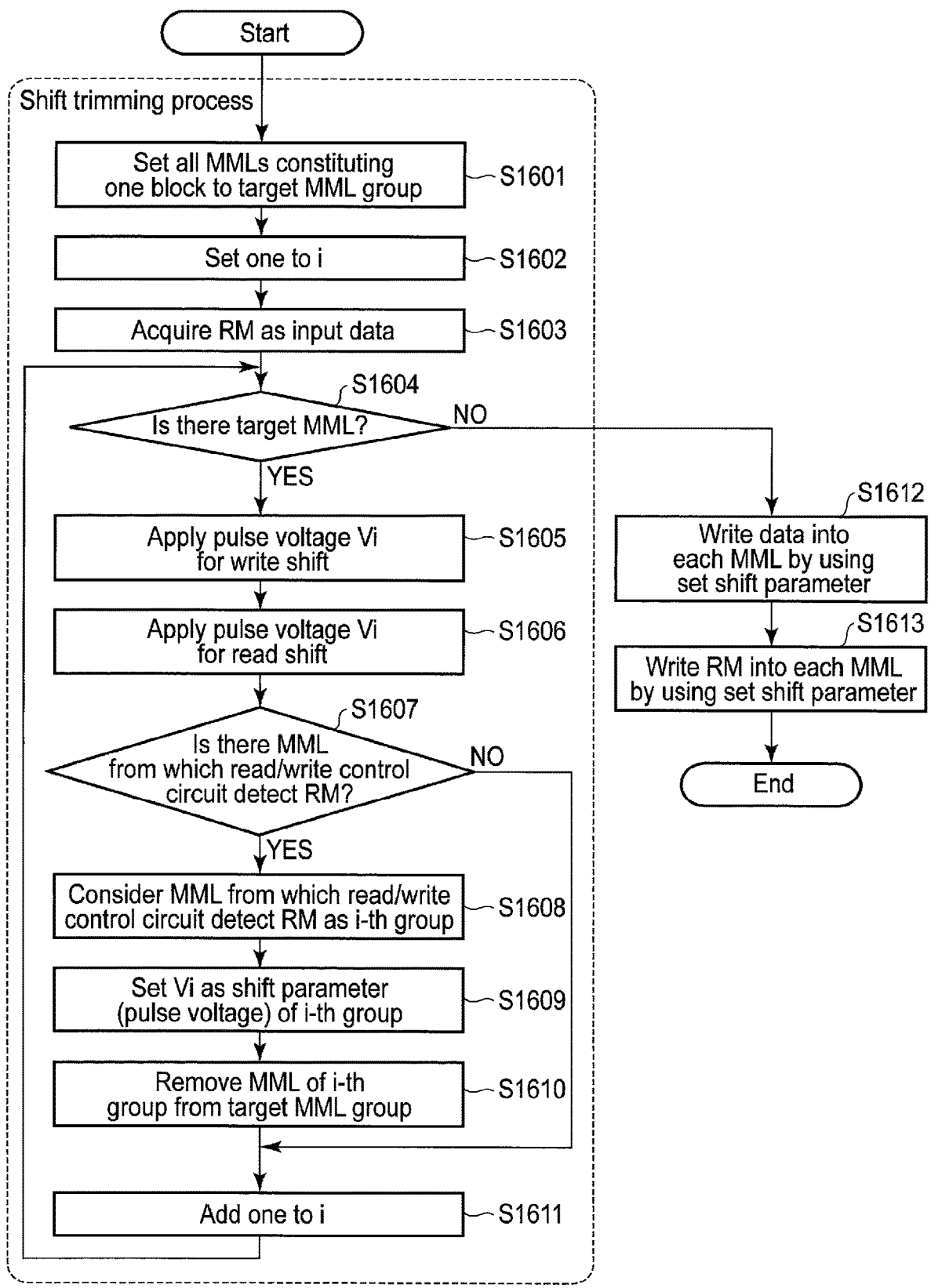
FIG. 44 is a flowchart illustrating an example of the procedure of a write process including a shift trimming process that is executed in the magnetic domain wall shift memory in the last-in first-out method.

FIG. 44 is a flowchart illustrating an example of the procedure of a write process including a shift trimming process that is executed in the magnetic domain wall shift memory 3 in the last-in first-out method. It is assumed here that one write target block is determined. Each MML constituting the write target block is an MML to which shift trimming is applicable. That is, each MML stores an RM in one or more layers successive from the first layer. An example that each RM has a size corresponding to k layers will be described below.

The shift control circuit 32 sets all the MMLs constituting the write target block to a shift trimming target MML group (step S1601). The shift control circuit 32 sets one to a variable i (step S1602). The read/write control circuit 33 acquires input data that is an RM, and sets the data in the input/output unit group 31 (step S1603).

The shift control circuit 32 determines whether there is an MML of shift trimming target (step S1604). When there is an MML of shift trimming target (YES in step S1604), the shift control circuit 32 applies, to the target MML group, a pulse voltage Vi for write shift k times (step S1605). The RM set in the input/output unit group 31 is written into each MML on which write shift is performed upon the application of the pulse voltage Vi. In contrast, no RM is written into each MML on which write shift is not performed upon the application of the pulse voltage Vi. The pulse voltage Vi becomes larger as the variable i is larger, and increases by, for example, a specific value as the variable i increases by one.

Then, the shift control circuit 32 applies, to the target MML group, the pulse voltage Vi for read shift k times (step S1606). In each MML on which read shift is performed upon the application of the pulse voltage Vi, an RM is read via the sense latch in the input/output unit group 31 by the read/write control circuit 33. In contrast, an RM is not read in each MML on which read shift is not performed upon the application of the pulse voltage Vi.

The shift control circuit 32 determines whether there is an MML from which an RM has been detected upon the application of the pulse voltage Vi (step S1607). When there is an MML from which an RM has been detected (YES in step S1607), the shift control circuit 32 considers the MML as an i-th group (step S1608). The shift control circuit 32 sets the pulse voltage Vi as a shift parameter of the i-th group (step S1609). That is, the shift control circuit 32 determines the pulse voltage Vi to be applied to each MML belonging to the i-th group. Then, the shift control circuit 32 removes the MML belonging to the i-th group from the target MML group (step S1610).

In contrast, when there is no MML from which an RM has been detected (NO in step S1607), the procedure from step S1608 to step S1610 is skipped.

Then, the shift control circuit 32 adds one to the variable i (step S1611), returns to step S1604, and executes shift trimming for the target MML group using a new pulse voltage Vi.

In addition, when there is no MML of the shift trimming target (NO in step S1604), the shift control circuit 32 and the read/write control circuit 33 write data, which is to be written, into each MML in the write target block by using the shift parameter set for each group (i.e., set for an MML belonging to each group) (step S1612). More specifically, the shift control circuit 32 applies the pulse voltage set for each group to each MML, for write shift. Upon the application of this pulse voltage, the write data set in the input unit group 31 is written into the write target block.

The above-described procedure from step S1601 to step S1610 is the shift trimming process for determining the shift parameter suitable for each MML.

According to the above-described write process in the magnetic domain wall shift memory 3 in the last-in first-out method, the RMs and the write data can be written into the write target block by using the shift parameters suitable for the respective MMLs.

\<Read Operation Including Shift Trimming for Magnetic Domain Wall Shift Memory in Last-In First-Out Method\>

FIG. 45 illustrates an example of performing a write operation including shift trimming, for a block in the magnetic domain wall shift memory 3 in the last-in first-out method. An example that the block is composed of four MMLs 75, 76, 77, and 78 will be described, but the block may include any number of MMLs.

As illustrated in FIG. 45, the block in an initial state is an applicable block of shift trimming. As described above, in the magnetic domain wall shift memory 3 in the first-in first-out method, an applicable block of shift trimming is a block in which an RM is stored in one or more layers successive from the last layer of read target. In contrast, the applicable block of shift trimming in the magnetic domain wall shift memory 3 in the last-in first-out method is a block in which an RM is stored in one or more layers successive from the first layer.

That is, the MML 75 stores an RM 751 in one or more layers successive from the first layer, of layers included in the MML 75. The MML 76 stores an RM 761 in one or more layers successive from the first layer, of layers included in the MML 76. The MML 77 stores an RM 771 in one or more layers successive from the first layer, of layers included in the MML 77. The MML 78 stores an RM 781 in one or more layers successive from the first layer, of layers included in the MML 78.

In addition, the MML 75 stores data 752 in layers lower than the layers in which the RM 751 is stored. The MML 76 stores data 762 in layers lower than the layers in which the RM 761 is stored. The MML 77 stores data 772 in layers lower than the layers in which the RM 771 is stored. The MML 78 stores data 782 in layers lower than the layers in which the RM 781 is stored.

The shift control circuit 42 and the read control circuit 45 execute shift trimming for the block in the initial state.

More specifically, the shift control circuit 32 first applies a first read pulse 65R for read shift to all the MMLs 75, 76, 77, and 78. The number of times the shift control circuit 32 applies the first read pulse 65R corresponds to the number of layers for the RM. The read/write control circuit 33 detects the RMs 751 and 771 from read data that is read via the sense latches in the input/output unit group 31 upon the application of the first read pulse 65R.

The shift control circuit 32 creates a first group including the MMLs 75 and 77 in which the detected RMs 751 and 771 are stored respectively. The shift control circuit 32 sets a first shift parameter indicative of the first shift pulse 65R for the first group. The first shift parameter includes, for example, the voltage value of the first read pulse 65R. The first shift parameter suitable for the MMLs 75 and 77 belonging to the first group is thereby determined.

Next, the shift control circuit 32 and the read/write control circuit 33 execute shift trimming for the remaining MMLs 76 and 78 excluding the MMLs 75 and 77 belonging to the first group (i.e., parameter-determined MMLs). The shift control circuit 32 applies a second read pulse 66R for read shift to the MMLs 76 and 78. The number of times the shift control circuit 32 applies the second read pulse 66R corresponds to the number of layers of the RM. The second read pulse 66R is different from the first read pulse 65R. The second read pulse 66R is, for example, a shift pulse having a voltage larger than the first read pulse 65R. The read/write control circuit 33 detects the RM 761 from read data that is read via the sense latch in the input/output unit group 31 upon the application of the second read pulse 66R.

The shift control circuit 32 creates a third group including the MML 76 in which the detected RM 761 was stored. The shift control circuit 32 sets a second shift parameter indicative of the second shift pulse 66R for the second group. The second shift parameter includes, for example, the voltage value of the second read pulse 66R. The second shift parameter suitable for the MML 76 belonging to the second group is thereby determined.

Furthermore, the shift control circuit 32 and the read/write control circuit 33 execute shift trimming for the remaining MML 78 excluding the MMLs 75, 76, and 77 belonging to the first and second groups (i.e., parameter-determined MMLs). The shift control circuit 32 applies a third read pulse 67R for read shift to the MML 78. The number of times the shift control circuit 32 applies the third read pulse 67R corresponds to the number of layers for the RM. The third read pulse 67R is different from the first read pulse 65R and the second read pulse 66R. The third read pulse 67R is, for example, a shift pulse having a voltage larger than the second read pulse 66R. The read/write control circuit 33 detects the RM 781 from read data that is read via the sense latch in the input/output unit group 31 upon the application of the third read pulse 67R.

The shift control circuit 32 creates a third group including the MML 78 in which the detected RM 781 was stored. The shift control circuit 32 sets a third shift parameter indicative of the third shift pulse 67R for the third group. The third shift parameter includes, for example, the voltage value of the third read pulse 67R. The third shift parameter suitable for the MML 78 belonging to the third group is thereby determined.

Then, the shift control circuit 32 and the read/write control circuit 33 read the data 752, 762, 772, and 782 from the MMLs 75, 76, 77, and 78, by using the shift parameters set for the respective groups. That is, the shift control circuit 32 and the read/write control circuit 33 read the data 752 and 772 from the MMLs 75 and 77 belonging to the first group, by using the first shift parameter, read the data 762 from the MML 76 belonging to the second group, by using the second shift parameter, and read the data 782 from the MML 78 belonging to the third group, by using the third shift parameter.

As described above, the shift control circuit 32 may select one or more MMLs from the MMLs 75, 76, 77, and 78 and apply a specific shift pulse to the selected MMLs. In addition, the shift control circuit 32 may apply different shift pulses to the MMLs 75, 76, 77, and 78 in parallel.

In the example illustrated in FIG. 45, for example, the shift control circuit 42 may control to apply the first read pulse 65R to the MMLs 75 and 77 belonging to the first group, to apply the second read pulse 66R to the MML 76 belonging to the second group, and to apply the third shift pulse 67R to the MML 78 belonging to the third group. The shift control circuit 32 may apply the first read pulse 65R, the second read pulse 66R, and the third read pulse 67R to the respective MMLs 75, 76, 77, and 78 in parallel (or simultaneously). The shift control circuit 32 repeats the application of the read pulses 65R, 66R, and 67R until all of the data 752, 762, 772, and 782 is read from the MMLs 75, 76, 77, and 78.

According to the above-described read operation in the magnetic domain wall shift memory 3 of the last-in first-out method, the data 752, 762, 772, and 782 can be read by using the shift parameters suitable for the respective MMLs 75, 76, 77, and 78.

FIG. 46 is a flowchart illustrating an example of the procedure of a read process including a shift trimming process that is executed in the magnetic domain wall shift memory 3 in the last-in first-out method. It is assumed here that one read target block is specified. Each MML constituting the read target block is an MML to which shift trimming is applicable. That is, each MML stores an RM in one or more layers successive from the first layer. An example that each RM has a size corresponding to k layers will be described below.

The shift control circuit 32 sets all the MMLs constituting the read target block to a shift trimming target MML group (step S1701). The shift control circuit 32 sets one to a variable i (step S1702).

The shift control circuit 32 determines whether there is an MML of shift trimming target (step S1703). When there is an MML of shift trimming target (YES in step S1703), the shift control circuit 32 applies, to the target MML group, a pulse voltage Vi for read shift k times (step S1704). In each MML on which read shift is performed upon the application of the pulse voltage Vi, an RM is read via the sense latch in the input/output unit group 31 by the read/write control circuit 33. In contrast, an RM is not detected in each MML on which read shift is not performed upon the application of the pulse voltage Vi.

The shift control circuit 32 determines whether there is an MML from which data corresponding to an RM has been read by the read/write control circuit 33 upon the application of the pulse voltage Vi (step S1705). When there is an MML from which data corresponding to an RM has been read (YES in step S1705), the shift control circuit 32 considers the MML as an i-th group (step S1706). The shift control circuit 32 sets the pulse voltage Vi as a shift parameter of the i-th group (step S1707). That is, the shift control circuit 32 determines the pulse voltage Vi to be applied to each MML belonging to the i-th group. Then, the shift control circuit 32 removes the MML belonging to the i-th group from the target MML group (step S1708).

In contrast, when there is no MML from which data corresponding to an RM has been read (NO in step S1705), the procedure from step S1706 to step S1708 is skipped.

Then, the shift control circuit 32 adds one to the variable i (step S1709), returns to step S1703, and executes shift trimming for the target MML group using a new pulse voltage Vi.

In addition, when there is no MML of the shift trimming target (NO in step S1703), the shift control circuit 32 and the read/write control circuit 33 read data from each MML in the read target block by using the shift parameter set for each group (i.e., set for the MML belonging to each group) (step S1710). More specifically, the shift control circuit 32 applies a pulse voltage set for each group to each MML, for read shift. The read/write control circuit 33 reads data output from each of the MMLs upon the application of this pulse voltage, via the sense latch in the input/output unit group 31.

The procedure from step S1701 to step S1709 is the shift trimming process for determining the shift parameter suitable for each MML.

According to the above-described read process in the magnetic domain wall shift memory 3 in the last-in first-out method, the data can be read from the read target block by using the shift parameters suitable for the respective MMLs. The shift control circuit 32 and the read/write control circuit 33 may write a new RM, which is used when a next shift trimming process is executed, into the read target block after the reading.

<Improvement of Error Correction Capability Using RM>

FIGS. 47A and 47B illustrate an example of data returned by the magnetic domain wall shift memory 3 to the memory controller 2, when executing a read operation for one block. An example that the block includes sixteen MMLs (i.e., MML0 to MML15) and each of the MMLs includes eighteen layers will be described as illustrated in FIG. 47A. Two layers successive from the last layer, of the eighteen layers, are layers for storing an RM. The remaining 16 layers at upper positions than the two layers for storing the RM are layers for storing data.

The shift control circuit 42 repeats an operation of shifting stored data, in the first direction from the first layer to the last layer, in units of layer. Upon the repeat of the shift operation, the read control circuit 45 sequentially acquires the read result of the two layers for the RM and the read result for the 16 layers for the data (hereinafter referred to as read data), from each MML.

The read control circuit 45 determines whether the read result of two layers for an RM matches the RM, for each MML. The read control circuit 45 returns MML reliability information including the determination result, and the read data to the memory controller 2. The MML reliability information indicates that the MML from which the read result matching the RM is obtained has high reliability and that the MML from which the read result matching the RM is not obtained has low reliability.

More specifically, when the read result of two layers for an RM of an MML matches the RM, the read control circuit 45 generates a 1-bit value indicative of OK (for example, 1), for the MML. In contrast, when the read result of two layers for an RM of an MML is different from the RM, the read control circuit 45 generates a 1-bit value indicative of NG (for example, 0), for the MML. The read control circuit 45 generates 16-bit (=2-byte) information in which 1-bit values indicative of OK or NG for respective MMLs are sequentially arranged, as the MML reliability information.

FIG. 47B illustrates a concrete example of the data returned by the magnetic domain wall shift memory 3 to the memory controller 2. An example that the read control circuit 45 acquires the read result that does not match the RM from the MML8 and acquires the read result that matches the RM from the other MML0 to MML7 and MML9 to MML15 will be described here. In this case, the read control circuit 45 generates the value "0" indicative of NG for the MML8 and generates the value "1" indicative of OK for the other MML0 to MML7 and MML9 to MML15.

For example, the read control circuit 45 returns, to the memory controller 2, 8-bit information "FF" in which the values "1" generated for the respective MML7 to MML0 are sequentially arranged, and 8-bit information "FE" in which the values "1" generated for the respective MML15 to MML9 and the value "0" generated for the MML8 are sequentially arranged, as 2-byte MML reliability information. Then, the read control circuit 45 returns the read data that is read from the respective MMLs as data D0, D1, D2, . . . , D255 in byte units, to the memory controller 2.

The memory controller 2 receives the MML reliability information and the read data D0, D1, D2, . . . , D255 from the magnetic domain wall shift memory 3. The memory controller 2 uses the MML reliability information as likelihood of the read data that is read from each MML. That is, the memory controller 2 determines that read data read from an MML of higher reliability has higher likelihood and that read data read from an MML of lower reliability has lower likelihood. The memory controller 2 reflects the likelihood of the read data read from each MML as additional information and executes the error correction process of the read data D0, D1, D2, . . . , D255. The probability of success of the error correction process can be thereby increased.

Figure 48A:
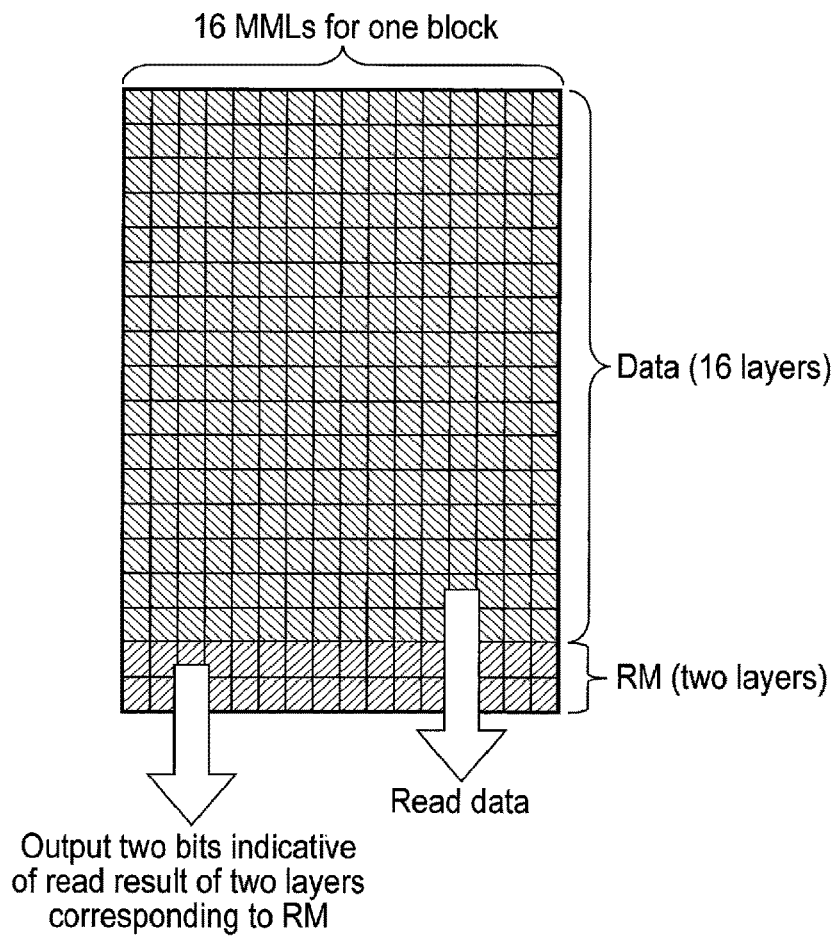
FIG. 48A is a diagram illustrating another example of a read result of one block.
Figure 48B:
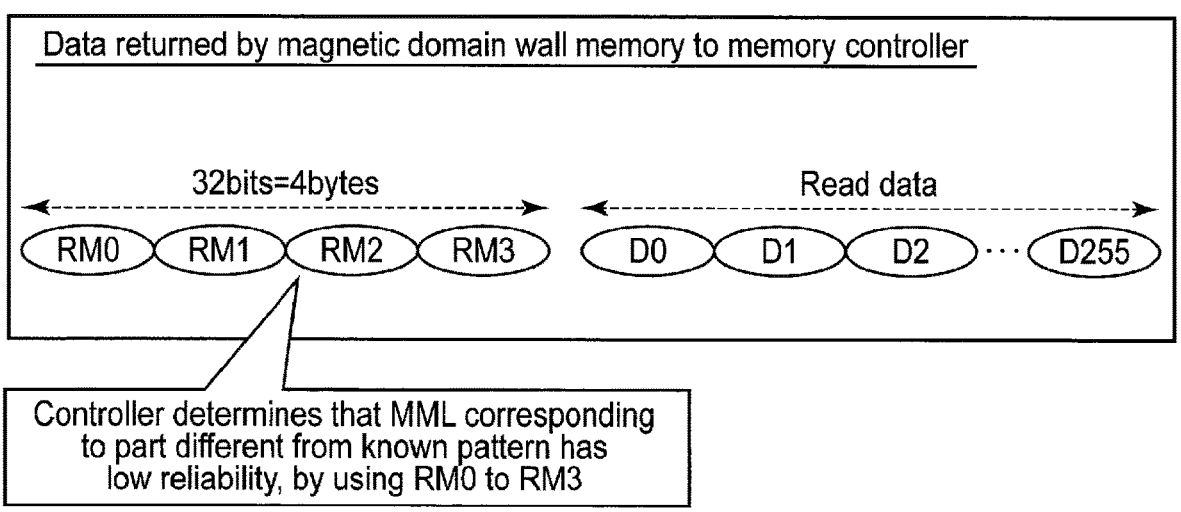
FIG. 48B is a diagram illustrating another example of data that is based on the read result of FIG. 48A and is returned by the magnetic domain wall shift memory to the memory controller.

FIGS. 48A and 48B illustrates another example of data returned by the magnetic domain wall shift memory 3 to the memory controller 2, when executing a read operation for one block. A block configuration is the same as that of the example illustrated in FIG. 47A. It is also assumed here that the memory controller 2 generates an RM and sends the generated RM to the magnetic domain wall shift memory 3. That is, the RM is data known to the memory controller 2.

The shift control circuit 42 repeats an operation of shifting stored data, in the first direction from the first layer to the last layer, in units of layer. Upon repeating the shift operation, the read control circuit 45 sequentially acquires the read result of two layers for an RM (hereinafter referred to as RM data) and the read result of 16 layers for data (read data), from each MML. The read control circuit 45 returns the RM data and the read data to the memory controller 2.

More specifically, the read control circuit 45 generates 32-bit (=2 layers×16 MMLs) RM data from the read result of two layers for an RM, which is output from each of MML0 to MML15. That is, each bit of the RM data corresponds to the read result of one layer.

FIG. 48B illustrates a concrete example of data returned by the magnetic domain wall shift memory 3 to the memory controller 2.

The read control circuit 45 returns the RM data including RM0, RM1, RM2, and RM3 to the memory controller 2. The RM0 is 1-byte (=8-bit) RM data in which values indicative of the read result of one layer first output from the MML7 to the MML0, respectively, are sequentially arranged. The RM1 is 1-byte RM data in which values indicative of the read result of one layer first output from the MML15 to the MML8, respectively, are sequentially arranged. The RM2 is 1-byte RM data in which values indicative of the read result of one layer output second from the MML7 to the MML0, respectively, are sequentially arranged. The RM3 is 1-byte RM data in which values indicative of the read result of one layer output second from the MML15 to the MML8, respectively, are sequentially arranged.

The read control circuit 45 further returns read data that is read from the respective MMLs as data D0, D1, D2, . . . , D255 in byte units, to the memory controller 2.

The memory controller 2 receives the RM data RM0, RM1, RM2, and RM3 and the read data D0, D1, D2, . . . , D255 from the magnetic domain wall shift memory 3. The memory controller 2 acquires a RM data portion, which is read from each MML (i.e., corresponds to the read result of two layers for an RM), from the RM data RM0, RM1, RM2, and RM3 and determines whether the RM data portion matches the RM sent to the magnetic domain wall shift memory 3. When an RM data portion read from a certain MML matches the sent RM, the memory controller 2 determines that the MML has high reliability. In contrast, when an RM data portion read from a certain MML is different from the sent RM, the memory controller 2 determines that the MML has low reliability.

The memory controller 2 uses the reliability of each MML based on the determination result as likelihood of the read data that is read from each MML. That is, the memory controller 2 determines that the read data read from an MML of higher reliability has higher likelihood and the read data read from an MML of lower reliability has lower likelihood. The memory controller 2 reflects the likelihood of the read data read from each MML as additional information and executes the error correction process of the read data. The probability of success of the error correction process can be thereby increased.

<Modified Example of Shift Parameter>

In several examples described above, the shift trimming is executed by using shift pulses different in voltage value. In contrast, a modified example of executing the shift trimming using shift pulses different in not voltage value, but time length will be described below. The shift control circuit 42 may use not the voltage value of the shift pulse, but the time length of the shift pulse as a shift parameter obtained from the shift trimming.

Figure 49:
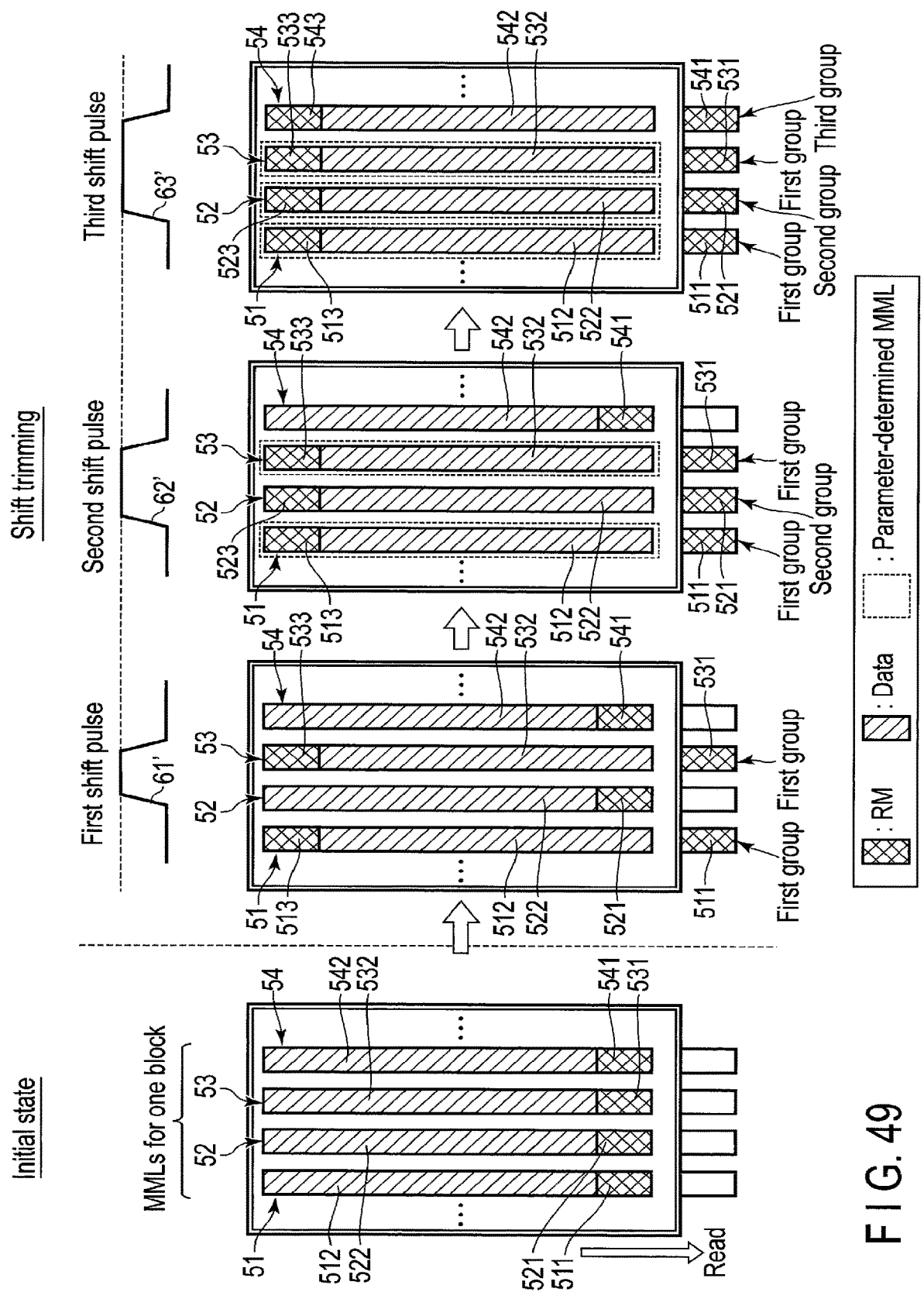
FIG. 49 is a diagram illustrating a third example of a read operation including shift trimming for a block.
Figure 50:
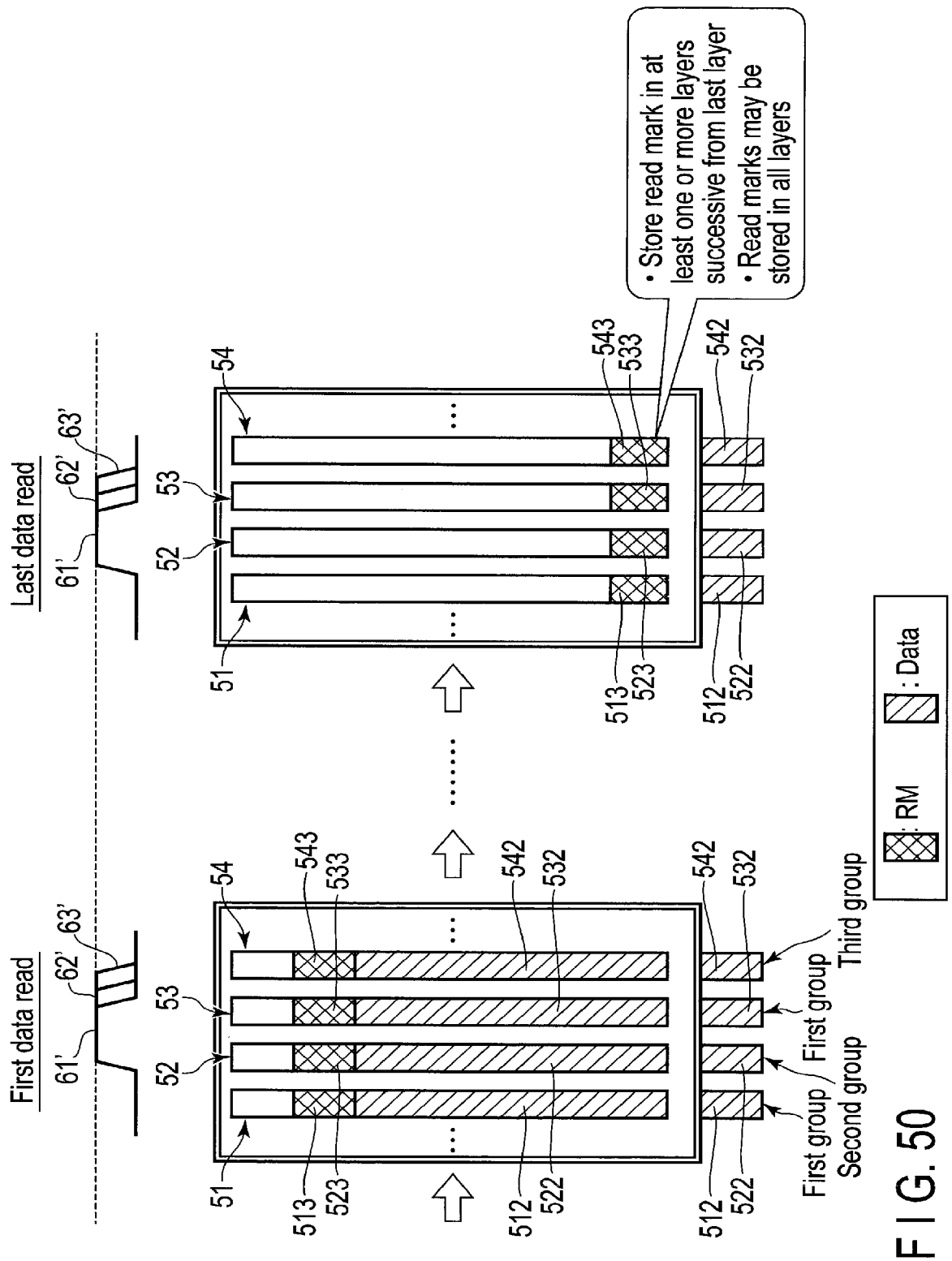
FIG. 50 is a diagram illustrating an example of the read operation subsequent to FIG. 49.

FIGS. 49 and 50 illustrate an example of a read operation including shift trimming, for a block in the magnetic domain wall shift memory 3 in the first-in first-out method. The read operation illustrated in FIGS. 49 and 50 is the same as the read operation described above with reference to FIGS. 10 and 11 except for a feature that the first shift pulse 61, the second shift pulse 62, and the third shift pulse 63 are replaced with a first shift pulse 61', a second shift pulse 62', and a third shift pulse 63', respectively.

The first shift pulse 61', the second shift pulse 62', and the third shift pulse 63' are shift pulses having different time lengths. The time length of the first shift pulse 61' is shorter than the time length of the second shift pulse 62'. In addition, the time length of the second shift pulse 62' is shorter than the time length of the third shift pulse 63'.

When using not the shift pulses 61, 62, and 63 different in voltage value, but the shift pulses 61', 62', and 63' different in time length, the shift control circuit 42 acquires the time length of the shift pulse suitable for each of the MMLs 51, 52, 53, and 54 as a shift parameter. The shift control circuit 42 and the read control circuit 45 can execute a read operation of reading data from each of the MMLs 51, 52, 53, and 54, by using the shift parameter suitable for each of the MMLs 51, 52, 53, and 54.

In addition, the shift trimming using the shift pulses 61', 62', and 63' different in time length may be executed, similarly, in a write operation or in a parallel read/write operation.

<Use of Data Latch in Magnetic Domain Wall Shift Memory and Data Buffer in Memory Controller>

The magnetic domain wall shift memory 3 uses a data latch (DL) in the magnetic domain wall shift memory 3 and the data buffer 25 in the memory controller 2 for a read operation, a write operation, or a parallel read/write operation. Several examples that the magnetic domain wall shift memory 3 executes a parallel read/write operation using at least one of the DL and the data buffer will be described below.

FIG. 51 illustrates an example of a parallel read/write operation using two DLs each corresponding to the block size. In this example, the memory chip 3C in the magnetic domain wall shift memory 3 includes blocks, a write DL 46W, and a read DL 46R.

The size of the write DL 46W corresponds to the block size. The write DL 46W is capable of storing write data that is to be written into the magnetic domain wall shift memory 3. The size of the read DL 46R corresponds to the block size. The read DL 46R is capable of storing read data that is read from the magnetic domain wall shift memory 3.

The memory chip 3C in a steady state stores, in the write DL 46W, valid data (hereinafter referred to as write data) of the block size that is to be next written, and does not store valid data in the read DL 46R.

When the memory controller 2 receives a read request from the host 4, the memory chip 3C executes a parallel read/write operation for a block B1 corresponding to the read request by using the write data stored in the write DL 46W as input data. The read request does not need to be made by the host 4, but may be made by an internal operation of the memory system 1.

In the parallel read/write operation for the block B1, the memory chip 3C writes the write data, which is stored in the write DL 46W, into the block B1 while storing read data, which is read from the block B1, in the read DL 46R. Therefore, increase in the read data stored in the read DL 46R and decrease in the write data stored in the write DL 46W occur collaboratively.

When the parallel read/write operation for the block B1 is completed, all the write data stored in the write DL 46W is written into the block B1, and read data of the block size, which is read from the block B1, is stored in the read DL 46R. The memory controller 2 may use the read data stored in the read DL 46R. When the read request is made by the host 4, the memory controller 2 acquires the read data from the read DL 46R and returns the read data to the host 4.

Furthermore, when the memory chip 3C needs to write back the read data, the memory chip 3C stores the read data in the write DL 46W to set the read data as next write data. The read data stored in the read DL 46R becomes invalid data. The steady state in which the valid data is stored only in the write DL 46W is thereby maintained in the memory chip 3C.

When the read data needs to be written back, any one of the following two operations may be executed as the operation of preparation for write back.

(1) When determining that a sufficiently small number of errors occur in the read data using an ECC, etc., the memory controller 2 or the memory chip 3C transfers the read data from the read DL 46R to the write DL 46W to set the read data as next write data. In this case, the data including errors may be set as the write data even though the errors are a small number of errors. However, preparation for write back can be executed without using a bus between the memory chip 3C and the memory controller 2 (i.e., a memory channel).

(2) The memory controller 2 performs the error correction process using the ECC on the read data and re-encodes the read data on which the error correction process has been performed. The memory controller 2 inputs the re-encoded data to the write DL 46W to set the data as next write data.

Since the data stored in the read DL 46R is data that has been received by the memory controller 2, the data does not need to be handled as valid data. In addition, since the data stored in the read DL 46R is overwritten with read data that is read in a next read operation, the read DL 46R does not need to be reset. Therefore, the steady state in which valid data is stored only in the write DL 46W is thereby maintained in the memory chip 3C according to the above-described operation (1) or (2).

An example that the memory chip 3C transitions from an initial state to a steady state will be described with reference to FIGS. 52 and 53. For example, the memory chip 3C in the initial state does not store valid data in the write DL 46W and the read DL 46R.

FIG. 52 illustrates an example of an operation of setting the memory chip 3C in the initial state to be a steady state when the memory controller 2 receives a read request from the host 4. FIG. 52 illustrates a read target block corresponding to the read request, of blocks included in the memory chip 3C, to make descriptions understood more easily. This block is a written block where valid data is stored.

In response to the read request from the host 4, the memory controller 2 inputs a read instruction for the read target block to the memory chip 3C.

The memory chip 3C in the initial state receiving the read instruction reads data from the block. More specifically, the memory chip 3C executes read shift for the block and overwrites the read DL 46R with the data that is pushed out upon the read shift.

When the process responding to the read instruction is completed, the data read from the block (i.e., the block-size data) is stored in the read DL 46R. In addition, the block becomes a free block where no valid data is stored.

Then, the memory chip 3C and the memory controller 2 execute an operation for preparation for write back. More specifically, the memory chip 3C transmits the data stored in the read DL 46R to the memory controller 2. The memory controller 2 executes, for example, the error correction process using an ECC for the data. Then, the memory controller 2 inputs the data for which the error correction process has been executed, to the write DL 46W.

According to the above operation for preparation for write back, the data that is read from the block and for which the correction process has been executed can be stored in the write DL 46W as data to be next written. Since the data stored in the read DL 46R has been output to the memory controller 2, the data does not need to be handled as valid data.

Therefore, the memory chip 3C transitions from the initial state to the steady state in which the valid data is stored only in the write DL 46W, according to the read instruction and the data input to the write DL 46W for preparation for write back.

FIG. 53 illustrates an example of an operation of setting the memory chip 3C in the initial state to be a steady state when the memory controller 2 receives a write request from the host 4. FIG. 53 illustrates a write target block corresponding to the write request, of blocks included in the memory chip 3C, to make descriptions understood more easily. This block is a free block where no valid data is stored.

In response to the read request from the host 4, the memory controller 2 inputs a write instruction for the write target block and write data to the memory chip 3C. The write data is, for example, data obtained by adding an ECC parity to user data that is received by the memory controller 2 from the host 4 upon receiving the write request.

The memory chip 3C in the initial state of receiving the write instruction stores the input write data corresponding to the write instruction to the write DL 46W. Therefore, the memory chip 3C transitions from the initial state to the steady state in which valid data is stored only in the write DL 46W, according to the write instruction.

FIG. 54 illustrates an example of a parallel read/write operation using a DL corresponding to the block size. In this example, the memory chip 3C includes blocks and the write/read DL 46.

The write/read DL 46 has a capacity of the block size. The write/read DL 46 may store write data that is to be written into the magnetic domain wall shift memory 3 and store read data that is read from the magnetic domain wall shift memory 3.

The memory chip 3C in the steady state stores valid data of the block size that is to be next written (i.e., write data), and does not store read data that is read from a block, in the write/read DL 46.

When the memory controller 2 receives a read request from the host 4, the memory chip 3C executes a parallel read/write operation for the block B1 corresponding to the read request by using the write data stored in the write/read DL 46 as input data. The read request does not need to be made by the host 4, but may be made by an internal operation of the magnetic domain wall shift memory 3.

According to the parallel read/write operation for the block B1, the memory chip 3C writes the write data, which is stored in the write/read DL 46, into the block B1 while storing read data that is read from the block B1 in the write/read DL 46R. Therefore, increase in the read data stored in the write/read DL 46 and decrease in the write data stored in the write/read DL 46 occur collaboratively.

When the parallel read/write operation for the block B1 is completed, all the write data stored in the write/read DL 46 is written into the block B1, and read data of the block size, which is read from the block B1, is stored in the write/read DL 46. When the read request is made by the host 4, the memory controller 2 acquires the read data from the write/read DL 46 and returns the read data to the host 4.

In addition, the memory chip 3C sets the read data stored in the write/read DL 46 as next write data. In the memory chip 3C, the steady state in which only write data to be written next time is stored in the write/read DL 46 is thereby maintained.

FIGS. 55 and 56 illustrate an example of a parallel read/write operation using two DLs in the magnetic domain wall shift memory 3 and two data buffers in the memory controller 2. As illustrated in FIG. 55, the memory chip 3C in the magnetic domain wall shift memory 3 includes blocks, a write DL 46W, and a read DL 46R in this example. In addition, the memory controller 2 includes a write buffer 25W and a read buffer 25R.

The size of the write DL 46W is smaller than the block size. The write DL 46W is capable of storing write data that is to be written into the magnetic domain wall shift memory 3. The size of the read DL 46R is smaller than the block size. The read DL 46R is capable of storing read data that is read from the magnetic domain wall shift memory 3.

The size of the write buffer 25W corresponds to, for example, the block size. The write buffer 25W is capable of storing write data that is to be written into the magnetic domain wall shift memory 3. The size of the read buffer 25R corresponds to, for example, the block size. The read buffer 25R is capable of storing read data that is read from the magnetic domain wall shift memory 3.

In a steady state, the memory chip 3C does not store data in each of the DL 46W and 46R, and the memory controller 2 stores valid data of the block size to be next written (hereinafter referred to as write data) in the write buffer 25W but does not store data in the read buffer 25R.

When receiving a read request from the host 4, the memory controller 2 transfers a portion of the write data (hereinafter referred to as a write data portion) stored in the write buffer 25W to the write DL 46W (DataIn). The size of the transferred write data portion corresponds to, for example, the size of the write DL 46W. The write DL 46W stores the transferred write data portion.

Next, the memory chip 3C executes a parallel read/write operation for a block B1 corresponding to the read request by using the write data portion stored in the write DL 46W as input data. The read request does not need to be made by the host 4, but may be made by an internal operation of the memory system 1.

According to the parallel read/write operation for the block B1, the memory chip 3C writes the write data portion, which is stored in the write DL 46W, into the block B1 while storing read data portion that is read from the block B1 in the read DL 46R. Therefore, increase in the read data portion stored in the read DL 46R and decrease in the write data portion stored in the write DL 46W occur collaboratively.

When the parallel read/write operation for the block B1 are completed, all the write data portion stored in the write DL 46W is written into the block B1, and the read data portion that is read from the block B1 is stored in the read DL 46R. The write data portion that is written and the read data portion that is read have the same data size. Furthermore, upon completing the parallel read/write operation, the memory controller 2 releases the area where the write data portion is stored, in the write buffer 25W.

Then, the memory chip 3C transfers the read data portion, which is stored in the read DL 46R, to the read buffer 25R. The read buffer 25R stores the transferred read data portion.

Similarly, transfer of a write data portion from the write buffer 25W to the write DL 46W, a parallel read/write operation using the write data portion as input data, and transfer of read data portion from the read DL 46R to the read buffer 25R are repeated. Thus, as illustrated in FIG. 56, all the write data stored in the write buffer 25W are written into the block B1 and read data that is read from the block B1 is stored in the read buffer 25R. When the read request is made by the host 4, the memory controller 2 returns the read data to the host 4.

In addition, the memory controller 2 executes the error correction process for the read data stored in the read buffer 25R. The memory controller 2 re-encodes the read data for which the error correction process has been executed, stores the re-encoded data in the write buffer 25W to set the data as next write data. Then, the memory controller 2 releases the read buffer 25R. The steady state in which valid data is stored only in the write buffer 25W is thereby maintained in the memory chip 3C and the memory controller 2. In addition, since the write data is maintained in the write buffer 25W in the memory controller 2 until the writing of the write data into the block B1 is completed, the write data can be prevented from being lost due to an abnormal power interruption that power supply to the memory system 1 is interrupted. The memory controller 2 may have, for example, a function of protecting data stored in the write buffer 25W (or the data buffer 25) even in an abnormal power interruption.

FIG. 57 illustrates an example of a parallel read/write operation using a DL in the magnetic domain wall shift memory 3 and a data buffer in the memory controller 2. In this example, the memory chip 3C in the magnetic domain wall shift memory 3 includes blocks and a DL 46. In addition, the memory controller 2 includes the data buffer 25.

The size of the DL 46 is smaller than the block size. The DL 46 is capable of storing write data that is to be written to the magnetic domain wall shift memory 3 and storing read data that is read from the magnetic domain wall shift memory 3.

The size of the data buffer 25 corresponds to, for example, the block size. The data buffer 25 is capable of storing read data that is read from the magnetic domain wall shift memory 3.

In a steady state, the memory chip 3C does not store valid data in the DL 46, and the memory controller 2 does not store valid data in the data buffer 25. That is, write data that is to be next written into a block is not prepared in the DL 46 and the data buffer 25.

When receiving a read request from the host 4, the memory chip 3C executes a read operation for a block B1 corresponding to the read request to read a first data portion D1 stored in the last layer LL of the block B1. The memory chip 3C stores the read first data portion in the DL 46. The read request does not need to be made by the host 4, but may be made by an internal operation of the memory system 1.

Then, the memory chip 3C transfers the first data portion D1, which is stored in the DL 46, to the data buffer 25 (DataOut) and executes a parallel read/write operation using the first data portion D1 as input data.

According to a parallel read/write operation for the block B1, the memory chip 3C writes back the first data portion D1, which is read from the block B1 according to the previous read operation, into the block B1 while reading a second data portion D2 stored in the last layer LL of the block B1. That is, the memory chip 3C executes reading of data and writing back of data in parallel, for the block B1 of read target. The memory chip 3C stores the read second data portion in the DL 46.

Similarly, transfer of a data portion from the DL 46 to the data buffer 25, and a parallel read/write operation using read data portion as input data are repeated. Thus, data read from the block B1 is stored in the data buffer 25 and written back to the block B1. When the read request is made by the host 4, the memory controller 2 returns the data stored in the data buffer 25 (i.e., read data) to the host 4. Then, the memory controller 2 releases the data buffer 25. The steady state in which valid data is not stored in the DL 46 and the data buffer 25 is thereby maintained in the memory chip 3C and the memory controller 2.

As described above, the memory chip 3C returns the read data to the host 4 and also uses the data as write data that is to be next written. For this reason, latency can be made smaller even if the size of the data latch is small.

FIG. 58 illustrates an example of data signals on time series, transmitted over a memory channel between the memory controller 2 and the magnetic domain wall shift memory 3.

Data signals 11 and 12 are transmitted when there is write data to be written into the magnetic domain wall shift memory 3 and the memory chip 3C in the magnetic domain wall shift memory 3 includes a DL corresponding to the block size. For example, when the parallel read/write operation described with reference to FIG. 51 or FIG. 54 is executed, the data signals 11 and 12 are transmitted over the memory channel between the memory controller 2 and the magnetic domain wall shift memory 3.

A write data portion 111 included in the data signal 11 is indicative of write data transferred from the memory controller 2 to the magnetic domain wall shift memory 3 in units of block. In addition, a read data portion 112 included in the data signal 11 is indicative of read data transferred from the magnetic domain wall shift memory 3 to the memory controller 2 in units of block.

A write data portion 121 included in the data signal 12 is indicative of write data transferred from the memory controller 2 to the magnetic domain wall shift memory 3 in units of layer. In addition, a read data portion 122 included in the data signal 12 is indicative of read data transferred from the magnetic domain wall shift memory 3 to the memory controller 2 in units of layer.

A data signal 13 is transmitted when there is write data to be written into the magnetic domain wall shift memory 3 and the memory chip 3C in the magnetic domain wall shift memory 3 includes the write DL 46W and the read DL 46R smaller than the block size. For example, when the parallel read/write operation described with reference to FIGS. 55 and 56 is executed, the data signal 13 is transmitted over the memory channel between the memory controller 2 and the magnetic domain wall shift memory 3.

Each write data portion 131 included in the data signal 13 is indicative of write data transferred from the memory controller 2 to the magnetic domain wall shift memory 3 in units of size corresponding to the write DL 46W. In addition, each read data portion 132 included in the data signal 13 is indicative of read data transferred from the magnetic domain wall shift memory 3 to the memory controller 2 in units of size corresponding to the read DL 46R.

A data signal 14 is transmitted when there is no write data to be written into the magnetic domain wall shift memory 3 and the memory chip 3C in the magnetic domain wall shift memory 3 includes the DL 46 smaller than the block size. For example, when the parallel read/write operation described with reference to FIG. 57 is executed, the data signal 14 is transmitted over the memory channel between the memory controller 2 and the magnetic domain wall shift memory 3.

Each read data portion 141 included in the data signal 14 is indicative of read data transferred from the magnetic domain wall shift memory 3 to the memory controller 2 in units of size corresponding to the DL 46.

Thus, the different data signals may be transmitted over the memory channels according to the sizes of the DL provided in the memory chip 3C and the presence or absence of write data.

FIG. 59 is a flowchart illustrating an example of the procedure of a read process that is executed in the memory controller 2. A case where write data of the block size, which is to be written into the magnetic domain wall shift memory 3, is stored in the DL in the magnetic domain wall shift memory 3 or in the write buffer 25W in the memory controller 2 will be exemplified here.

The memory controller 2 receives a read command from the host 4 (step S1801). The memory controller 2 specifies a read target block in the magnetic domain wall shift memory 3 by using the LUT 231 (step S1802). More specifically, the memory controller 2 specifies a physical address corresponding to a logical address designated in the read command, by using the LUT 231 and determines a block indicated by the physical address as the read target block.

The memory controller 2 writes the write data into the read target block, and acquires read data that is read from the read target block upon the writing (step S1803). The memory controller 2 returns the read data to the host 4 (step S1804). The memory controller 2 sets the read data as new write data (step S1805).

In the above-described read process, the memory controller 2 can write the write data into the read target block while reading the read data from the read target block in response to the read command. In addition, the memory controller 2 can set the read data as new write data for write back. Since the reading of the read data and the writing of the write data are executed in parallel for the block, the number of times of the shift operations can be reduced as compared with executing the reading and writing separately. The wear of the magnetic domain wall shift memory 3 can be therefore reduced.

FIG. 60 is a flowchart illustrating an example of the procedure of a write process that is executed in the memory controller 2. An example where write data of the block size, which is to be written into the magnetic domain wall shift memory 3, is stored in the DL in the magnetic domain wall shift memory 3 or in the write buffer 25W in the memory controller 2 will be exemplified here.

The memory controller 2 receives a write command from the host 4 (step S1901). The memory controller 2 writes the write data into a free block (hereinafter referred to as a write target block) in the magnetic domain wall shift memory 3 (step S1902). Then, the memory controller 2 updates the LUT 231 so as to indicate mapping between a logical address designated in the write command, which has requested writing of the write data, and a physical address indicative of the write target block (step S1903).

Then, the memory controller 2 sets write data, which is received along with the received write command in step S1901, as new write data (step S1904).

In the above write process, the memory controller 2 writes the already prepared write data into the free block in response to the write command. After that, the memory controller 2 sets the received write data, which is received along with the received write command, as new write data. Thus, a steady state that write data of the block size is stored in the data latch 46W, the data latch 46, or the write buffer 25W can be maintained.

As described above, the present embodiment is useful for control of the magnetic domain wall shift memory that executes writing and reading of data by the last-in first-out method.

The magnetic domain wall shift memory 3 of the first-in first-out method includes blocks each including data storing shift strings. The magnetic domain wall shift memory 3 is configured to perform writing and reading of data for each block in the first-in first-out method by shifting, in units of layer, data stored in layers included in each of the data storing shift strings, in a first direction from a first layer to a last layer. The shift control circuit 42, the write control circuit 43, and the read control circuit 45 control the magnetic domain wall shift memory 3. The shift control circuit 42 and the write control circuit 43 store first data (RM) in one or more layers successive from a last layer, of a plurality of first layers included in a first data storing shift string in a first block. The first data is used for determining a shift parameter to be used to shift data stored in the plurality of first layers, in the first direction. The shift control circuit 42 and the read control circuit 45 determine the shift parameter in accordance with reading the first data from the first data storing shift string.

The shift parameter suitable for the first data storing shift string can be thereby determined in the magnetic domain wall shift memory 3 in the first-in first-out method.

In addition, the magnetic domain wall shift memory 3 in the last-in first-out method includes blocks each including data storing shift strings. The magnetic domain wall shift memory 3 is configured to perform writing and reading of data for each block in the last-in first-out method by shifting, in units of layer, data stored in layers included in each of the data storing shift strings, in a first direction from a first layer to a last layer, or in a second direction opposite to the first direction. The shift control circuit 32 and the read/write control circuit 33 control the magnetic domain wall shift memory 3. The shift control circuit 32 and the read/write control circuit 33 store first data in one or more layers successive from a first layer, of a plurality of first layers included in a first data storing shift string in a first block. The first data is used for determining a shift parameter to be used to shift data stored in the plurality of first layers, in the first direction or in the second direction. The shift control circuit 32 and the read/write control circuit 33 determine the shift parameter in accordance with reading the first data from the first data storing shift string.

The shift parameter suitable for the first data storing shift string can be thereby determined in the magnetic domain wall shift memory 3 in the last-in first-out method.

Each of various functions described in some embodiments of the present invention may be realized by a circuit (e.g., processing circuit). An exemplary processing circuit may be a programmed processor such as central processing unit (CPU). The processor executes computer programs (instructions) stored in a memory thereby perform the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A shift register memory comprising:
   a plurality of blocks each including data storing shift strings, each of the data storing shift strings including layers; and
   a control circuit configured to:
      control the plurality of blocks; and
      perform storing data by shifting one layer of the layers in a first direction along each of the data storing shift strings, and reading data in a second direction opposite to the first direction, the reading including reading data from a first layer of the layers, the storing including storing data to the first layer, wherein
   the control circuit is configured to:
   read first data stored in one or more second layers of the layers, the one or more second layers being successive from the first layer;
   determine a shift parameter in accordance with the reading of the first data; and
   perform the reading data using the determined shift parameter after reading the first data.

2. The shift register memory of claim 1, wherein
   the control circuit is configured to:
   apply a first shift pulse to a first data storing shift string of the data storing shift strings;
   when the first data is read from the first data storing shift string in accordance with the applied first shift pulse, determine that the first shift pulse is used as a shift pulse to be applied to the first data storing shift string;
   when the first data is not read from the first data storing shift string in accordance with the applied first shift pulse, apply a second shift pulse different from the first shift pulse to the first data storing shift string; and
   when the first data is read from the first data storing shift string in accordance with the applied second shift pulse, determine that the second shift pulse is used as the shift pulse to be applied to the first data storing shift string.

3. The shift register memory of claim 2, wherein
a voltage of the first shift pulse is smaller than a voltage of the second shift pulse.
4. The shift register memory of claim 2, wherein
a time length of the first shift pulse is shorter than a time length of the second shift pulse.
5. The shift register memory of claim 1, wherein
the control circuit is configured to:
read the first data stored in the one or more second layers included in each of the data storing shift strings; and
determine, in accordance with reading the first data from one or more data storing shift strings of the data storing shift strings, a shift parameter to be used to shift data stored in the layers included in the one or more data storing shift strings.
6. The shift register memory of claim 5, wherein
the control circuit is configured to:
apply a first shift pulse to each of the data storing shift strings;
when the first data is read from one or more first data storing shift strings of the data storing shift strings in accordance with the applied first shift pulse, determine that the first shift pulse is used as a shift pulse to be applied to the one or more first data storing shift strings;
apply a second shift pulse different from the first shift pulse to each of the data storing shift strings except for the one or more first data storing shift strings; and
when the first data is read from one or more second data storing shift strings of the data storing shift strings in accordance with the applied second shift pulse, determine that the second shift pulse is used as a shift pulse to be applied to the one or more second data storing shift strings.
7. The shift register memory of claim 6, wherein
a voltage of the first shift pulse is smaller than a voltage of the second shift pulse.
8. The shift register memory of claim 6, wherein
a time length of the first shift pulse is shorter than a time length of the second shift pulse.
9. The shift register memory of claim 1, wherein
after the first data is read from the one or more second layers, second data, which is to be read by performing the reading data using the determined shift parameter, is stored in one or more third layers of the layers, the one or more third layers being successive from the first layer.
10. The shift register memory of claim 9, wherein
the control circuit is configured to read the second data stored in the one or more third layers, by shifting the second data in the second direction by using the shift parameter.

11. The shift register memory of claim 10, wherein
the control circuit is configured to read the second data in the one or more third layers of a first data storing shift string among the data storing shift strings by applying a third shift pulse based on the determined shift parameter to the first data storing shift string, a number of times the third shift pulse is applied corresponding to a number of the one or more third layers.
12. The shift register memory of claim 1, wherein
the control circuit is configured to perform the storing data using the determined shift parameter after reading the first data.
13. The shift register memory of claim 12, wherein
the control circuit is configured to store third data in one or more fourth layers of the layers by shifting the layers in the first direction using the determined shift parameter, and
the one or more fourth layers in which the third data has been stored is successive from the first layer.
14. The shift register memory of claim 13, wherein
the control circuit is configured to store the third data in the one or more fourth layers of a first data storing shift string among the data storing shift strings by applying a third shift pulse based on the determined shift parameter to the first data storing shift string, a number of times the third shift pulse is applied corresponding to a number of the one or more fourth layers.
15. The shift register memory of claim 13, wherein
the control circuit is configured to store, after the third data is stored, the first data in the one or more second layers successive from the first layer by shifting the layers in the first direction using the determined shift parameter, the one or more fourth layers being successive after the one or more second layers in which the first data has been stored.
16. The shift register memory of claim 15, wherein
the control circuit is configured to:
store the third data in the one or more fourth layers of a first data storing shift string among the data storing shift strings by applying a third shift pulse based on the determined shift parameter to the first data storing shift string, a number of times the third shift pulse is applied corresponding to a number of the one or more fourth layers; and
store the first data in the one or more second layers of the first data storing shift string by applying the third shift pulse to the first data storing shift string, a number of times the third shift pulse is applied corresponding to a number of the one or more second layers.

* * * * *